US010424449B2

(12) United States Patent
Nishio

(10) Patent No.: US 10,424,449 B2
(45) Date of Patent: Sep. 24, 2019

(54) ABNORMALITY DETECTION METHOD FOR ELECTROMAGNETIC RELAY, ABNORMALITY DETECTION CIRCUIT FOR ELECTROMAGNETIC RELAY, AND ABNORMALITY DETECTION SYSTEM

(71) Applicant: OMRON Corporation, Kyoto-shi, Kyoto (JP)

(72) Inventor: Norikazu Nishio, Takatsuki (JP)

(73) Assignee: OMRON Corporation, Kyoto-shi (JP)

( * ) Notice: Subject to any disclaimer, the term of this patent is extended or adjusted under 35 U.S.C. 154(b) by 337 days.

(21) Appl. No.: 15/113,366

(22) PCT Filed: Aug. 5, 2014

(86) PCT No.: PCT/JP2014/070619
§ 371 (c)(1),
(2) Date: Jul. 21, 2016

(87) PCT Pub. No.: WO2015/129070
PCT Pub. Date: Sep. 3, 2015

(65) Prior Publication Data
US 2016/0358732 A1 Dec. 8, 2016

(30) Foreign Application Priority Data

Feb. 27, 2014 (JP) ................. 2014-037294

(51) Int. Cl.
*H01H 47/00* (2006.01)
*G01R 31/327* (2006.01)

(52) U.S. Cl.
CPC ....... *H01H 47/002* (2013.01); *G01R 31/3278* (2013.01); *H01H 2047/003* (2013.01)

(58) Field of Classification Search
CPC ............ G01R 31/3277; G01R 31/3278; H01H 47/002; H01H 2047/006; H01H 2047/003
(Continued)

(56) References Cited

U.S. PATENT DOCUMENTS 4,319,193 A * 3/1982 Boccali .............. G01R 31/3278
324/418
4,425,511 A * 1/1984 Brosh .................... H03K 17/97
307/106
(Continued)

FOREIGN PATENT DOCUMENTS

EP 3113203 A1 * 1/2017 .......... H01H 47/002
JP S53-070553 B1 6/1978
(Continued)

OTHER PUBLICATIONS

English Translation of J P-2004186052-A (Year: 2019).*
(Continued)

*Primary Examiner* — Patrick Assouad
*Assistant Examiner* — Sean Curtis
(74) *Attorney, Agent, or Firm* — Metrolex IP Law Group, PLLC

(57) ABSTRACT

An abnormal operation of a movable contact is correctly detected. The abnormal operation of the movable contact (9) to the fixed contact (10) is detected based on at least one of a separation transient response signal of a coil current passed through the excitation coil (6) during the supply of a separation pulse signal and an attraction transient response signal of the coil current during the supply of an attraction pulse signal.

17 Claims, 54 Drawing Sheets

(58) Field of Classification Search
USPC .......................................... 324/418–424, 526
See application file for complete search history.

(56) References Cited

U.S. PATENT DOCUMENTS

| | | | | |
|---|---|---|---|---|
| 4,992,777 | A * | 2/1991 | Keisuke | H01H 3/001 340/604 |
| 5,015,996 | A * | 5/1991 | Konishi | H01H 3/001 200/61.05 |
| 5,243,296 | A * | 9/1993 | Ando | G01R 31/06 324/207.22 |
| 5,774,323 | A * | 6/1998 | Innes | H01H 47/002 361/187 |
| 5,796,261 | A * | 8/1998 | Golab | G01R 31/3278 324/415 |
| 5,808,471 | A * | 9/1998 | Rooke | H01F 7/1844 324/418 |
| 6,023,110 | A * | 2/2000 | Henrion | H01H 47/004 307/125 |
| 6,147,498 | A * | 11/2000 | Sumiya | G01R 31/06 324/415 |
| 6,208,497 | B1 * | 3/2001 | Seale | F01L 9/04 361/154 |
| 6,307,376 | B1 * | 10/2001 | Alexander | F16H 61/12 324/388 |
| 7,035,067 | B2 * | 4/2006 | Schmalz | H02H 3/04 361/42 |
| 7,940,093 | B2 * | 5/2011 | Shiah | H03K 19/00361 327/112 |
| 8,050,816 | B2 * | 11/2011 | Doll | B60T 8/885 701/29.8 |
| 8,773,114 | B2 * | 7/2014 | Hayashi | G01B 7/003 324/207.15 |
| 9,077,177 | B2 * | 7/2015 | Liu | H02H 3/16 |
| 9,097,766 | B2 * | 8/2015 | Kodama | H01H 1/0015 |
| 9,310,438 | B2 * | 4/2016 | Kinoshita | H01H 47/002 |
| 9,916,951 | B2 * | 3/2018 | Zhou | H01H 47/22 |
| 2004/0201944 | A1 * | 10/2004 | Schmalz | H02H 3/04 361/160 |
| 2011/0062960 | A1 * | 3/2011 | Prakash | H01H 1/0015 324/423 |
| 2012/0105065 | A1 * | 5/2012 | Namou | G01R 31/3275 324/415 |
| 2013/0335174 | A1 * | 12/2013 | Kodama | H01H 47/002 335/2 |
| 2014/0002092 | A1 * | 1/2014 | Kodama | H01H 1/0015 324/418 |
| 2014/0340804 | A1 * | 11/2014 | Ward | H01H 51/01 361/115 |
| 2016/0276114 | A1 * | 9/2016 | Reed, Sr. | G01R 31/3277 |
| 2016/0358732 | A1 * | 12/2016 | Nishio | H01H 47/002 |
| 2018/0166244 | A1 * | 6/2018 | Kobayashi | H01H 50/02 |

FOREIGN PATENT DOCUMENTS

| | | | | |
|---|---|---|---|---|
| JP | 2004-186052 | A | | 7/2004 |
| JP | 2004186052 | A * | | 7/2004 |
| JP | 2010-183795 | A | | 8/2010 |
| JP | 2012-199115 | A | | 10/2012 |
| JP | 5370553 | B1 | | 12/2013 |
| JP | 2015162383 | A * | 9/2015 | ........... H01H 47/002 |
| WO | WO-2015129070 | A1 * | 9/2015 | ........... H01H 47/002 |

OTHER PUBLICATIONS

The extended European search report dated Oct. 6, 2017 in the counterpart European patent application.
Korean Official Action dated Jul. 19, 2017 in the counterpart Korean patent application.

* cited by examiner

ABNORMALITY DETECTION METHOD FOR ELECTROMAGNETIC RELAY, ABNORMALITY DETECTION CIRCUIT FOR ELECTROMAGNETIC RELAY, AND ABNORMALITY DETECTION SYSTEM

TECHNICAL FIELD

The present invention relates to an abnormality detection method, an abnormality detection circuit, and an abnormality detection system for an electromagnetic relay in which a movable contact and a fixed contact are opened and closed by an electromagnetic force generated in accordance with supply or cutoff of a current passed through an excitation coil.

BACKGROUND ART

Conventionally, there is known a welding detection method for the electromagnetic relay in which a movable iron core is fixed to a driving shaft that is reciprocally provided in a center axis direction of an excitation coil and the movable contact fixed to the driving shaft is attracted to or separated from a fixed contact by an electromagnetic force generated in the movable iron core in accordance with supply of cutoff of a current passed through the excitation coil (Patent Documents 1 and 2).

In the electromagnetic relay, the attraction of the movable contact to the fixed contact differs from the separation of the movable contact from the fixed contact in an inductance of the excitation coil because a position of the movable iron core relative to the excitation coil changes. Therefore, there is known a configuration that detects the inductance of the excitation coil to detect welding between the movable contact and the fixed contact.

For example, Patent Document 2 discloses the following configuration. A switching element connected to an operating coil (excitation coil) performs on and off operations using a pulse signal. An AC component is extracted by cutting a DC component and a low-frequency component from a coil current of the operating coil. Opening and closing malfunctions of the electromagnetic relay are detected on the basis of the AC component of the coil current and a criterion.

Patent Document 1 discloses the following configuration in addition to the configuration of Patent Document 2. A step voltage that switches between a high level and a low level or a pulse voltage having a sufficiently low frequency is periodically applied to the excitation coil. A rising time is detected until a transient response component of a voltage at both ends of a detection coil exceeds a predetermined reference value since the application is started. The detection of the rising time discriminates between the opening and closing of a contact part (movable contact) to detect opening and closing states of the electromagnetic relay.

PRIOR ART DOCUMENTS

Patent Documents

Patent Document 1: Japanese Unexamined Patent Publication No. 2012-199115

Patent Document 2: Japanese Unexamined Patent Publication No. 2004-186052

SUMMARY OF THE INVENTION

Problems to be Solved by the Invention

However, in the configuration of Patent Document 1 that applies the step voltage, the step voltage is switched between the high level and the low level, which leads to a problem in that a voltage width of the step voltage cannot be controlled. Because the voltage width of the step voltage cannot be controlled, it is necessary to provide the excitation coil and the detection coil, which results in cost increase. When one coil is shared with the excitation coil and the detection coil, the electromagnetic relay is turned on even if the step voltage is applied to the coil to detect the opening and closing states during turn-off of the electromagnetic relay. Therefore, the opening and closing states of the electromagnetic relay cannot be detected. When the step voltage is lowered to be able to detect the opening and closing states, the electromagnetic relay cannot be turned on.

In the configuration of Patent Document 2, there is a problem in that possibly the opening and closing malfunctions of the electromagnetic relay are falsely detected when an ambient temperature of the excitation coil changes. FIG. 53 is a graph illustrating a problem caused by a temperature change of a conventional welding detection system. A horizontal axis indicates the ambient temperature of the electromagnetic relay, and a vertical axis indicates an amplitude of the AC component of the coil current passed through the excitation coil. A line IS1 indicates the AC component of the coil current in a separated state of the electromagnetic relay provided with the excitation coil in which the inductance is smaller than that of a standard excitation coil by 10%, and a line IS2 indicates the amplitude of the AC component of the coil current in an attracted state of the electromagnetic relay. A line IM1 indicates the amplitude of the AC component of the coil current in the separated state of the electromagnetic relay provided with the excitation coil having the typical inductance, and a line IM2 indicates the amplitude of the AC component of the coil current in the attracted state of the electromagnetic relay. A line IL1 indicates the amplitude of the AC component of the coil current in the separated state of the electromagnetic relay provided with the excitation coil in which the inductance is larger than that of the standard excitation coil by 10%, and a line IL2 indicates the amplitude of the AC component of the coil current in the attracted state of the electromagnetic relay. The pulse signal supplied to the switching element has a frequency of 100 Hz and a duty of 45%.

Due to an individual difference of the inductance of the excitation coil, the AC component of the coil current varies in the separated state as indicated by the line IS1, the line IM1, and the line IL1, and the AC component of the coil current varies in the attracted state as indicated by the line IS2, the line IM2, and the line IL2. Due to the change in ambient temperature of the electromagnetic relay, the AC component of the coil current changes in the separated state as indicated by the line IS1, the line IM1, and the line IL1, and the AC component of the coil current changes in the attracted state as indicated by the line IS2, the line IM2, and the line IL2.

Accordingly, even if the criterion (threshold) is set, there is a problem in that possibly the opening and closing malfunctions of the electromagnetic relay are falsely detected due to the change in ambient temperature of the electromagnetic relay. For example, in a case where the threshold is set to 120 mA, at ambient temperatures of 23° C. and 55° C., the AC component of the coil current associated with all the types is higher than the threshold in the separated state, and is lower than the threshold in the attracted state, so that the opening and closing malfunctions of the electromagnetic relay can correctly be detected. On the other hand, the line IS2 exceeds the threshold of 120 mA at the ambient temperature of −10° C., which leads to a problem in that possibly the opening and closing malfunctions of the electromagnetic relay are falsely detected with respect to the electromagnetic relay provided with the excitation coil in which the inductance is smaller than that of the standard excitation coil by 10%.

In the configuration of Patent Document 2, there is a problem in that the amplitude of the AC component of the coil current changes when a power supply voltage varies. FIG. 54 is a graph illustrating a problem caused by the variation in power supply voltage of the conventional welding detection system. The horizontal axis indicates the power supply voltage of the electromagnetic relay, and the vertical axis indicates the amplitude of the AC component of the coil current passed through the excitation coil provided in the electromagnetic relay.

A line IS3 indicates the amplitude of the AC component of the coil current in the separated state of the electromagnetic relay provided with the excitation coil in which the inductance is smaller than that of the standard excitation coil by 10%, and a line IL3 indicates the amplitude of the AC component of the coil current in the attracted state of the electromagnetic relay provided with the excitation coil in which the inductance is larger than that of the standard excitation coil by 10%. The pulse signal has the frequency of 100 Hz and the duty of 45%. The ambient temperature is 23° C., and the power supply voltage is 12 V±10%.

Due to the change in power supply voltage of the electromagnetic relay, as indicated by the line IS3, the AC component of the coil current changes in the separated state of the excitation coil in which the inductance is smaller than that of the standard excitation coil by 10%. As indicated by the line IL3, the AC component of the coil current changes in the attracted state of the excitation coil in which the inductance is larger than that of the standard excitation coil by 10%.

Accordingly, even if the criterion (threshold) is set, there is a problem in that possibly the opening and closing malfunctions of the electromagnetic relay are falsely detected due to the change in power supply voltage of the electromagnetic relay.

In the configuration of Patent Document 2, the attracted state and the separated state cannot be discriminated from each other when the frequency of the pulse signal is set higher, which leads to a problem in that the frequency of the pulse signal cannot be set higher and that selection of the frequency of the pulse signal is restricted. FIG. 55 is a graph illustrating a problem caused by a pulse frequency of the conventional welding detection system, and FIG. 55(a) is a graph illustrating a relationship between the pulse frequency and an AC component. The horizontal axis indicates the frequency of the pulse signal, and the vertical axis indicates the amplitude of the AC component of the coil current passed through the excitation coil.

A line I4 indicates the amplitude of the AC component of the coil current in the separated state, and a line I5 indicates the amplitude of the AC component of the coil current in the attracted state.

FIG. 55(b) is a graph illustrating a relationship between the pulse frequency and an amplitude decreasing rate. The horizontal axis indicates the frequency of the pulse signal, and the vertical axis indicates the amplitude decreasing rate in which the amplitude I4 of the AC component of the coil current in the separated state is subtracted from the amplitude I5 of the AC component of the coil current in the attracted state.

As illustrated by a line I6, the amplitude decreasing rate comes close to 100% when the frequency exceeds about 2 kHz. Accordingly, the attracted state and the separated state cannot be discriminated from each other when the frequency of the pulse signal exceeds a predetermined value (subject to the kind of the electromagnetic relay, about 2 kHz in the example in FIG. 55(b)). It is necessary to set the pulse frequency lower, and the low-frequency component and the frequency of the AC component come close to each other. Therefore, it is difficult to design a filter that cuts the low-frequency component, the cost increases, and the electromagnetic relay is actually awkward to handle.

Even if the movable contact of the electromagnetic relay is not welded to the fixed contact, it is necessary to detect an abnormal operation in which the movable contact separated from the fixed contact is not attracted to the fixed contact when the operation signal is supplied to the electromagnetic relay.

An object of the present invention is to provide an abnormality detection method for an electromagnetic relay, an abnormality detection circuit for an electromagnetic relay, and an abnormality detection system that can detect the abnormal operation of the attraction and separation of the movable contact to and from the fixed contact in the electromagnetic relay in which the movable contact and the fixed contact are opened and closed by the electromagnetic force generated in accordance with the supply or cutoff of the current to the excitation coil.

Means for Solving the Problem

A first aspect of the present invention provides an abnormality detection method for electromagnetic relay in which a movable contact and a fixed contact are closed or opened by an electromagnetic force generated in accordance with supply or cutoff of a current to an excitation coil. At this point, an abnormal operation of the movable contact to the fixed contact is detected based on at least one of a first transient response signal of a coil current passed through the excitation coil during the supply of a first detection pulse signal in a state of not supplying an operation signal to operate the movable contact relative to the fixed contact and a second transient response signal of the coil current during the supply of a second detection pulse signal in a state of supplying the operation signal.

A second aspect of the present invention provides an abnormality detection circuit for electromagnetic relay in which a movable contact and a fixed contact are closed or opened by an electromagnetic force generated in accordance with supply or cutoff of a current to an excitation coil, the abnormality detection circuit including a control circuit configured to detect an abnormal operation of the movable contact to the fixed contact based on at least one of a first transient response signal of a coil current passed through the excitation coil during the supply of a first detection pulse signal in a state of not supplying an operation signal to operate the movable contact relative to the fixed contact and a second transient response signal of the coil current during the supply of a second detection pulse signal in a state of supplying the operation signal.

A third aspect of the present invention provides an abnormality detection system including: an electromagnetic relay in which a movable contact and a fixed contact are closed or opened by an electromagnetic force generated in accordance with supply or cutoff of a current to an excitation coil; and an abnormality detection circuit configured to detect an abnormal operation of the movable contact to the fixed contact based on at least one of a first transient response signal of a coil current passed through the excitation coil during the supply of a first detection pulse signal in a state of not supplying an operation signal to operate the movable contact relative to the fixed contact and a second transient response signal of the coil current during the supply of a second detection pulse signal in a state of supplying the operation signal.

A fourth aspect of the present invention provides an abnormality detection method for electromagnetic relay in which a movable contact and a fixed contact are closed or opened by an electromagnetic force generated in accordance with supply or cutoff of a current to an excitation coil. At this point, an abnormal operation of the movable contact to the fixed contact is detected based on at least one of a first transient response signal of a coil current passed through the excitation coil during the supply of a first detection pulse signal in a non-operation state of the movable contact relative to the fixed contact and a second transient response signal of the coil current during the supply of a second detection pulse signal in an operation state of the movable contact relative to the fixed contact.

A fifth aspect of the present invention provides an abnormality detection circuit for electromagnetic relay in which a movable contact and a fixed contact are closed or opened by an electromagnetic force generated in accordance with supply or cutoff of a current to an excitation coil, the abnormality detection circuit including a control circuit configured to detect an abnormal operation of the movable contact to the fixed contact based on at least one of a first transient response signal of a coil current passed through the excitation coil during the supply of a first detection pulse signal in a non-operation state of the movable contact relative to the fixed contact and a second transient response signal of the coil current during the supply of a second detection pulse signal in an operation state of the movable contact relative to the fixed contact.

A sixth aspect of the present invention provides an abnormality detection system including: an electromagnetic relay in which a movable contact and a fixed contact are closed or opened by an electromagnetic force generated in accordance with supply or cutoff of a current to an excitation coil; and an abnormality detection circuit configured to detect an abnormal operation of the movable contact to the fixed contact based on at least one of a first transient response signal of a coil current passed through the excitation coil during the supply of a first detection pulse signal in a non-operation state of the movable contact relative to the fixed contact and a second transient response signal of the coil current during the supply of a second detection pulse signal in an operation state of the movable contact relative to the fixed contact.

Effect of the Invention

In the abnormality detection method for electromagnetic relay of the present invention, the abnormal operation of the movable contact to the fixed contact is detected based on at least one of the first transient response signal of the coil current passed through the excitation coil during the supply of the first detection pulse signal in the state of not supplying the operation signal to operate the movable contact relative to the fixed contact and the second transient response signal of the coil current during the supply of the second detection pulse signal in the state of supplying the operation signal.

The first transient response signal during the supply of the first detection pulse signal in the state of not supplying the operation signal and the second transient response signal during the supply of the second detection pulse signal in the state of supplying the operation signal indicate different values in accordance with the position of the movable contact relative to the fixed contact. Accordingly, the abnormal operation of the movable contact to the fixed contact can be detected on the basis of at least one of the first transient response signal and the second transient response signal.

BRIEF DESCRIPTION OF THE DRAWINGS

FIG. 13(a) is a waveform chart illustrating the separation pulse signal, and FIG. 13(b) is a waveform chart illustrating the separation transient response signal.

FIG. 14(a) is a waveform chart illustrating the attraction pulse signal, and FIG. 14(b) is a waveform chart illustrating the attraction transient response signal.

FIG. 35(a) is a graph illustrating the separation pulse signal, and FIG. 35(b) is a graph illustrating a mode in which the separation transient response signal based on the separation pulse signal changes according to a variation in power supply voltage.

FIG. 36(a) is a waveform chart illustrating the separation pulse signal for the high power supply voltage, FIG. 36(b) is a waveform chart illustrating the separation pulse signal for the low power supply voltage, and FIG. 36(c) is a waveform chart illustrating the separation transient response signal in which a coil current change width caused by the detection pulse signal is kept constant by controlling the duty of the separation pulse signal irrespective of the state of the power supply voltage.

FIG. 42(a) is a waveform chart illustrating the attraction signal, and FIG. 42(b) is a waveform chart illustrating the attraction transient response signals.

FIG. 55(a) is a graph illustrating a relationship between the pulse frequency and a current amplitude, and FIG. 55(b) is a graph illustrating a relationship between the pulse frequency and an amplitude decreasing rate.

MODES FOR CARRYING OUT THE INVENTION

Hereinafter, embodiments of the present invention will be described in detail.

First Embodiment (Configuration of Welding Detection System 1)

Figure 1:
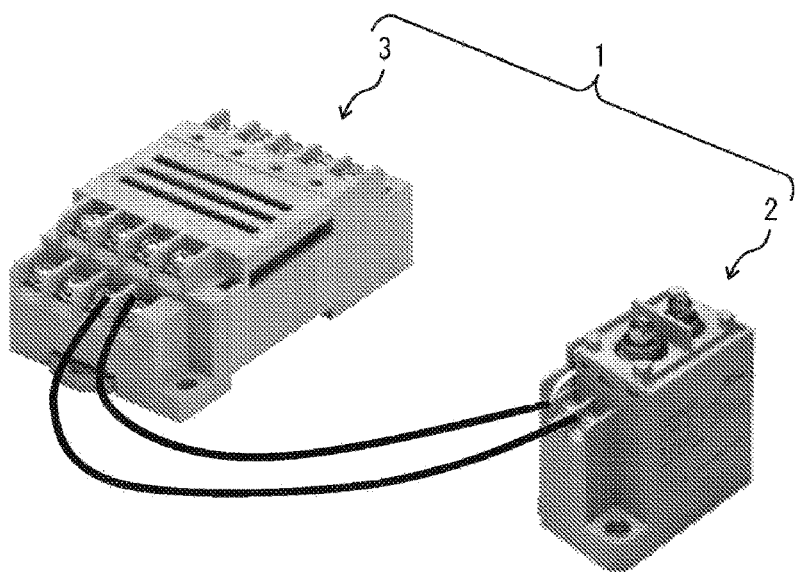
FIG. 1 is a schematic diagram illustrating an appearance of a welding detection system according to a first embodiment.
Figure 2:
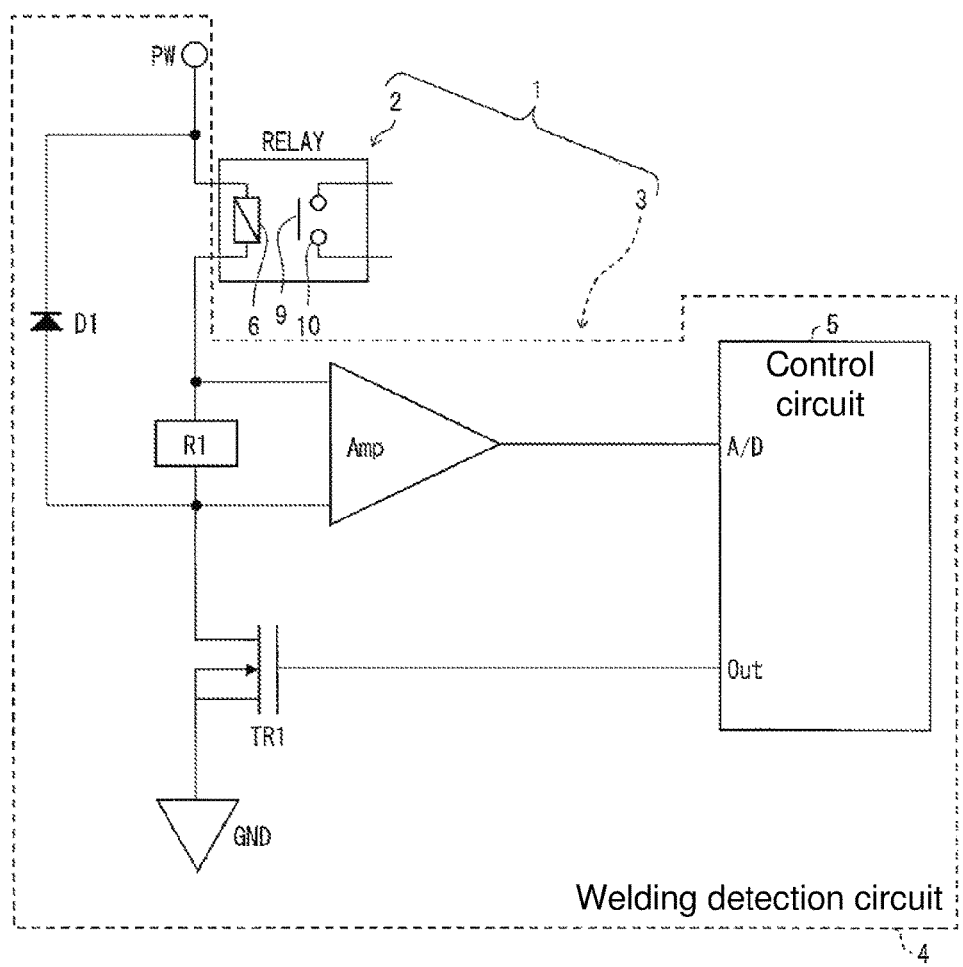
FIG. 2 is a circuit diagram illustrating a configuration of the welding detection system.

FIG. 1 is a schematic diagram illustrating an appearance of a welding detection system (abnormality detection system) 1 according to a first embodiment, and FIG. 2 is a circuit diagram illustrating a configuration of the welding detection system 1. The welding detection system 1 includes an electromagnetic relay 2 and a welding detection module 3 that detects the welding of the electromagnetic relay 2. The welding detection module 3 includes a welding detection circuit 4 (abnormality detection circuit).

FIG. 3(a) is a sectional view illustrating a separated state of the electromagnetic relay 2 provided in the welding detection system 1, and FIG. 3(b) is a sectional view illustrating an attracted state of the electromagnetic relay 2. The electromagnetic relay 2 includes an excitation coil 6 provided between a yoke 11 having a substantial U-shape in section and a yoke 12 bridging both ends of the yoke 11. A fixed iron core 13 is provided in the yoke 12 so as to project to an inside of the excitation coil 6.

A driving shaft 7 is provided along a center axis direction of the excitation coil 6 so as to be reciprocally moved through the fixed iron core 13 and the yoke 12. A movable iron core 8 is fixed to one end of the driving shaft 7 so as to be inserted in the excitation coil 6. A recovering coil spring 16 is provided between the movable iron core 8 and the fixed iron core 13.

A flange 18 is provided at the other end of the driving shaft 7, and a movable contact 9 is also provided at the other end so as to be orthogonal to the driving shaft 7. Particularly, the movable contact 9 is installed between a pair of washers 14 attached to the driving shaft 7 together with a compression spring 19. The washer 14 installed on the lower side (based on FIG. 3) is fixed to the driving shaft 7 by an E-ring 15. A top surface of the movable contact 9 is abutted on a bottom surface of the washer 14 installed on the upper side (based on FIG. 3) by the compression spring 19, and a top surface of the upper-side washer 14 is abutted on a bottom surface of the flange 18 by the compression spring 19, whereby the movable contact 9 is fixed to the driving shaft 7. A cover 17 and a pair of fixed contacts 10 are provided in the electromagnetic relay 2. The cover 17 is provided so as to cover the movable contact 9, and the pair of fixed contacts 10 is attached to the cover 17 so as to face the movable contact 9. The movable iron core 8 and the movable contact 9 are reciprocally moved integral with the driving shaft 7, whereby the movable contact 9 is separated from or attracted to the fixed contact 10.

Referring to FIG. 2, the welding detection circuit 4 includes a current detection resistor R1 coupled to one end of the excitation coil 6 and a transistor (switching element) TR1 connected onto an opposite side to the excitation coil 6 with respect to the current detection resistor R1. In the transistor TR1, a terminal on the opposite side to the current detection resistor R1 is grounded. A power supply PW is connected to the other end of the excitation coil 6. A regeneration diode D1 is connected between the other end of the excitation coil 6 and a terminal of the current detection resistor R1 on the side of the transistor TR1. An amplifier Amp that is of a differential amplifier is connected to both ends of the current detection resistor R1.

The welding detection circuit 4 includes a control circuit 5. The control circuit 5 includes a terminal Out connected to a gate terminal of the transistor TR1 and a terminal A/D connected to the amplifier Amp.

(Operation of Welding Detection System 1)

Figure 4:
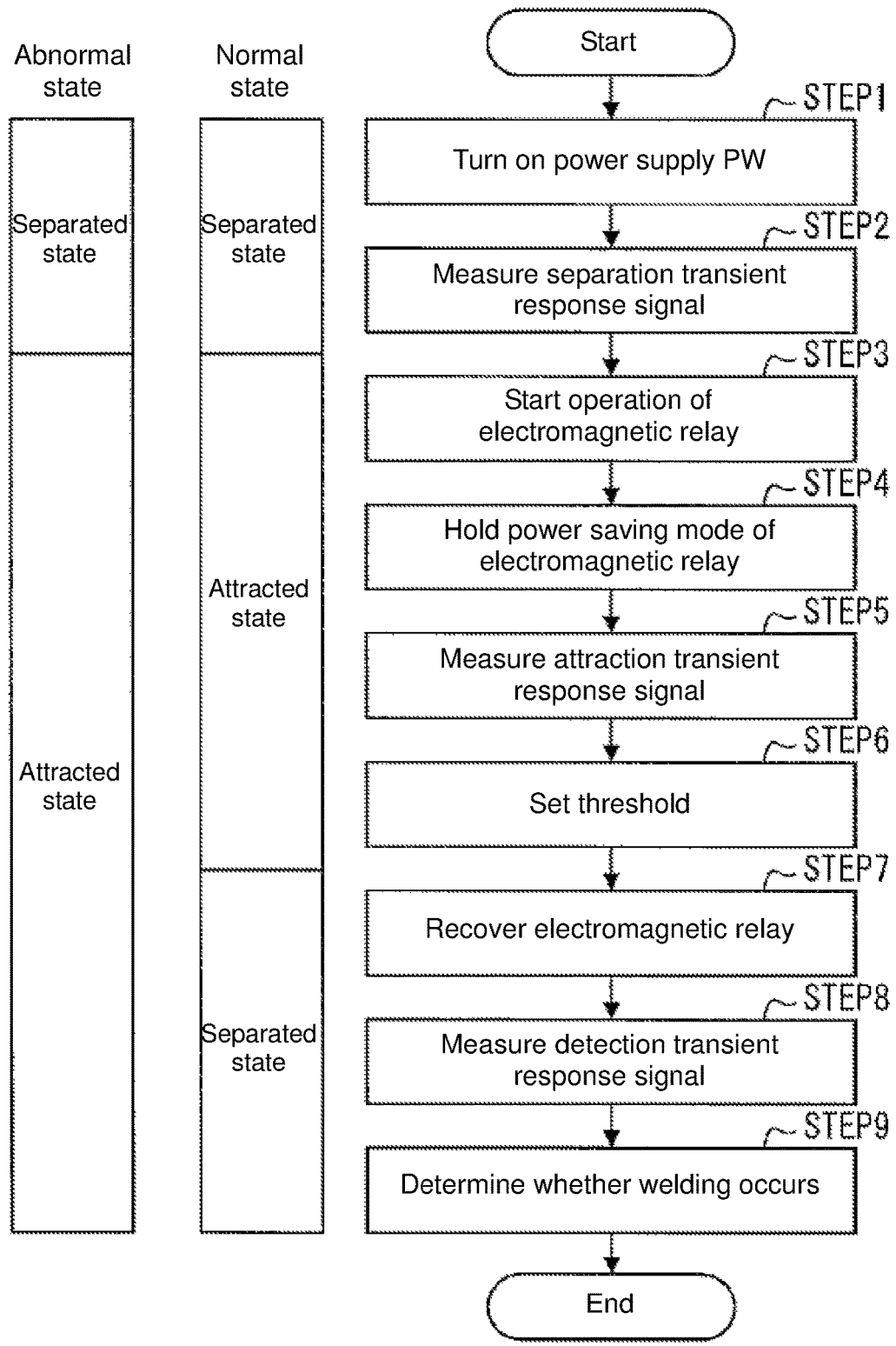
FIG. 4 is a flowchart illustrating an operation of the welding detection system.

FIG. 4 is a flowchart illustrating an operation (an abnormality detection method of the electromagnetic relay 2) of the welding detection system 1. The power supply PW of the welding detection circuit 4 is turned on while the movable contact 9 is separated from the fixed contact 10 (STEP 1).

Figure 5:
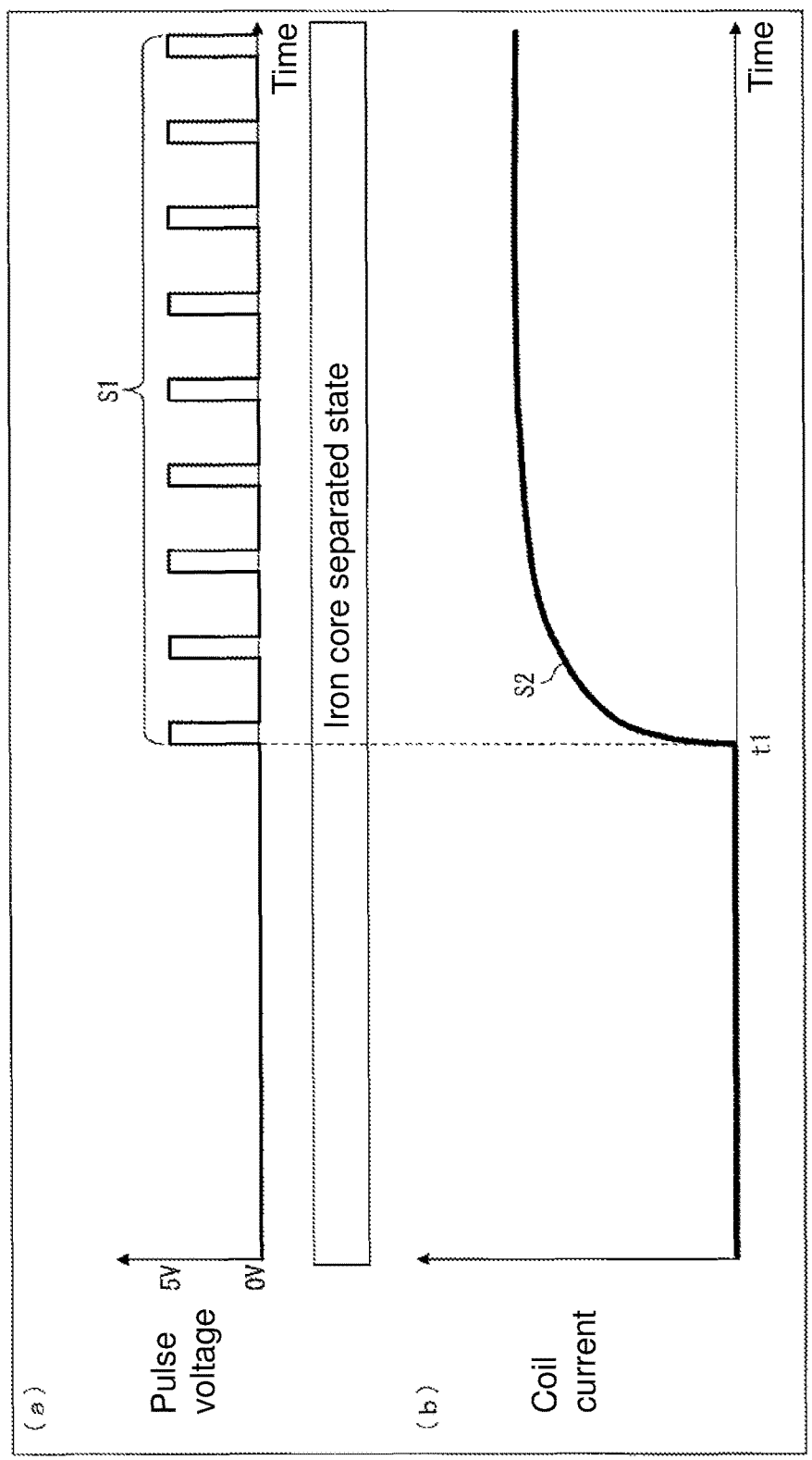
FIG. 5(a) is a waveform chart illustrating a separation pulse signal applied to a switching element associated with the electromagnetic relay in the separated state.
FIG. 5(b) is a waveform chart illustrating a separation transient response signal generated on the basis of the separation pulse signal.

FIG. 5(a) is a waveform chart schematically illustrating a separation pulse signal S1 applied to a transistor TR1 associated with the electromagnetic relay 2 in the separated state, and FIG. 5(b) is a waveform chart illustrating a separation transient response signal S2 (first transient response signal) generated on the basis of the separation pulse signal (first detection pulse signal) S1. The later-described waveform charts schematically illustrate the actual waveforms except for FIGS. 8 and 9. A pulse waveform of 5 V is illustrated as the separation pulse signal S1, the present invention is not limited to the pulse waveform having a voltage of 5 V, but any pulse waveform may be adopted as long as the voltage is enough to drive the transistor TR1.

The control circuit 5 applies the separation pulse signal S1 from the terminal Out to the gate terminal of the transistor TR1 at a clock time t1. Therefore, while the movable contact 9 is separated from the fixed contact 10, and the separation transient response signal S2 of a coil current passed through the excitation coil 6 is input from the amplifier Amp to the terminal A/D of the control circuit 5 (STEP 2).

A duty of the separation pulse signal S1 is set within a range where the movable contact 9 is not operated. This is because the waveform of the transient response signal is deformed to cause the false detection when the movable iron core 8 is moved during the measurement of the transient response signal. As to the coil current passed through the excitation coil 6, measured data is detected from the amplifier Amp using the current detection resistor R1.

Figure 6:
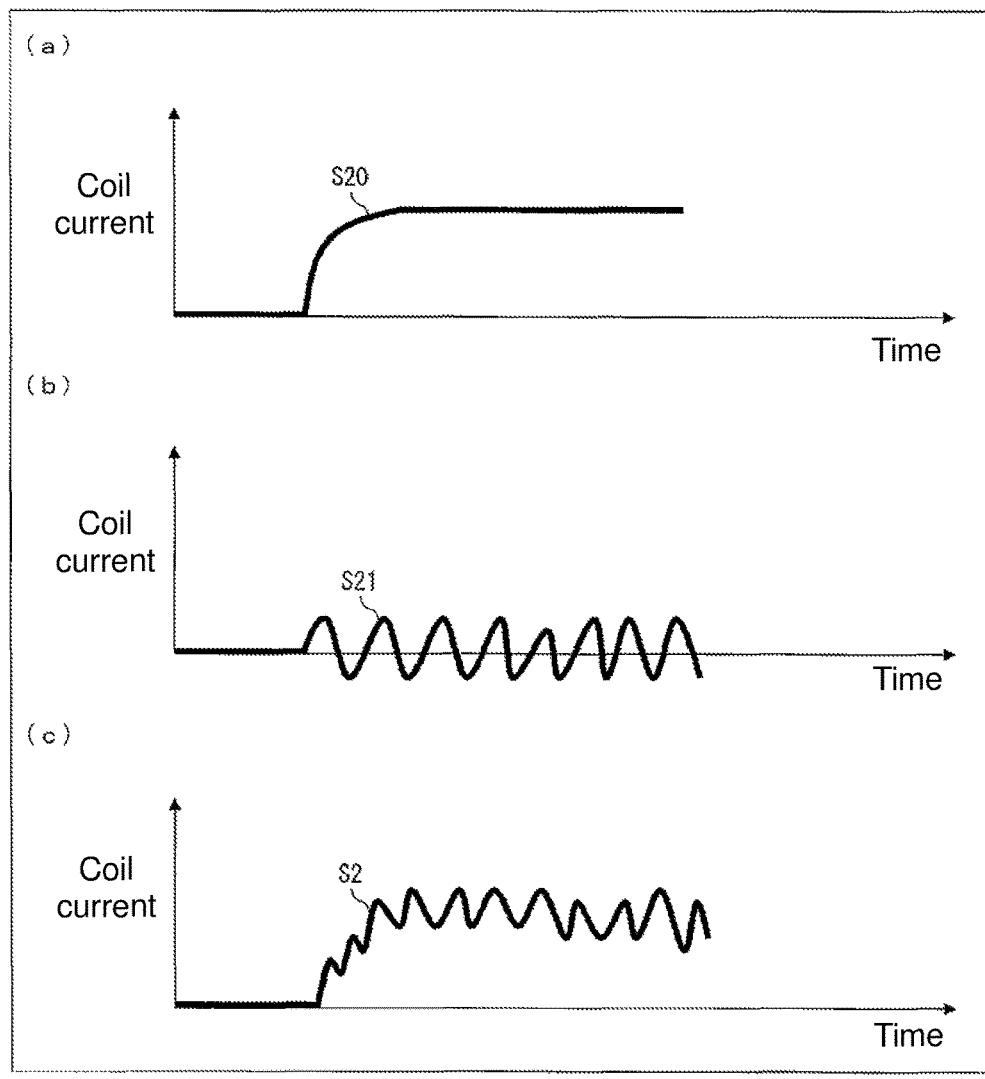
FIG. 6(a) is a waveform chart illustrating a signal in which a transient response component is extracted from the separation transient response signal.
FIG. 6(b) is a waveform chart illustrating a signal in which an AC component is extracted from the separation transient response signal.
FIG. 6(c) is a waveform chart illustrating a specific waveform of the separation transient response signal.
Figure 7:
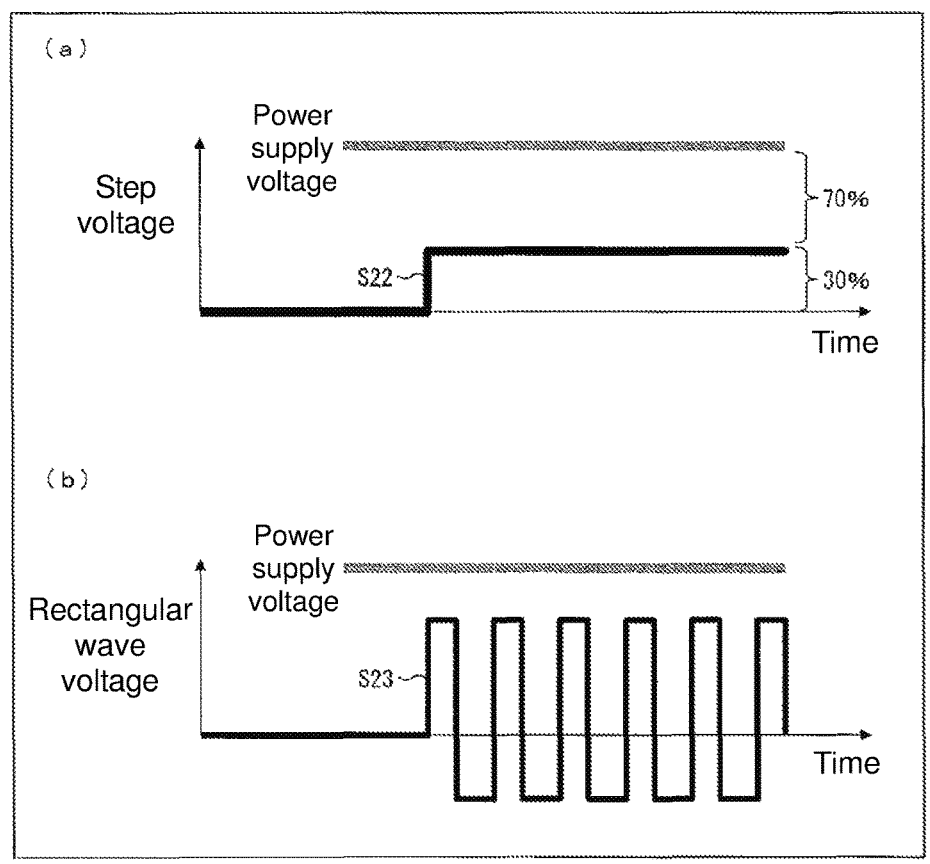
FIG. 7(a) is a waveform chart illustrating a step signal corresponding to the signal in FIG. 6(a)
FIG. 7(b) is a waveform chart illustrating a rectangular wave signal corresponding to the signal in FIG. 6(b).

FIG. 6(*a*) is a waveform chart illustrating a signal S20 (first transient response signal) in which a transient response component is extracted from the separation transient response signal S2, FIG. 6(*b*) is a waveform chart illustrating a signal S21 in which an AC component is extracted from the separation transient response signal S2, and FIG. 6(*c*) is a waveform chart illustrating the actual waveform of the separation transient response signal S2. FIG. 7(*a*) is a waveform chart illustrating a step signal S22 corresponding to the signal S20 in FIG. 6(*a*), and FIG. 7(*b*) is a waveform chart illustrating a rectangular wave signal S23 corresponding to the signal S21 in FIG. 6(*b*). FIGS. 6(*a*) to 6(*c*) illustrate the current passed through the excitation coil 6, and FIGS. 7(*a*) and 7(*b*) illustrate the voltage applied to both ends of the excitation coil 6.

It is known that the coil current passed through the excitation coil 6 in FIG. 2 is equivalent to the current that is passed when the duty of the separation pulse signal S1 applied to the transistor TR1 is kept constant, for example, when a DC signal of 5V is applied to the transistor TR1 while the voltage of the power supply PW is decreased to 30% (the separation pulse signal S1 has the duty of 100%) in a case where the separation pulse signal S1 applied to the transistor TR1 has the duty of 30%.

On the other hand, the inventor found the following two points as a characteristic of the voltage when the duty of the separation pulse signal S1 applied to the transistor TR1 changes stepwise from a certain value to another value. First, for example, when the duty changes from 0% to 30%, the voltage between both ends of the excitation coil 6 can be recognized while divided into a component of the step voltage, which is of 30% of the power supply voltage and is expressed by the step signal S22 in FIG. 7(*a*), and a component of a rectangular wave voltage expressed by the rectangular wave signal S23 in FIG. 7(*b*). Even if the frequency of the separation pulse signal S1 is increased, only the frequency of the rectangular wave signal S23 increases, but the component of the step signal S22 does not change. Second, the transient response signal obtained by the component of the step signal S22 is decided by a time constant of an RL circuit, and the time constant of the RL circuit is specified by a resistance value of the excitation coil 6, the current detection resistor R1, and inductance of the excitation coil 6.

Accordingly, a coil current waveform (separation transient response signal S2 in FIG. 6(*c*)) in which a current waveform (signal S20 in FIG. 6(*a*)) passed through the excitation coil 6 during the application of the step voltage (step signal S22) having magnitude of about (duty ratio× power supply voltage) to both ends of the excitation coil 6 and a current waveform (signal S21 in FIG. 6(*b*)) passed through the excitation coil 6 during the application of the AC component (rectangular wave signal S23) of the pulse frequency to both ends of the excitation coil 6 are combined is obtained by changing the duty of the separation pulse signal S1.

The transient response signal (signal S20 in FIG. 6(*a*)) corresponding to the step voltage (step signal S22) having arbitrary magnitude can be obtained when the AC component (signal S21 in FIG. 6(*b*)) passed through the excitation coil 6 is cut by the AC component (rectangular wave signal S23) of the pulse frequency. For example, the step signal S22 is set to the magnitude of the range in which the movable contact 9 does not recover (separate), which allows the transient response signal to be obtained when the movable contact is held (attracted). A method for cutting the AC component (signal S21 in FIG. 6(*b*)) using the rectangular wave signal S23 is described later (the frequency range of the pulse signal).

Figure 8:
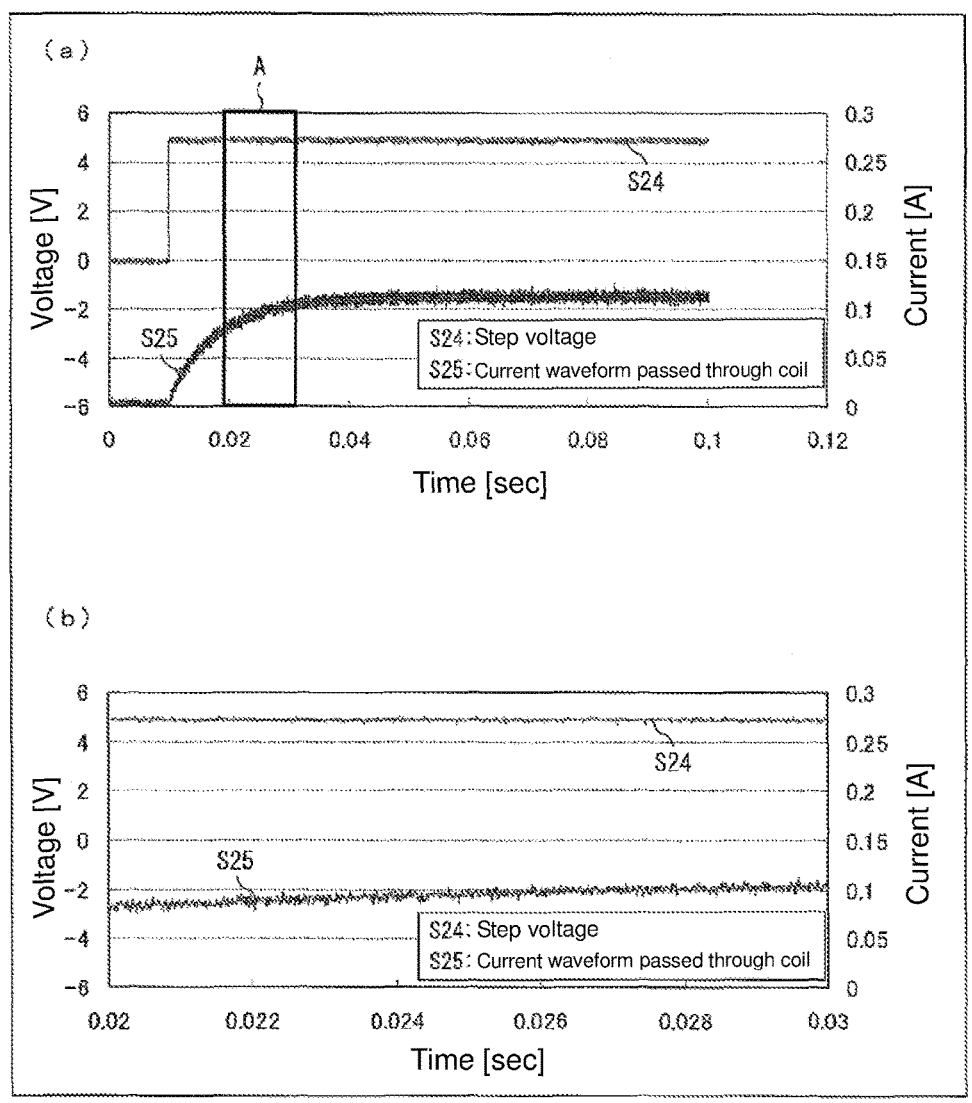
FIG. 8(a) is a waveform chart illustrating a step voltage signal and a current signal passed through an excitation coil to which the step voltage signal is applied.
FIG. 8(b) is a waveform chart in which an A portion in FIG. 8 (a) is enlarged.

FIG. 8(*a*) is a waveform chart illustrating a step voltage signal S24 applied to the transistor TR1 and a current signal S25 passed through the excitation coil 6 to which the step voltage signal S24 is applied, and FIG. 8(*b*) is a waveform chart in which an A portion in FIG. 8 (*a*) is enlarged. The current signal S25 indicates the current waveform passed through the excitation coil 6 when the step voltage signal S24 is applied while the power supply PW is set to the voltage of 3.6 V (30% of the power supply voltage of 12 V).

Figure 9:
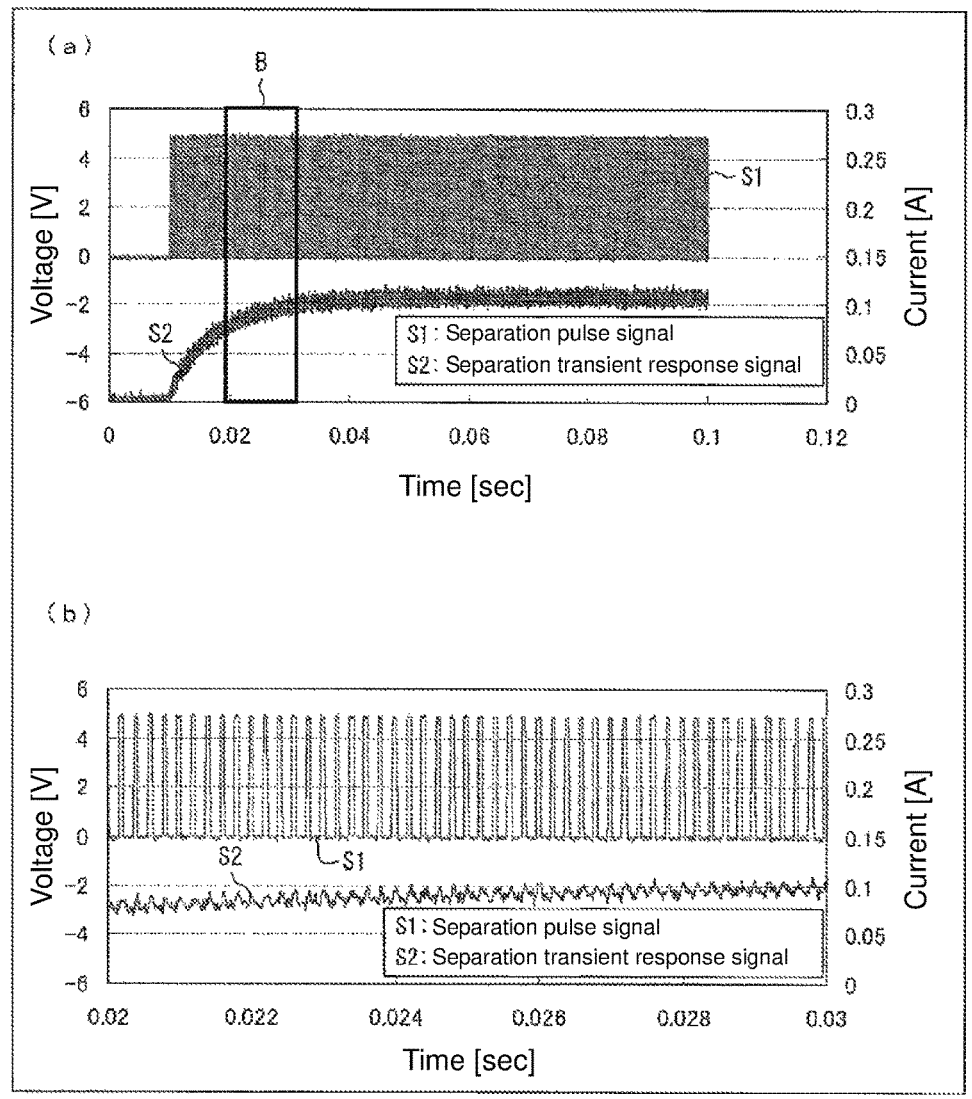
FIG. 9(a) is a waveform chart illustrating a separation pulse signal and a separation transient response signal passed through the excitation coil to which the separation pulse signal is applied.
FIG. 9(b) is a waveform chart in which a B portion in FIG. 9 (a) is enlarged.

FIG. 9(*a*) is a waveform chart illustrating the separation pulse signal S1 and the separation transient response signal S2 passed through the excitation coil 6 to which the separation pulse signal S1 is applied, and FIG. 9(*b*) is a waveform chart in which a B portion in FIG. 9 (*a*) is enlarged. The separation transient response signal S2 indicates the current waveform passed through the excitation coil 6 when the separation pulse signal S1 in which the pulse duty is changed from 0% to 30% is applied while the power supply PW is set to the voltage of 12 V.

As illustrated in FIG. 9, the frequency of the separation pulse signal S1 is set to be sufficiently lower than the time constant of the separation transient response signal S2 passed through the excitation coil 6.

Although the waveforms slightly differ from each other due to an influence of the characteristic of the regeneration diode D1, the current waveform of the separation transient response signal S2 in FIG. 9 is substantially matched with the current waveform of the current signal S25 in FIG. 8.

Figure 10:
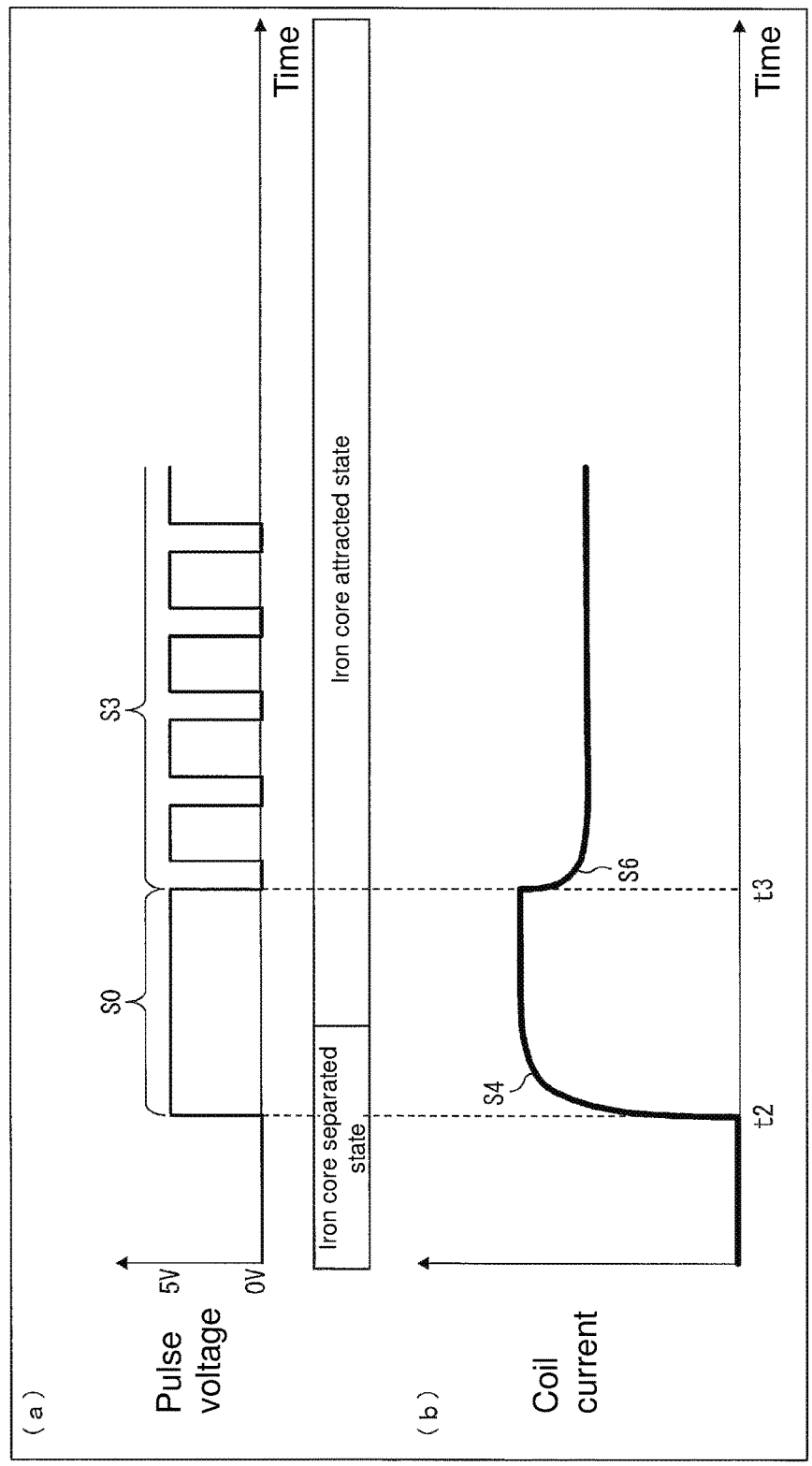
FIG. 10(a) is a waveform chart illustrating an attraction signal and an attraction pulse signal, which are applied to the switching element.
FIG. 10(b) is a waveform chart illustrating an attraction transient response signal generated on the basis of the attraction pulse signal.

The electromagnetic relay 2 can hold the closing state between the fixed contact and movable contact of the electromagnetic relay with a current smaller than a current necessary to attract the movable contact and the fixed contact to each other to bring the movable contact and the fixed contact into the closing state (a power saving state is held). FIG. 10(*a*) is a waveform chart illustrating operation signal applied to the transistor TR1 while the operation signal is divided into an attraction signal S0 and an attraction pulse signal (second detection pulse signal) S3, the attraction signal S0 is a portion of the duty ratio necessary to attract the movable contact and the fixed contact to establish the closing state, and the attraction pulse signal (second detection pulse signal) S3 is a portion of the duty ratio at which the closing state between the fixed contact and movable contact of the electromagnetic relay 2 can be held. FIG. 10(*b*) is a waveform chart illustrating an attraction transient response signal S6 generated on the basis of the attraction pulse signal S3.

Then, the movable contact 9 is attracted to the fixed contact 10 to operate the electromagnetic relay 2 when the control circuit 5 supplies the attraction signal S0 from the terminal Out to the gate terminal of the transistor TR1 at a clock time t2 (STEP 3). A transient response signal S4 of the coil current passed through the excitation coil 6 is input from the amplifier Amp to the terminal A/D of the control circuit 5. When the movable contact and the fixed contact are attracted to each other and brought into the closing state, actually the waveform of the transient response signal S4 can be lost by the movement of the movable iron core 8 in the middle.

When changing the duty of the attraction signal S0 at a clock time t3 (supplies the attraction pulse signal S3), the control circuit 5 measures the attraction transient response signal S6 (second transient response signal) through the amplifier Amp.

The duty of the attraction pulse signal S3 is changed so as to become the range in which the electromagnetic relay 2 does not recover. Therefore, the transient response signal can be measured when the operation signal is supplied to operate the electromagnetic relay 2.

Figure 11:
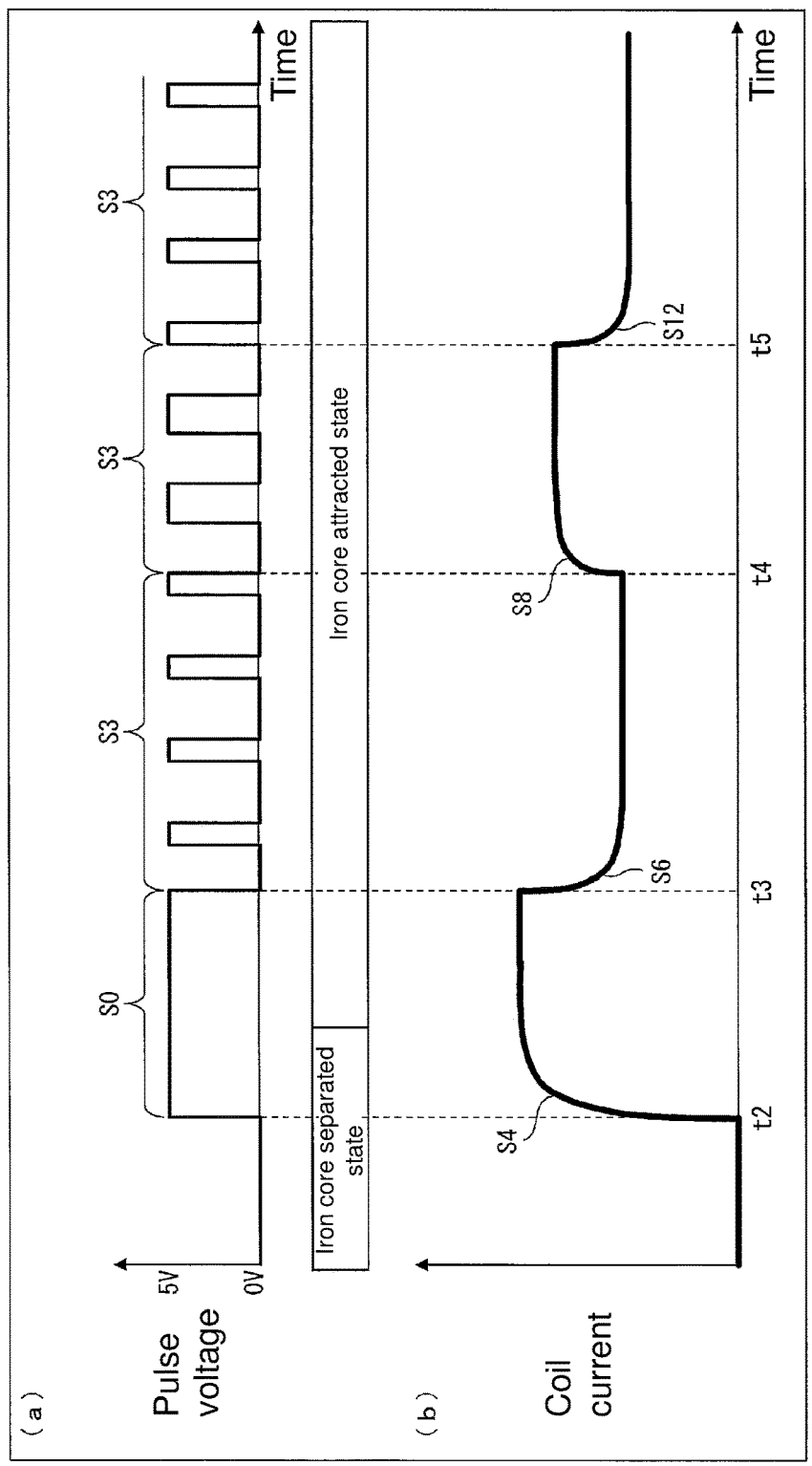
FIG. 11(a) is a waveform chart illustrating another attraction signal applied to the switching element.
FIG. 11(b) is a waveform chart illustrating another attraction transient response signal generated on the basis of another attraction signal.

In FIG. 10, by way of example, the transient response signal is measured after the electromagnetic relay 2 is operated by the attraction signal S0. The present invention is not limited to the example in FIG. 10. As illustrated in FIG. 11, the second transient response signal may be measured while the movable contact 9 is held at the fixed contact 10 in the power saving mode. An example in which the second transient response signal is measured while the movable contact 9 is held in the power saving mode will be described below. In the examples in FIGS. 10 and 11, the waveform of continuous electric conduction (duty of 100%) is used as the attraction signal S0 of the electromagnetic relay 2. However, the present invention is not limited to the examples in FIGS. 10 and 11. The waveform of several tens of percent may be used as long as the electromagnetic relay 2 can be operated.

Figure 12:
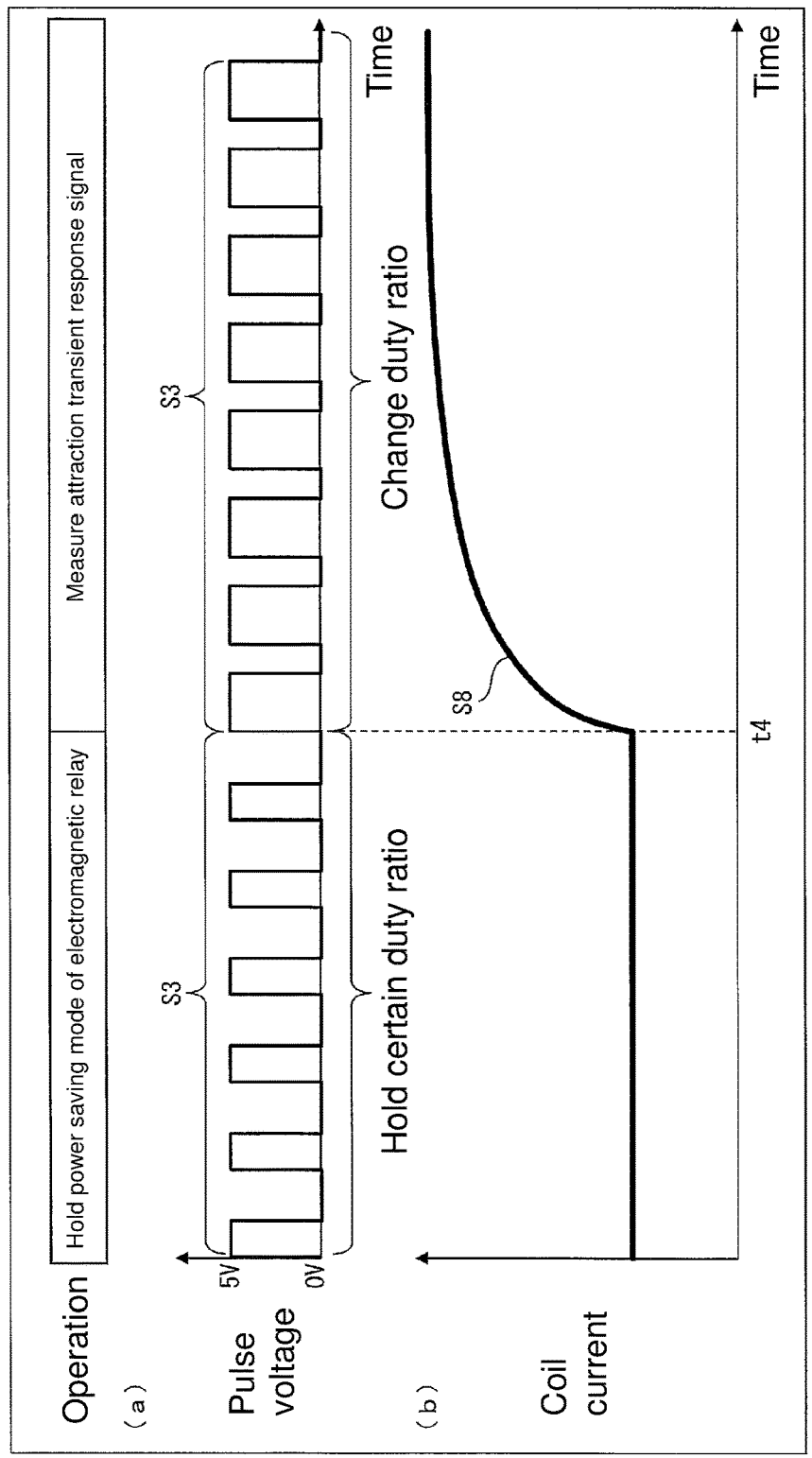
FIGS. 12(a) and 12(b) are waveform charts in which main portions in FIGS. 11(a) and 11(b) are enlarged, respectively.

FIG. 11(a) is a waveform chart illustrating another attraction pulse signal S3 applied to the transistor TR1, and FIG. 11(b) is a waveform chart illustrating another attraction transient response signal S8 generated on the basis of another attraction pulse signal S3. FIGS. 12(a) and 12(b) are waveform charts in which main portions in FIGS. 11(a) and 11(b) are enlarged, respectively.

The movable contact 9 is attracted to operate the electromagnetic relay 2 when the control circuit 5 supplies the attraction signal S0 to the transistor TR1 at the clock time t2 (STEP 3). A transient response signal S4 of the coil current passed through the excitation coil 6 is input from the amplifier Amp to the terminal A/D of the control circuit 5.

When the control circuit 5 changes the duty of the attraction signal S0 at the clock time t3 (supplies the attraction pulse signal S3) to hold the movable contact 9 in the power saving mode, the attraction transient response signal S6 (second transient response signal) is supplied to the control circuit 5 through the amplifier Amp (STEP 4). When the duty is increased at a clock time t4 (supplies the attraction pulse signal S3), the control circuit 5 measures the attraction transient response signal S8 (second transient response signal) at a rising edge of the coil current through the amplifier Amp (STEP 5).

The duty is changed so as to be decreased at the clock time t5 (supplies the attraction pulse signal S3), and the movable contact 9 is held in the power saving mode. At this point, the control circuit 5 measures an attraction transient response signal S12 (second transient response signal) at a falling edge of the coil current through the amplifier Amp.

Figure 13:
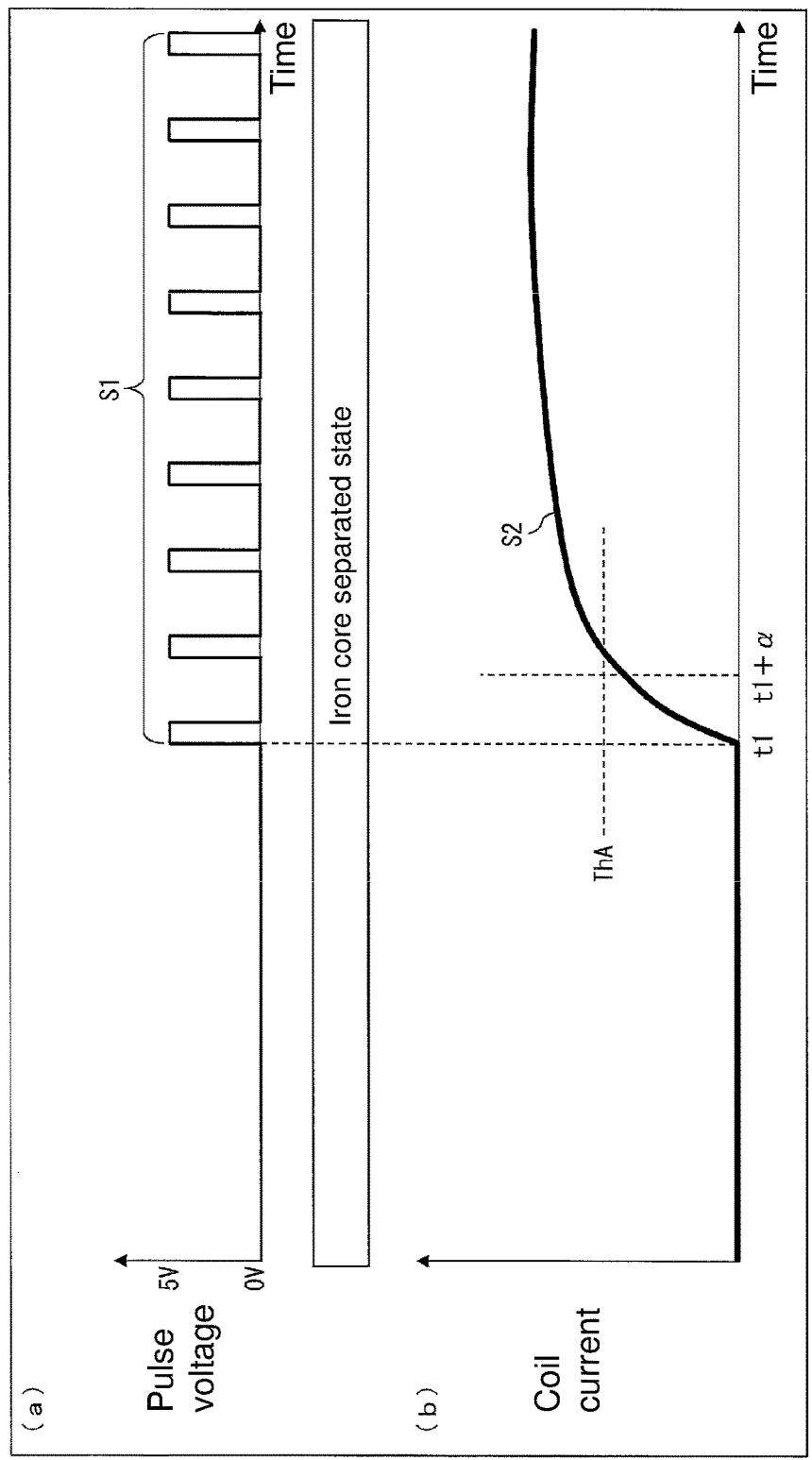
FIG. 13 is a waveform chart illustrating an operation of a welding detection system according to a seventh embodiment.

FIG. 13 is a waveform chart illustrating an operation of a welding detection system, FIG. 13(a) is a waveform chart illustrating the separation pulse signal S1, and FIG. 13(b) is a waveform chart illustrating the separation transient response signal S2.

The control circuit 5 (FIG. 2) applies the separation pulse signal S1 from the terminal Out to the gate terminal of the transistor TR1 at the clock time t1. Therefore, while the movable contact 9 is separated from the fixed contact 10, the separation transient response signal S2 (first transient response signal) of the coil current passed through the excitation coil 6 is input from the amplifier Amp to the terminal A/D of the control circuit 5. A value of the separation transient response signal S2 depends on whether the movable contact 9 is separated from or attracted to the fixed contact 10, and whether the movable contact 9 is separated from the fixed contact 10 can be determined by comparing a predetermined threshold ThA to the separation transient response signal S2.

The control circuit 5 stores the threshold ThA previously decided at a clock time (t1+α) in a memory (not illustrated). The control circuit 5 compares the value of the separation transient response signal S2 to the threshold ThA at the clock time (t1+α) to determine whether the movable contact 9 is separated from the fixed contact 10. When the movable contact 9 and the fixed contact 10 are in the attracted state, the control circuit 5 determines that a malfunction (abnormal operation) occurs.

Figure 14:
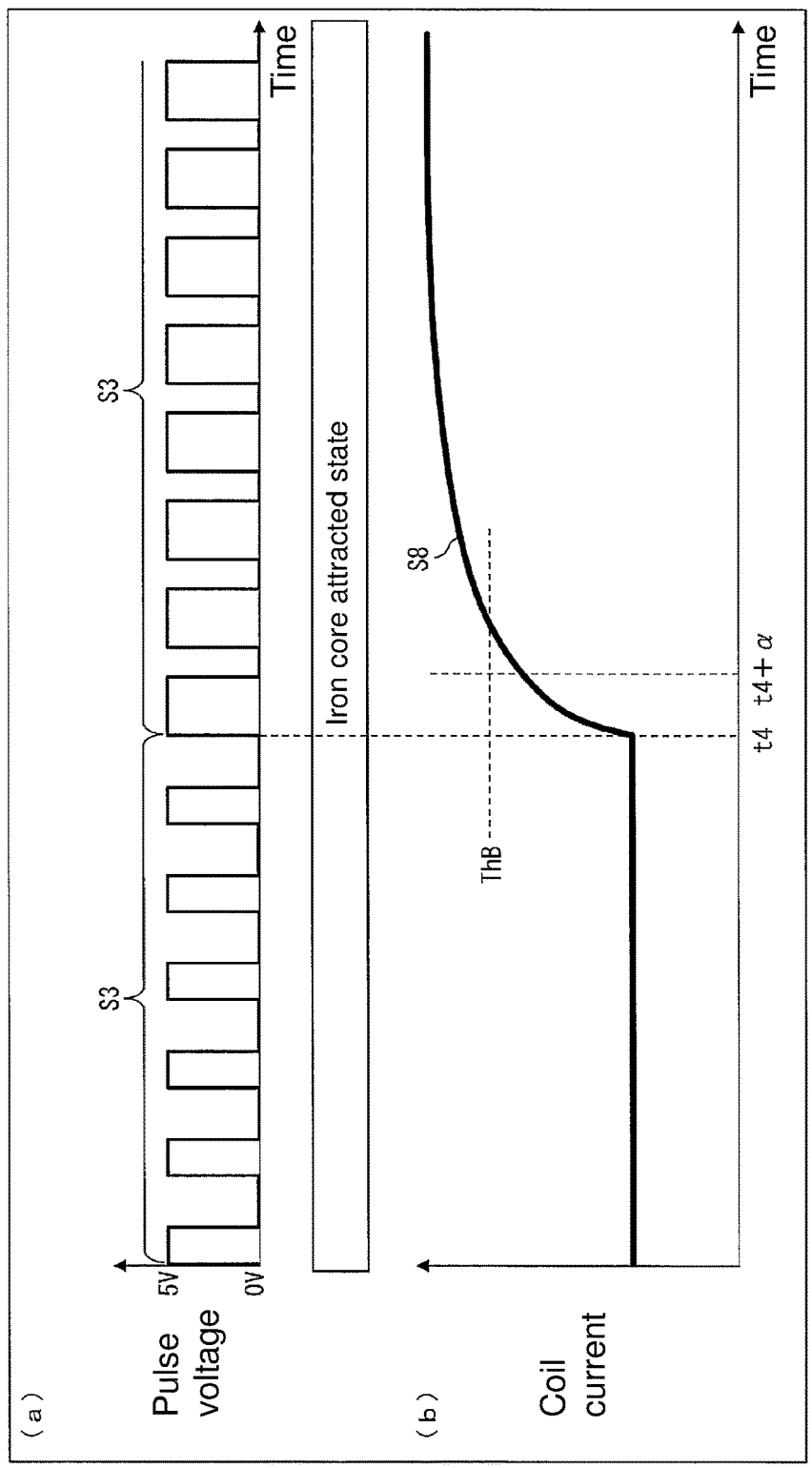
FIG. 14 is a waveform chart illustrating the operation of the welding detection system of the seventh embodiment.

FIG. 14 is a waveform chart illustrating the operation of the welding detection system 1, and FIG. 14 is an enlarged view of a main portion in FIG. 11. FIG. 14(a) is a waveform chart illustrating the attraction pulse signal S3, and FIG. 14(b) is a waveform chart illustrating the attraction transient response signal S8.

The movable contact 9 is attracted to operate the electromagnetic relay 2 when the control circuit 5 supplies the attraction signal S0 to the transistor TR1 (FIG. 2). The movable contact 9 attracted to the fixed contact 10 is held in the power saving mode when the control circuit 5 decreases the duty of the attraction signal S0. When the duty is increased at the clock time t4 (supplies the attraction pulse signal S3), the control circuit 5 measures the attraction transient response signal S8 (second transient response signal) at the rising edge of the coil current through the amplifier Amp. The value of the attraction transient response signal S8 depends on whether the movable contact 9 is separated from or attracted to the fixed contact 10, and whether the movable contact 9 is attracted to the fixed contact 10 can be determined by comparing a predetermined threshold ThB to the attraction transient response signal S8.

The control circuit 5 stores the threshold ThB previously decided at a clock time (t4+α) in the memory (not illustrated). The control circuit 5 compares the value of the attraction transient response signal S8 to the threshold ThB at the clock time (t4+α) to determine whether the movable contact 9 is attracted to the fixed contact 10. When the movable contact 9 and the fixed contact 10 are in the separated state, the control circuit 5 determines that a malfunction occurs.

The sharing of the excitation coil and the detection coil, which is the problem in Patent Document 1, can be achieved by the configurations in FIGS. 13 and 14. However, there is room for improvement on the influence of the individual difference of the inductance, which is the problem in Patent Document 2. A method for setting the threshold improving the problem in Patent Document 2 will be described below.

Figure 15:
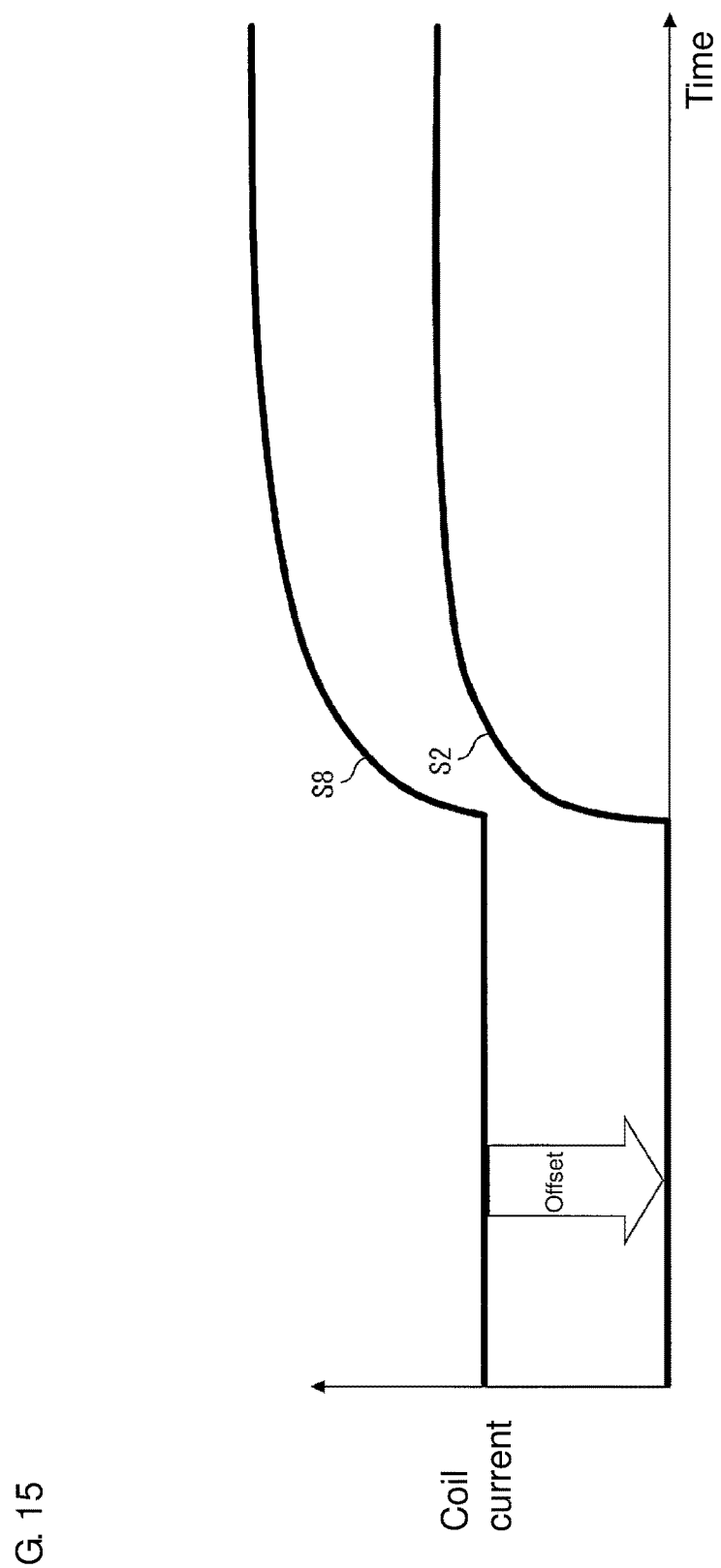
FIG. 15 is a waveform chart illustrating a method for comparing the separation transient response signal and the attraction transient response signal to each other.
Figure 16:
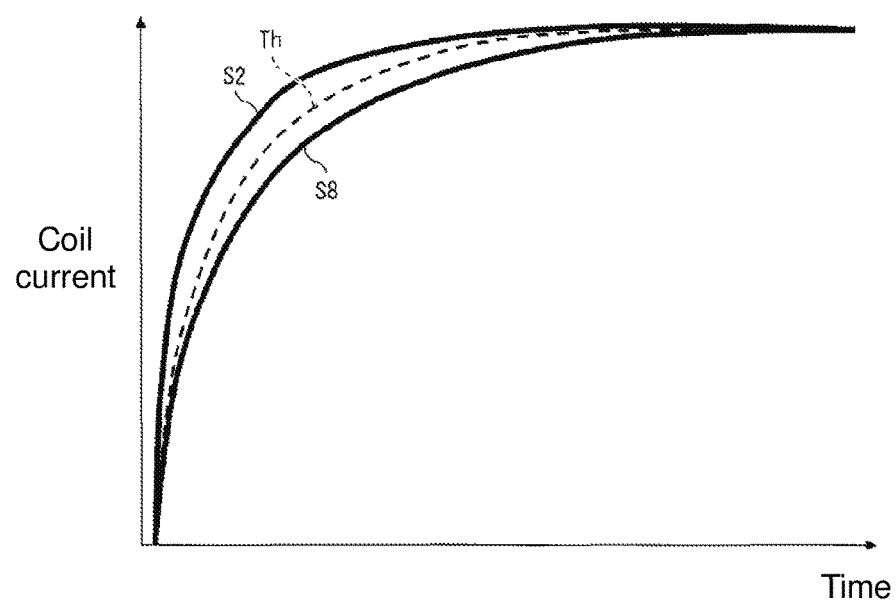
FIG. 16 is a waveform chart illustrating a method for setting a threshold for determining occurrence of welding on the basis of the separation transient response signal and the attraction transient response signal.

FIG. 15 is a waveform chart illustrating a method for comparing the separation transient response signal S2 and the attraction transient response signal S8 to each other. FIG. 16 is a waveform chart illustrating a method for setting a threshold Th for determining occurrence of the welding on the basis of the separation transient response signal S2 and the attraction transient response signal S8. As illustrated in FIG. 15, an offset is adjusted between the separation transient response signal S2 and the attraction transient response signal S8 by a numerical calculation, and the separation transient response signal S2 in the state in which the movable contact 9 is separated and the attraction transient response signal S8 in the state in which the movable contact 9 is attracted are compared to each other.

As illustrated in FIG. 16, a threshold Th is set between the separation transient response signal S2 and attraction transient response signal S8, in which the offset is adjusted, in order to determine whether the welding occurs between the movable contact 9 and the fixed contact 10 (STEP 6).

For example, the threshold Th is defined by the following (equation 1) or (equation 2).

$$Th = S8 + ((S2-S8)/2) \quad \text{(equation 1)}$$

or $$Th = S2 - ((S2-S8)/2) \quad \text{(equation 2)}$$

Figure 17:
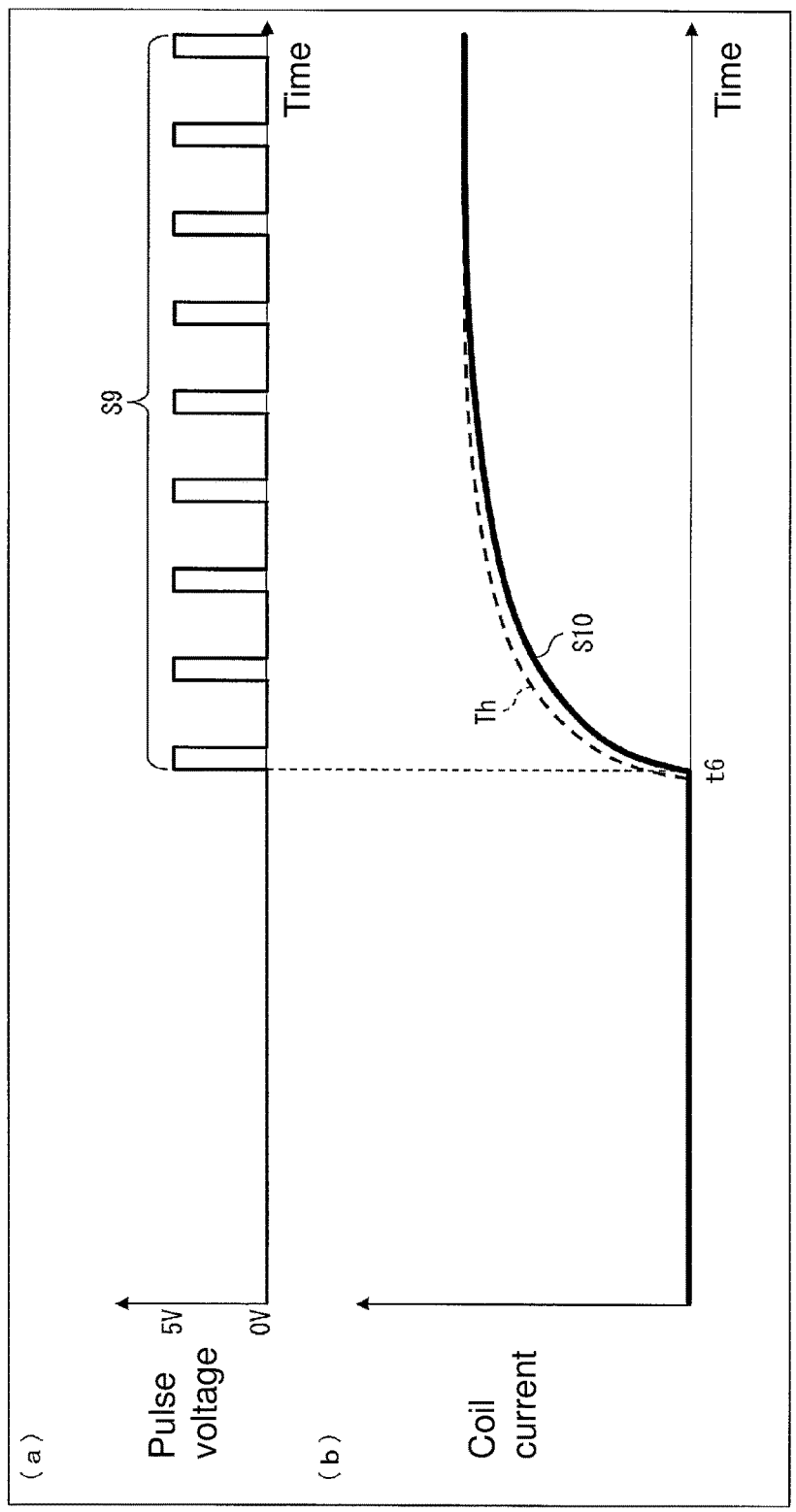
FIG. 17(a) is a waveform chart illustrating a detection pulse signal applied to the switching element.
FIG. 17(b) is a waveform chart illustrating the threshold and a detection transient response signal generated on the basis of the detection pulse signal.

FIG. 17(a) is a waveform chart illustrating a detection pulse signal (third detection pulse signal) S9 applied to the transistor TR1, and FIG. 17(b) is a waveform chart illustrating the threshold Th and a detection transient response signal (third transient response signal) S10 generated on the basis of the detection pulse signal S9.

The control circuit 5 stops the supply of the attraction pulse signal S3 to the transistor TR1 in order to separate the movable contact 9 from the fixed contact 10 to recover the electromagnetic relay 2 (STEP 7). When supplying a pulse signal S9 having the duty ratio within the range in which the electromagnetic relay is not operated to the transistor TR1 at the clock time t6, the control circuit 5 measures a detection transient response signal S10 of the coil current in order to detect whether the welding occurs between the movable contact 9 and the fixed contact 10 on the basis of the output from the amplifier Amp (STEP 8). The control circuit 5 detects whether the welding occurs between the movable contact 9 and the fixed contact 10 on the basis of the detection transient response signal S10 and the threshold Th (STEP 9). As illustrated in FIG. 17(b), when the detection transient response signal S10 is lower than the threshold Th, the control circuit 5 determines that the movable contact 9 is welded to the fixed contact 10. When the detection transient response signal S10 is greater than or equal to the threshold Th, the control circuit 5 determines that the movable contact 9 is separated from the fixed contact 10.

(Modification of Attraction Transient Response Signal S8)

FIG. 18(a) is a waveform chart illustrating the attraction signal S0 and attraction pulse signal S3 that are applied to the transistor TR1, and FIG. 18(b) is a waveform chart illustrating a relationship with an attraction transient response signal S11 generated on the basis of the attraction pulse signal S3.

Figure 18:
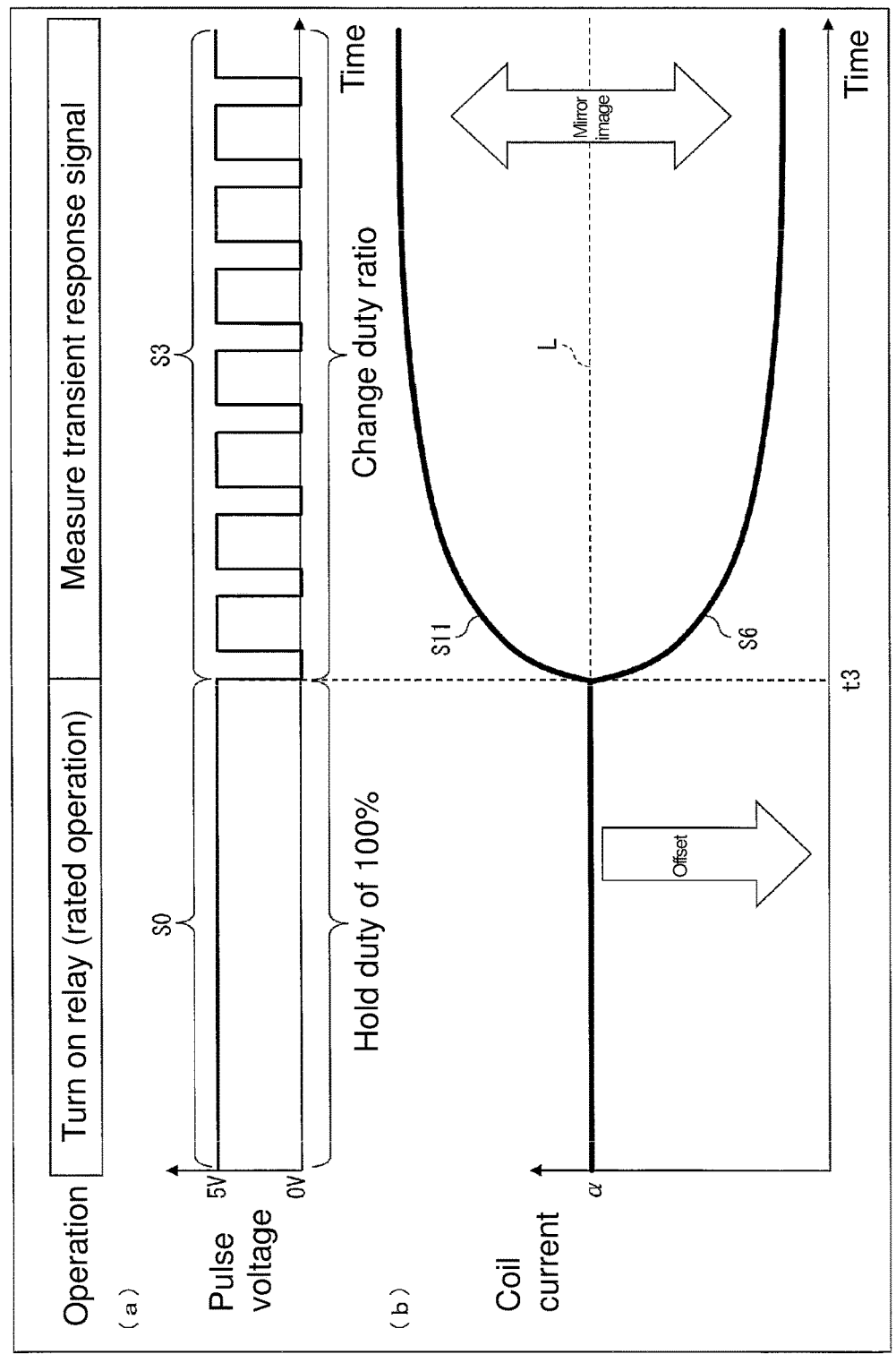
FIG. 18(a) is a waveform chart illustrating the attraction signal and attraction pulse signal that are applied to the switching element.
FIG. 18(b) is a waveform chart illustrating a relationship with another attraction transient response signal generated on the basis of the attraction pulse signal.

In FIGS. 12 to 16, by way of example, the threshold Th is set on the basis of the attraction transient response signal S8 at the rising edge. However, the present invention is not limited to the examples in FIGS. 12 to 16. As illustrated in FIG. 11, the threshold Th may be set on the basis of the attraction transient response signal S6 or S12 at the falling edge. FIG. 18 is an enlarged view of the main portion in FIG. 11. In FIG. 18, a falling attraction transient response signal S11 in which the falling attraction transient response signal S6 is inverted with respect to a horizontal line L corresponding to a coil current a is generated to adjust the offset between the attraction transient response signal S11 and the separation transient response signal S2, and threshold may be set as illustrated in FIG. 16.

(Modification of Method for Detecting Attraction)

Figure 19:
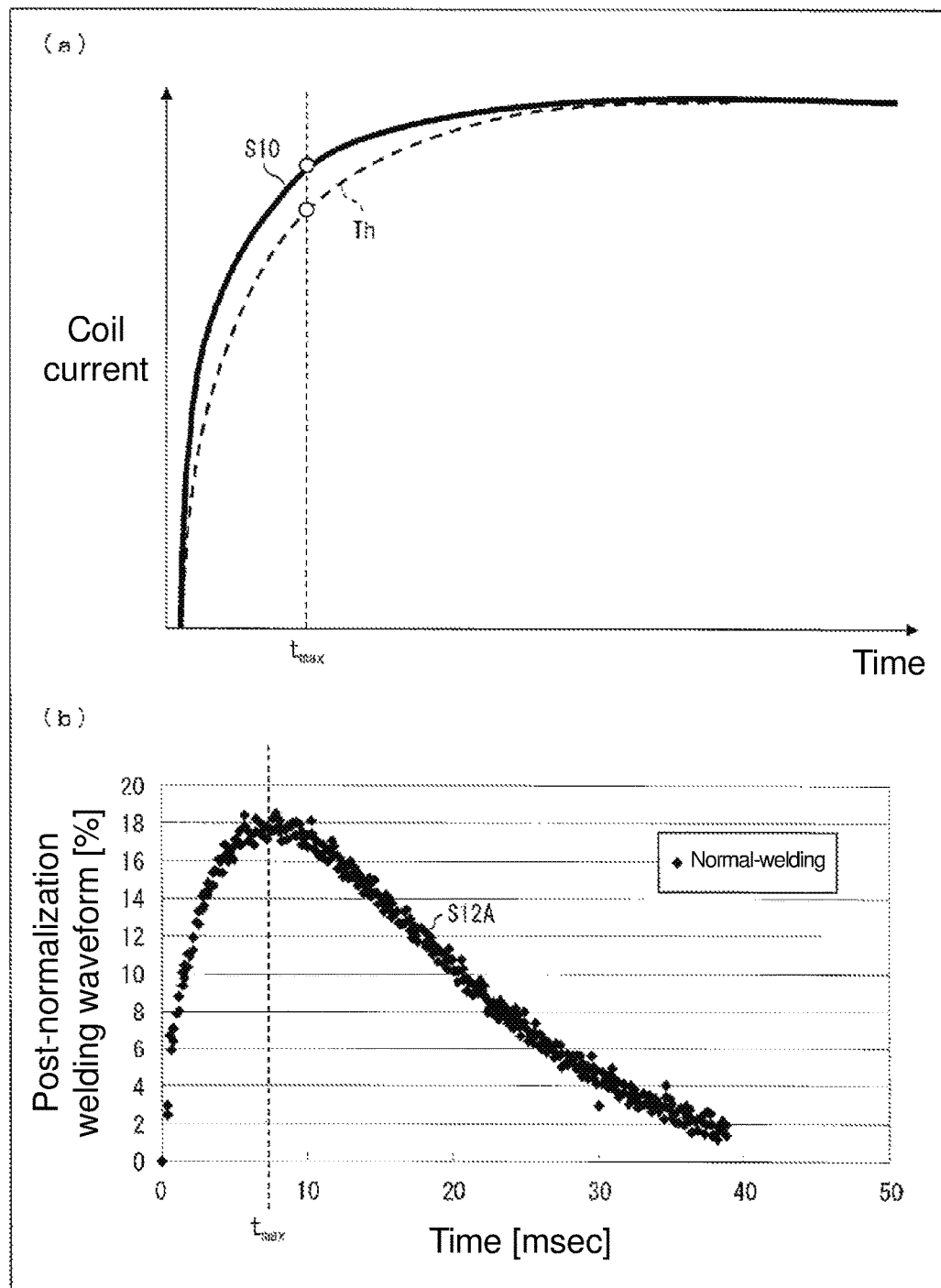
FIG. 19(a) is a waveform chart illustrating a first method for detecting the occurrence of the welding on the basis of the threshold and the detection transient response signal.
FIG. 19(b) is a waveform chart illustrating a difference waveform between the separation transient response signal and the attraction transient response signal.

FIG. 19(a) is a waveform chart illustrating a first method for detecting the occurrence of the welding on the basis of the threshold Th and the detection transient response signal S10, and FIG. 19(b) is a waveform chart illustrating a difference waveform between the separation transient response signal S2 and the attraction transient response signal S8.

The control circuit 5 obtains a clock time tmax at which a transient response difference waveform S12A expressing the waveform of the difference between the separation transient response signal S2 and the attraction transient response signal S8 is maximized. For example, the clock time tmax is 8 msec. The control circuit 5 detects whether the welding occurs in the movable contact 9 on the basis of the detection transient response signal S10 at the clock time tmax and the threshold Th. That is, when the value of the detection transient response signal S10 is greater than or equal to the threshold Th at the clock time tmax, the control circuit 5 determines that the movable contact 9 is separated from the fixed contact 10. When the value of the detection transient response signal S10 is less than the threshold Th at the clock time tmax, the control circuit 5 determines that the movable contact 9 is attracted to the fixed contact 10.

Therefore, even if the inductance of the excitation coil 6 of the electromagnetic relay 2 has the individual difference, the threshold is set in accordance with the individual difference, so that the individual difference can be canceled.

Figure 20:
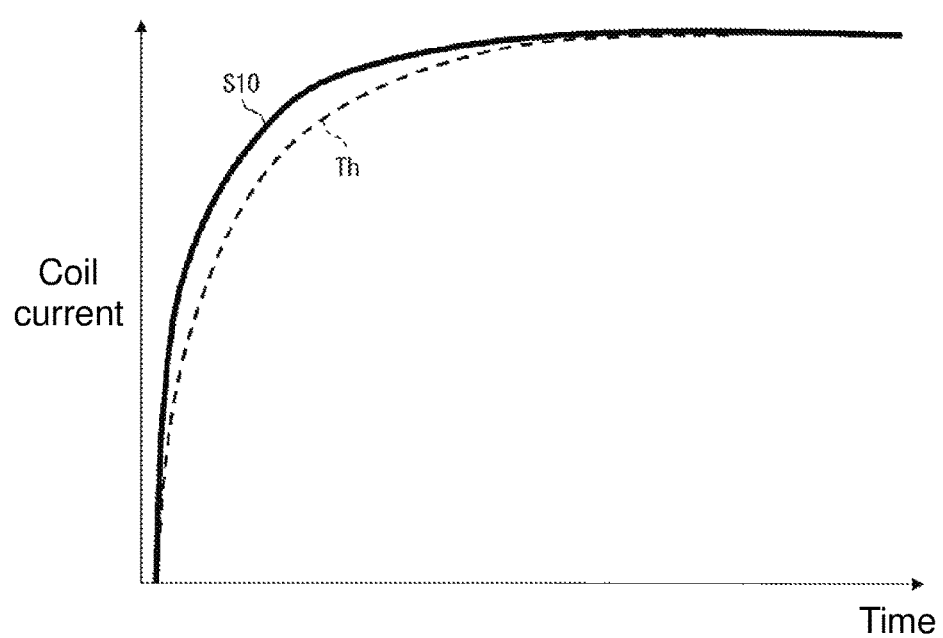
FIG. 20 is a waveform chart illustrating a second method for detecting the occurrence of the welding.

FIG. 20 is a waveform chart illustrating a second method for detecting the occurrence of the welding. The control circuit 5 calculates an integrated value in which the difference between the detection transient response signal S10 and the threshold Th is integrated, and obtains an area between the detection transient response signal S10 and the threshold Th. When the integrated value is greater than or equal to zero, the control circuit 5 determines that the movable contact 9 is separated from the fixed contact 10. When the integrated value is negative, the control circuit 5 determines that the movable contact 9 is attracted to the fixed contact 10.

In the configuration of FIG. 20, because the determination is made on the basis of the integrated value in a predetermined period, it is difficult to falsely determine the occurrence of the welding even if the noise is superposed on the detection transient response signal S10.

Figure 21:
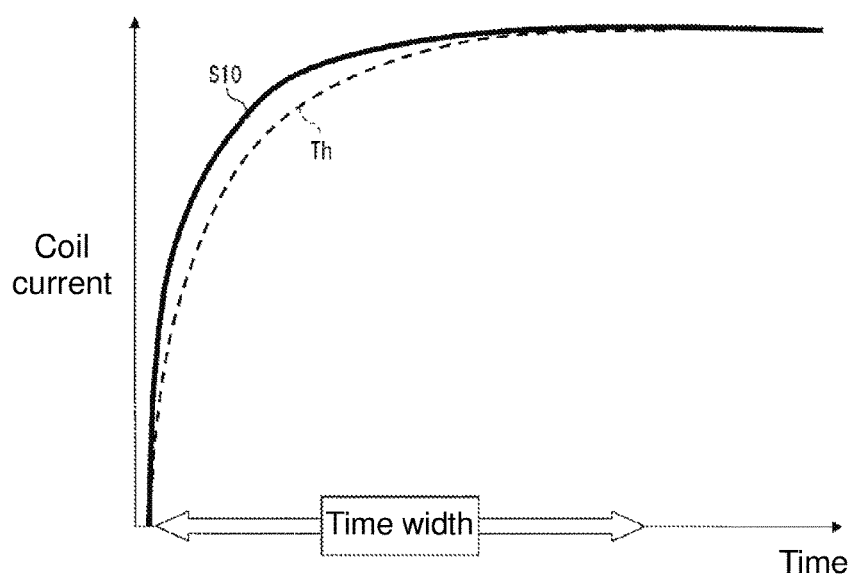
FIG. 21 is a waveform chart illustrating a third method for detecting the occurrence of the welding.

FIG. 21 is a waveform chart illustrating a third method for detecting the occurrence of the welding. When a time width in which the difference between the detection transient response signal S10 between threshold Th is greater than or equal to zero is greater than or equal to a time width in which the difference between the detection transient response signal S10 and the threshold Th is negative, the control circuit 5 determines that the movable contact 9 is separated from the fixed contact 10. When the time width in which the difference between the detection transient response signal S10 between threshold Th is greater than or equal to zero is less than the time width in which the difference between the detection transient response signal S10 and the threshold Th is negative, the control circuit 5 determines that the movable contact 9 is attracted to the fixed contact 10.

In the configuration of FIG. 21, because the determination is made on the basis of the time width corresponding to the magnitude relationship between the detection transient response signal S10 and the threshold Th, it is difficult to falsely determine the occurrence of the welding even if the noise is superposed on the detection transient response signal S10.

Figure 22:
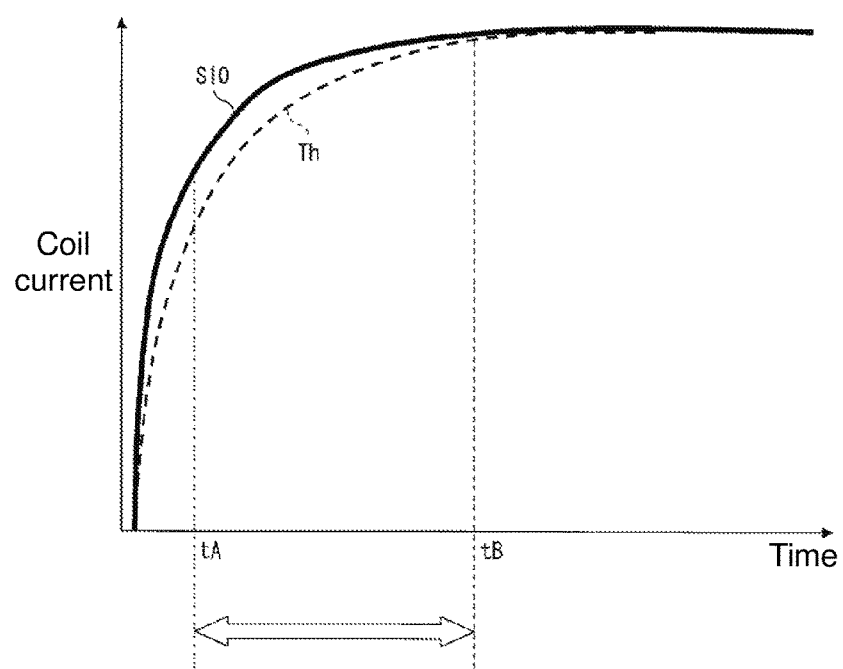
FIG. 22 is a waveform chart illustrating a fourth method for detecting the occurrence of the welding.
Figure 23:
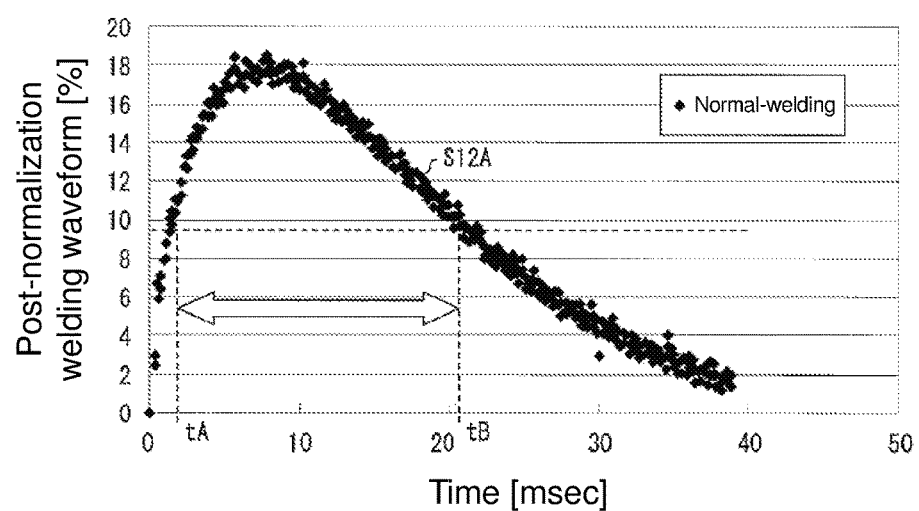
FIG. 23 is a waveform chart illustrating a method for setting an effective time range on the basis of the difference waveform.

FIG. 22 is a waveform chart illustrating a fourth method for detecting the occurrence of the welding. FIG. 23 is a waveform chart illustrating a method for setting an effective time range on the basis of the difference waveform. The control circuit 5 fixes a clock time tA and a clock time tB on the basis of the transient response difference waveform S12A expressing the difference between the separation transient response signal S2 and the attraction transient response signal S8. The clock time tA and the clock time tB are clock times defining a time range in which the transient response difference waveform S12A exceeds a half (about 9% in the example of the graph in FIG. 23) of the maximum value (about 18% in the example of the graph in FIG. 23) of the transient response difference waveform S12A. For example, the clock time tA and the clock time tB can be about 2 msec and about 20 msec, respectively.

The control circuit 5 determines whether the attraction of the movable contact 9 occurs on the basis of the integrated value in which the difference between the detection transient response signal S10 and the threshold Th is integrated from the clock time tA to clock time tB. The control circuit 5 may determine whether the attraction of the movable contact 9 occurs on the basis of the time width in which the difference between the detection transient response signal S10 and threshold Th is greater than or equal to zero and the time width in which the difference between the detection transient response signal S10 and the threshold Th is negative.

In the configuration of FIG. 22, because the determination is made on the basis of the time width associated with the transient response difference waveform S12A, it is difficult to falsely determine the occurrence of the welding even if the noise is instantaneously superposed on the detection transient response signal S10. The false determination caused by the noise is hardly made because the small range of the difference of the transient response difference waveform S12A is excluded from a determination target.

An operation to determine whether the welding occurs when the noise is superposed on the detection transient response signal S10 will be described below.

Figure 24:
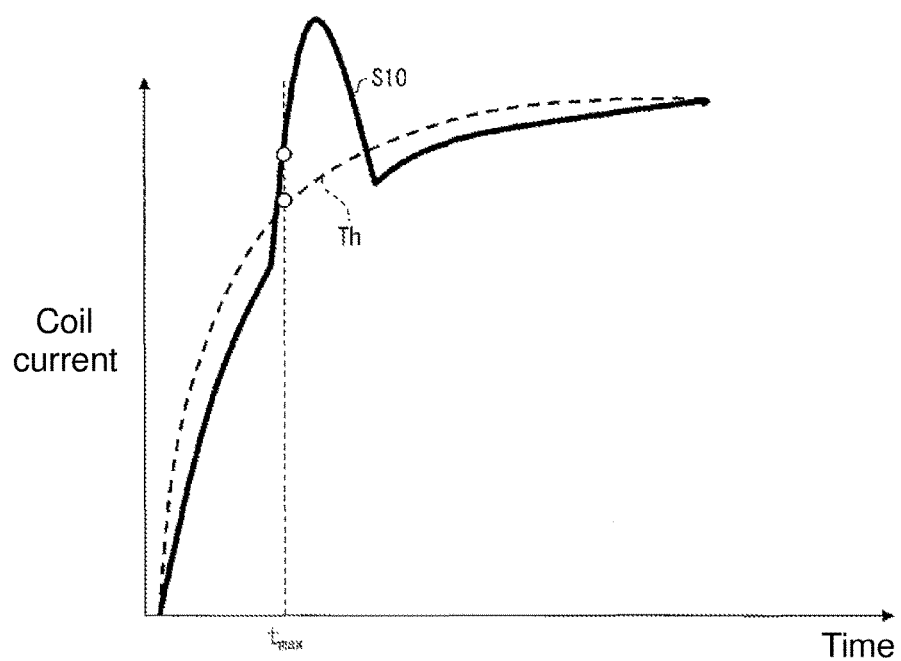
FIG. 24 is a waveform chart illustrating a first method for detecting the occurrence of the welding on the basis of the detection transient response signal in which the threshold and a noise are superposed on each other.

FIG. 24 is a waveform chart illustrating a first method for detecting the occurrence of the welding on the basis of the detection transient response signal S10 in which the threshold Th and the noise are superposed on each other. There are various noises such as a noise having periodicity and an instantaneous noise, and the instantaneous noise will be described by way of example. Because the similar effect is expected for other noises, the description is omitted.

When the detection transient response signal S10 is greater than or equal to the threshold Th at the clock time tmax at which the transient response difference waveform S12A in FIG. 19(b) is maximized, the control circuit 5 determines that the movable contact 9 is separated from the fixed contact 10. When the detection transient response signal S10 is less than the threshold Th at the clock time Tmax, the control circuit 5 determines that the movable contact 9 is attracted to the fixed contact 10.

Figure 25:
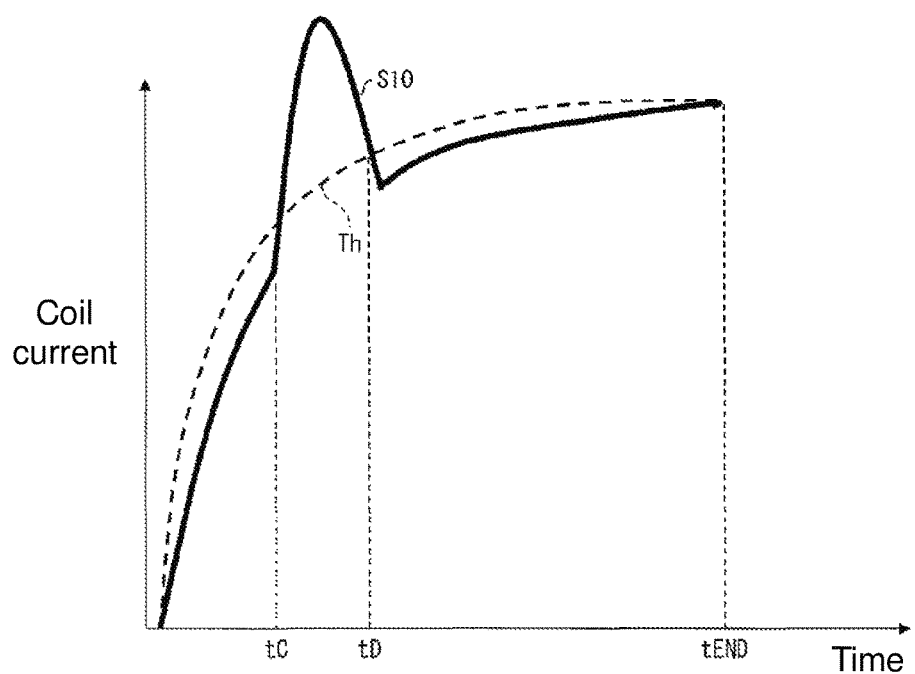
FIG. 25 is a waveform chart illustrating a second method for detecting the occurrence of the welding on the basis of the detection transient response signal in which the threshold and the noise are superposed on each other.
Figure 26:
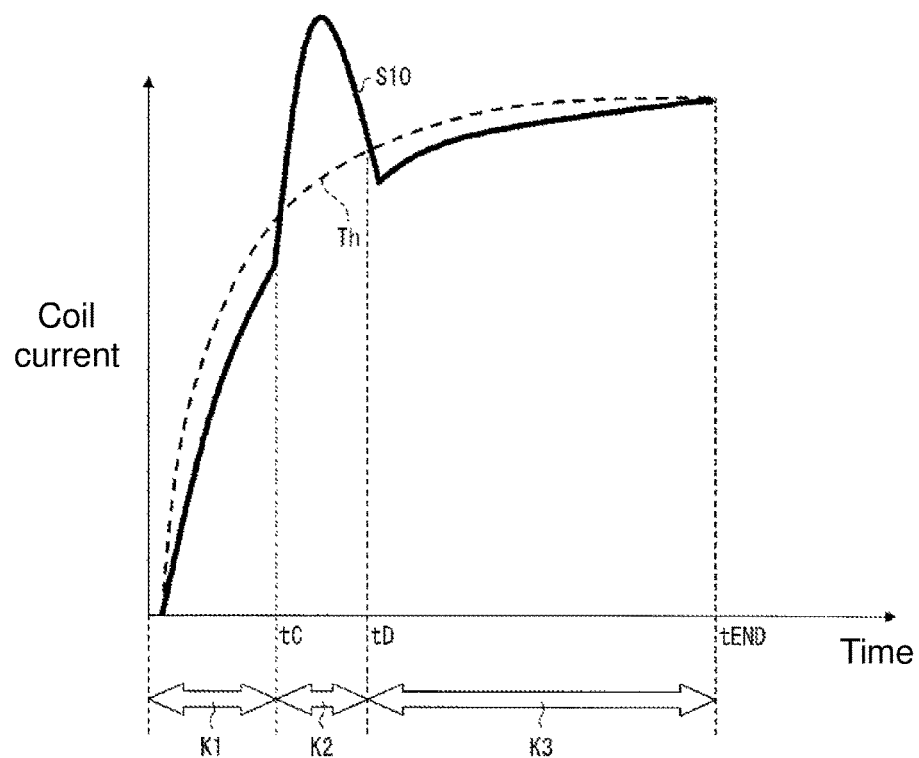
FIG. 26 is a waveform chart illustrating a third method for detecting the occurrence of the welding on the basis of the detection transient response signal in which the threshold and the noise are superposed on each other.

In the configurations of FIGS. 25 and 26, the false determination is hardly made even if the detection transient response signal S10 exceeds the threshold Th while the noise is superposed on the detection transient response signal S10.

FIG. 25 is a waveform chart illustrating a second method for detecting the occurrence of the welding on the basis of the detection transient response signal S10 in which the threshold Th and the noise are superposed on each other. The control circuit 5 determines that the movable contact 9 is separated from the fixed contact 10 when a value in which the integrated value, in which the difference between the threshold Th and the detection transient response signal S10 is integrated from a clock time 0 to the clock time tC, and the integrated value, in which the difference between the threshold Th and the detection transient response signal S10 is integrated from the clock time tD to the clock time tEND, are subtracted from the integrated value, in which the difference between the detection transient response signal S10 and the threshold Th is integrated from a clock time tC to a clock time tD, is greater than or equal to zero. When the value is negative, the control circuit 5 determines that the movable contact 9 is attracted to the fixed contact 10.

FIG. 26 is a waveform chart illustrating a third method for detecting the occurrence of the welding on the basis of the detection transient response signal S10 in which the threshold Th and the noise are superposed on each other. The control circuit 5 determines that the movable contact 9 is separated from the fixed contact 10 when a value in which a time width K1, in which the threshold Th is greater than or equal to the detection transient response signal S10 from the clock time 0 to the clock time tC, and a time axis K3, in which the threshold Th is greater than or equal to the detection transient response signal S10 from the clock time tD to the clock time tEND, are subtracted from a time width K2, in which the detection transient response signal S10 is greater than or equal to the threshold Th from the clock time tC to the clock time tD, is greater than or equal to zero. When the value is negative, the control circuit 5 determines that the movable contact 9 is attracted to the fixed contact 10.

In the configuration of FIG. 26, because the determination is made using the time width, the false determination is hardly made for a large peak of the noise.

(Frequency Range of Pulse Signal)

The frequency of the pulse signal applied to the transistor TR1 is set higher such that the pulse signal has the period sufficiently shorter than the time necessary for the transient response of the transient response signal. The AC component of the coil current increases with decreasing pulse frequency. On the other hand, as the frequency of the pulse signal increases, the AC component of the coil current decreases, and only the transient response signal is observed.

An upper limit of the frequency of the pulse signal depends on performance of the switching element.

Because a switching loss of the transistor TR1 decreases with decreasing frequency of the pulse signal, the frequency of the pulse signal may be changed between a case where the electromagnetic relay is held in the power saving mode and a case where the transient response signal is measured.

Additionally, for example, the AC component of the coil current can be decreased by such design means that a low-pass filter is provided between the current detection resistor R1 and the terminal A/D of the control circuit 5, or that software filtering such as FIR is performed. Therefore, the pulse frequency is decided in consideration of a balance between cost and the effect within a design range.

(Effect)

As described above, in the first embodiment, the transient response signal in the separated state and the transient response signal in the attracted state are measured with respect to the identical electromagnetic relay to set the threshold for the determination of the attraction. Therefore, the threshold can be set in accordance with the individual of the electromagnetic relay. Resultantly, even if the inductance of the excitation coil of the electromagnetic relay has the individual difference (difference in magnitude), the occurrence of the welding of the movable contact can correctly be detected.

Second Embodiment (Influence of Temperature Change)

In the separation transient response signal and attraction transient response signal of the first embodiment, when the ambient temperature of the electromagnetic relay rises, or when a time elapses since the electromagnetic relay is operated, the excitation coil of the electromagnetic relay is heated and the resistance value of the excitation coil increases. Therefore, the time constant decreases and the transient response signal becomes faster. Thus, the transient response signal changes when a temperature at the excitation coil of the electromagnetic relay changes.

In the welding detection system of the first embodiment, sometimes an interval exists between timing (STEP 2) of measuring the separation transient response signal after the turn-on of the power supply PW (STEP 1 (FIG. 4)) and timing (STEP 5) of measuring the attraction transient response signal after the operation of the electromagnetic relay (STEP 3), and possibly the temperature changes at the interval. Accordingly, possibly a temperature (STEP 2) in timing of measuring the separation transient response signal, a temperature (STEP 5) in timing of measuring the attraction transient response signal, and a temperature (STEP 8) in timing of measuring the detection transient response signal differ from one another. In this case, a detection margin is reduced during the detection of the occurrence of the welding, and there is room for improvement on the detection margin.

In order to improve the detection margin, it is considered that the separation transient response signal and the attraction transient response signal are measured while a temperature difference is eliminated, and that the threshold is set. In consideration of an operation variation until the operation of the electromagnetic relay 2 since the turn-on of the power supply PW, the time difference between the timing of measuring the separation transient response signal and the timing of measuring the attraction transient response signal occurs hardly, because the welding detection system does not wait for the input of the external signal (not illustrated) in a case where the electromagnetic relay 2 is automatically operated by the turn-on of the power supply PW. Therefore, the problem due to the temperature difference occurs hardly. However, because possibly the waiting for the input of the external signal over a prolonged period of time in a case where the electromagnetic relay 2 is operated in response to the external signal (on-signal), there is a risk of the occurrence of the time difference between the timing of measuring the separation transient response signal and the timing of measuring the attraction transient response signal.

(Repetitive Measurement of Separation Transient Response Signal S2)

Figure 27:
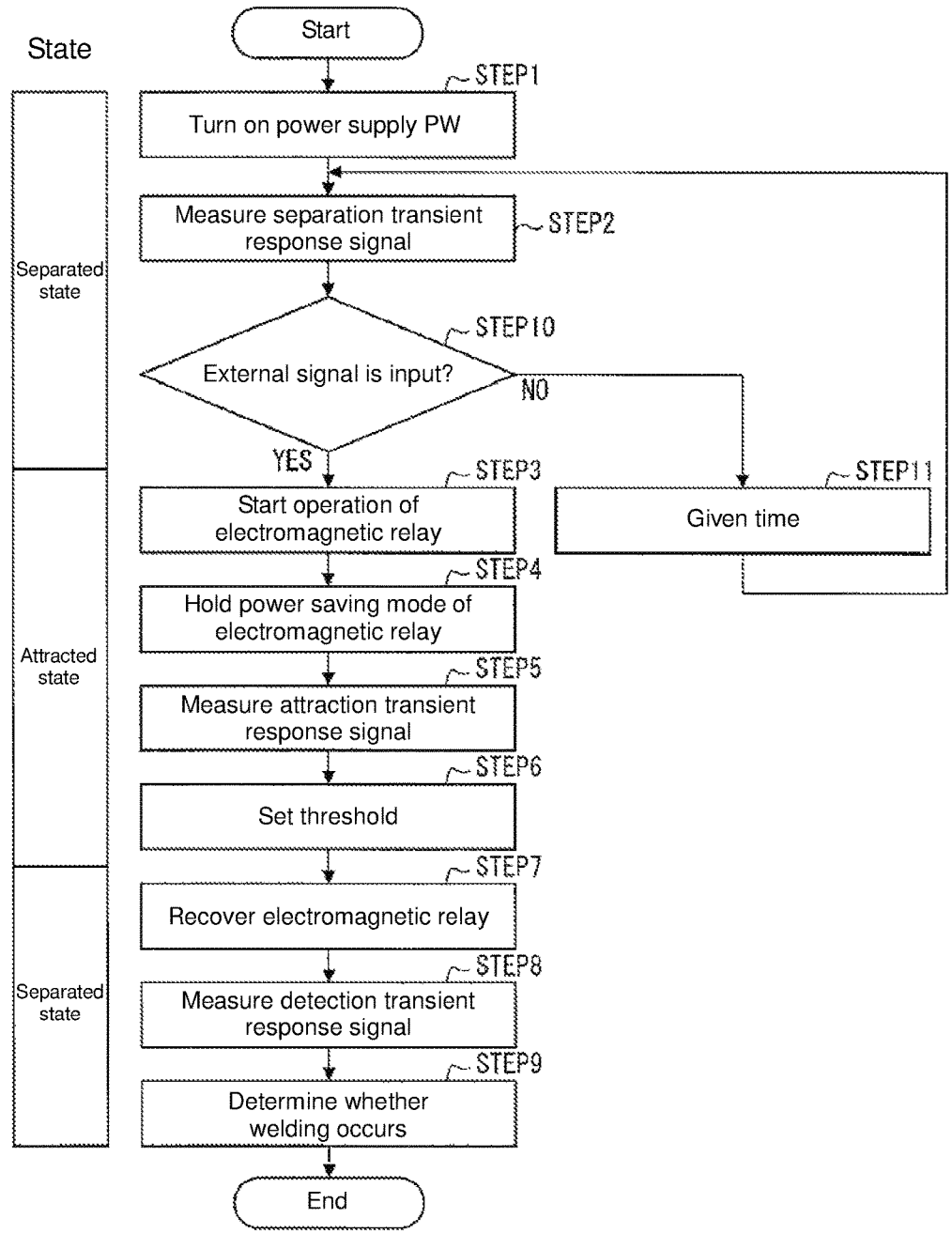
FIG. 27 is a flowchart illustrating a first operation of a welding detection system according to a second embodiment.
Figure 28:
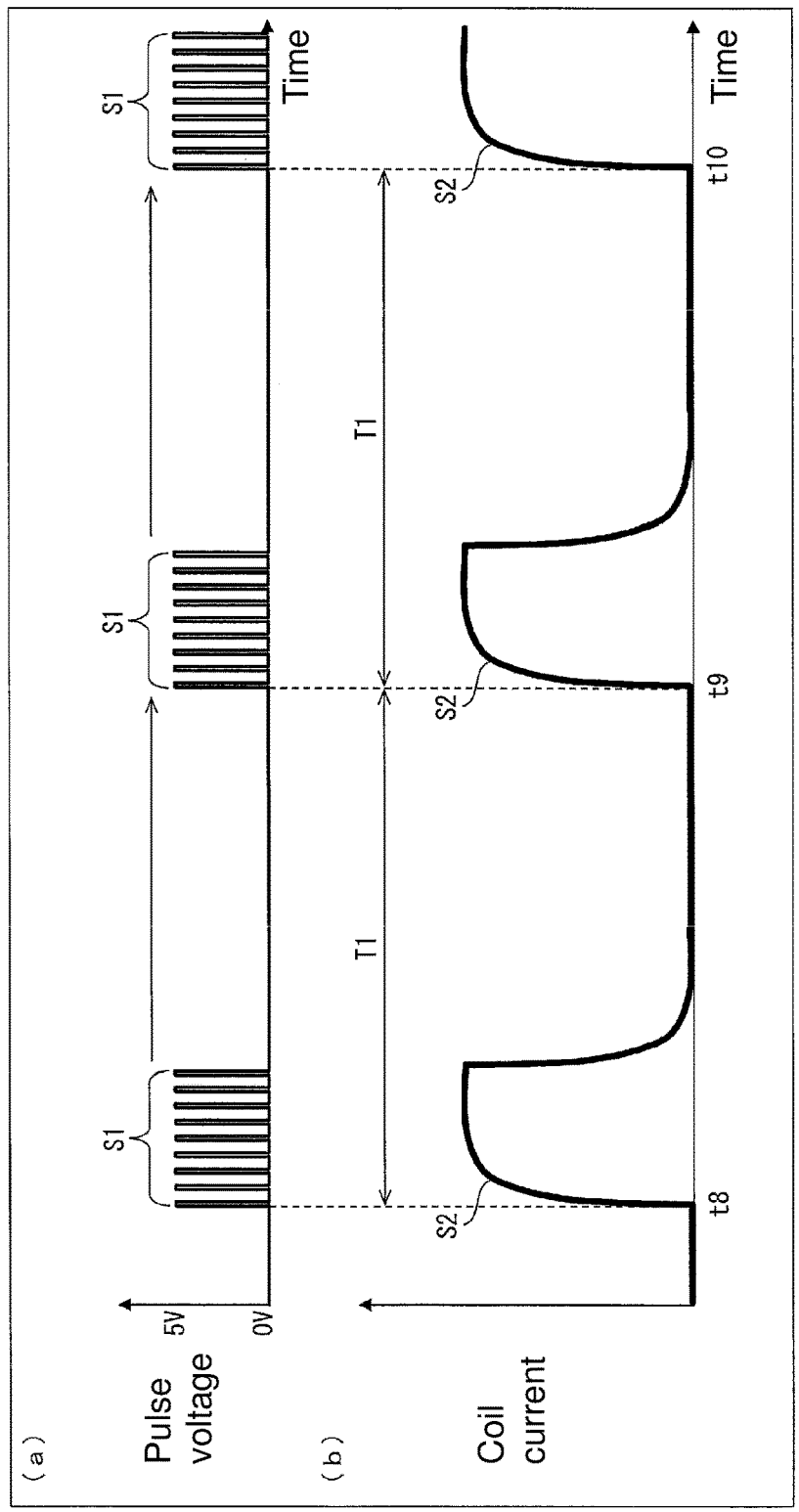
FIG. 28(a) is a waveform chart illustrating the separation pulse signal associated with the welding detection system.
FIG. 28(b) is a waveform chart illustrating the separation transient response signal generated on the basis of the separation pulse signal.

FIG. 27 is a flowchart illustrating a first operation of a welding detection system 1 according to a second embodiment. FIG. 28(a) is a waveform chart illustrating the separation pulse signal S1 associated with the welding detection system 1, and FIG. 28(b) is a waveform chart illustrating the separation transient response signal (first transient response signal) S2 generated on the basis of the separation pulse signal S1. A welding detection system 1 of the second embodiment has a configuration similar to the welding detection system 1 of the first embodiment. The welding detection system 1 of the second embodiment also has the configuration similar to the welding detection system 1 of the first embodiment.

Because the timing of operating the electromagnetic relay 2 is unknown when the electromagnetic relay 2 is operated in response to the external signal, the separation transient response signal S2 is measured in each predetermined period of time T1 (for example, 1 minute) to deal with the change in temperature.

The power supply PW of the welding detection circuit 4 is turned on while the movable contact 9 is separated from the fixed contact 10 (STEP 1). The control circuit 5 applies the separation pulse signal S1 to the transistor TR1 at a clock time t8. Therefore, the separation transient response signal S2 of the coil current is input to the control circuit 5 (STEP 2).

Then, the control circuit 5 determines whether the external signal is input (STEP 10). When determining that the external signal is not input (NO in STEP 10), the control circuit 5 waits until a given time T1 elapses (STEP 11), and returns to STEP 2.

When determining that the external signal is input (YES in STEP 10), the control circuit 5 supplies the attraction signal S0 to the transistor TR1, and the movable contact 9 is attracted to the fixed contact 10 to operate the electromagnetic relay 2 (STEP 3). The occurrence of the welding is determined in the similar way to the operation (STEPS 4 to 9) in FIG. 4.

Thus, the temperature difference between the temperature during the measurement of the separation transient response signal S2 and the temperature during the measurement of the attraction transient response signal S8 can be eliminated when the separation transient response signal S2 is measured every given time to update the separation transient response signal S2.

(Measurement of Separation Transient Response Signal S2 after External Signal Reception)

Figure 29:
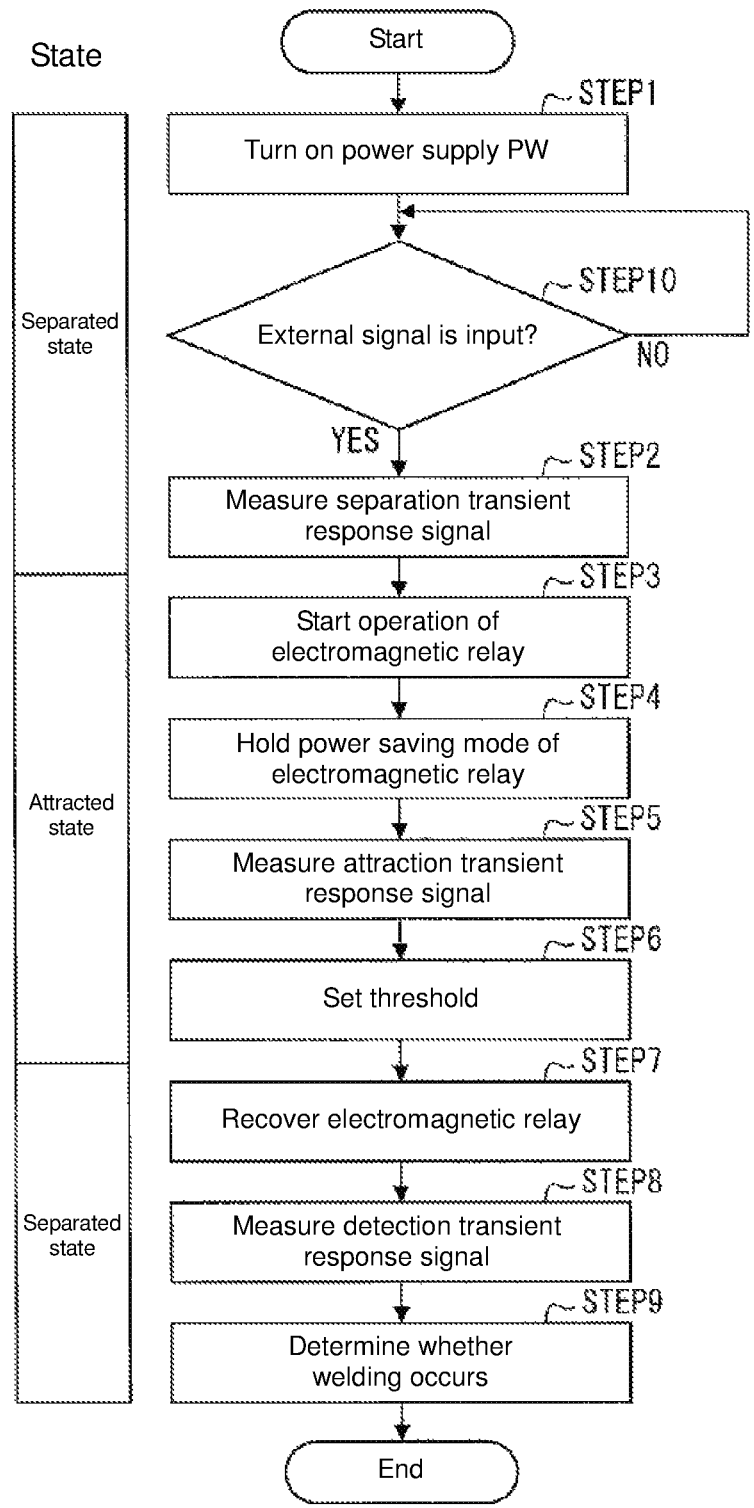
FIG. 29 is a flowchart illustrating a second operation of the welding detection system.
Figure 30:
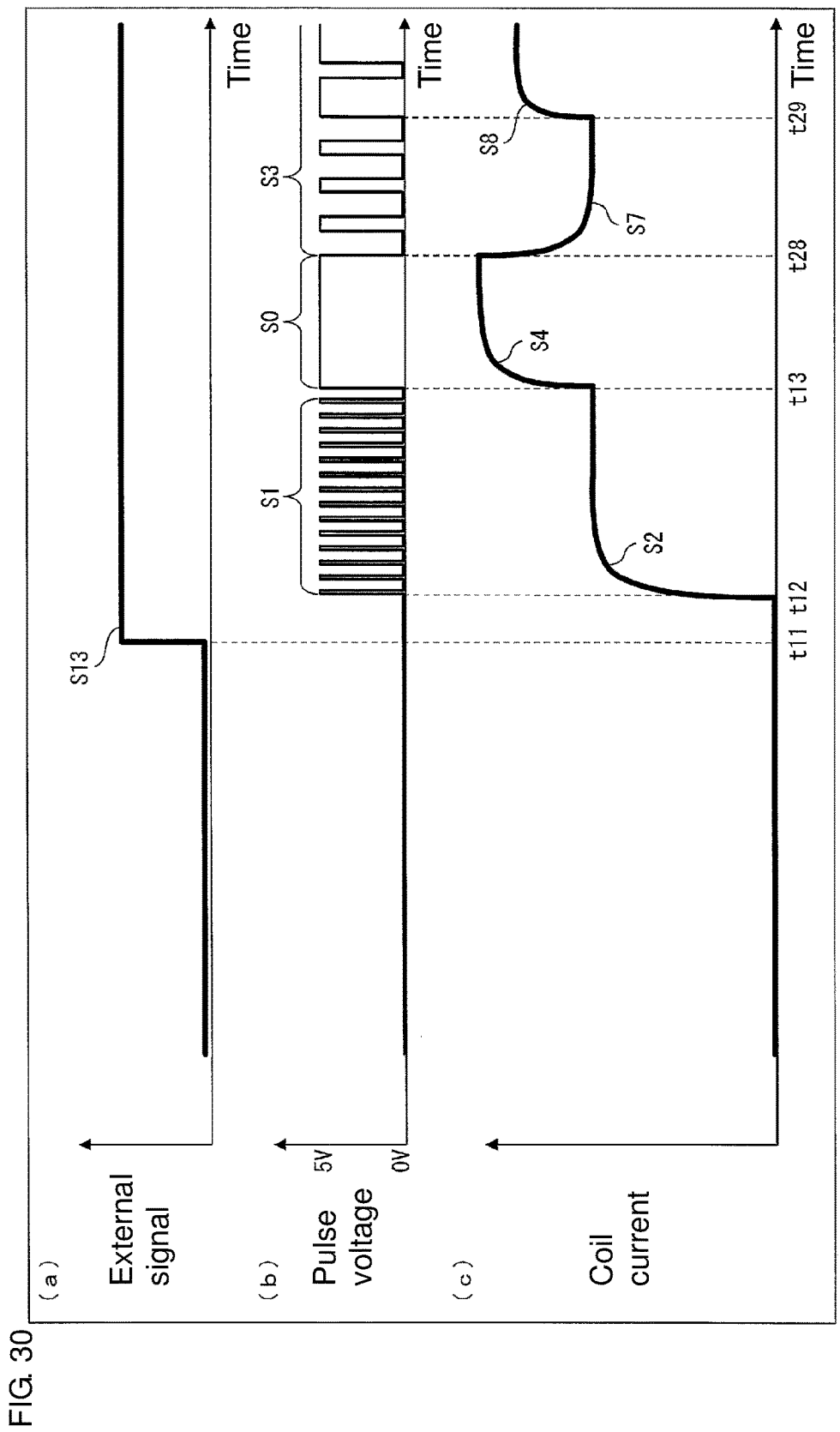
FIG. 30(a) is a waveform chart illustrating an external on-signal in the second operation.
FIG. 30(b) is a waveform chart illustrating the separation pulse signal and the attraction signals in the second operation.
FIG. 30(c) is a waveform chart illustrating the separation transient response signal and the attraction transient response signal in the second operation.

FIG. 29 is a flowchart illustrating a second operation of the welding detection system 1. FIG. 30(a) is a waveform chart illustrating an external signal S13 in the second operation, FIG. 30(b) is a waveform chart illustrating the separation pulse signal S1, the attraction signal S0, and the attraction pulse signal S3 in the second operation, and FIG. 30(c) is a waveform chart illustrating the separation transient response signal (first transient response signal) S2 and the transient response signal S4 in the second operation.

In a case where a reaction time until the operation of the electromagnetic relay 2 since reception of the external signal is prolonged by a time necessary for the measurement of the transient response signal (about 10 msec to about 1 sec), the separation transient response signal S2 is measured after the reception of the external signal, and the electromagnetic relay 2 may be operated. This is because the temperature difference between the time necessary for the measurement of the separation transient response signal S2 and the time necessary for the measurement of the attraction transient response signal S8 can be shortened to eliminate the temperature difference between the temperature during the measurement of the separation transient response signal S2 and the temperature during the measurement of the attraction transient response signal S8.

The power supply PW of the welding detection circuit 4 is turned on while the movable contact 9 is separated from the fixed contact 10 (STEP 1). Then, the control circuit 5 determines whether the external signal is input (STEP 10). When determining that the external signal is not input (NO in STEP 10), the control circuit 5 returns to STEP 10.

When the external signal S13 is input to the control circuit 5 at a clock time t11, the control circuit 5 determines that the external signal is input (YES in STEP 10), and applies the separation pulse signal S1 to the transistor TR1 at a clock time t12. Therefore, the separation transient response signal S2 of the coil current is input to the control circuit 5 (STEP 2).

The movable contact 9 is attracted to the fixed contact 10 to operate the electromagnetic relay 2 when the control circuit 5 supplies the attraction signal S0 to the transistor TR1 at a clock time t13 (STEP 3). When the control circuit 5 supplies the attraction pulse signal S3 to hold the movable contact 9 in the power saving mode at a clock time t28, the attraction transient response signal S7 of the coil current is supplied to the control circuit 5 (STEP 4). When the attraction pulse signal S3 is supplied to increase the duty at a clock time t29, the control circuit 5 measures the attraction transient response signal S8 at a rising edge of the coil current (STEP 5). The occurrence of the welding is determined in the similar way to the operation (STEPS 6 to 9) in FIG. 4.

Thus, the temperature difference between the temperature during the measurement of the separation transient response signal S2 and the temperature during the measurement of the attraction transient response signal S8 can be eliminated even if the separation transient response signal S2 is measured after the reception of the external signal to operate the electromagnetic relay 2.

(Repetitive Measurement of Attraction Transient Response Signals S8A to S8C)

Figure 31:
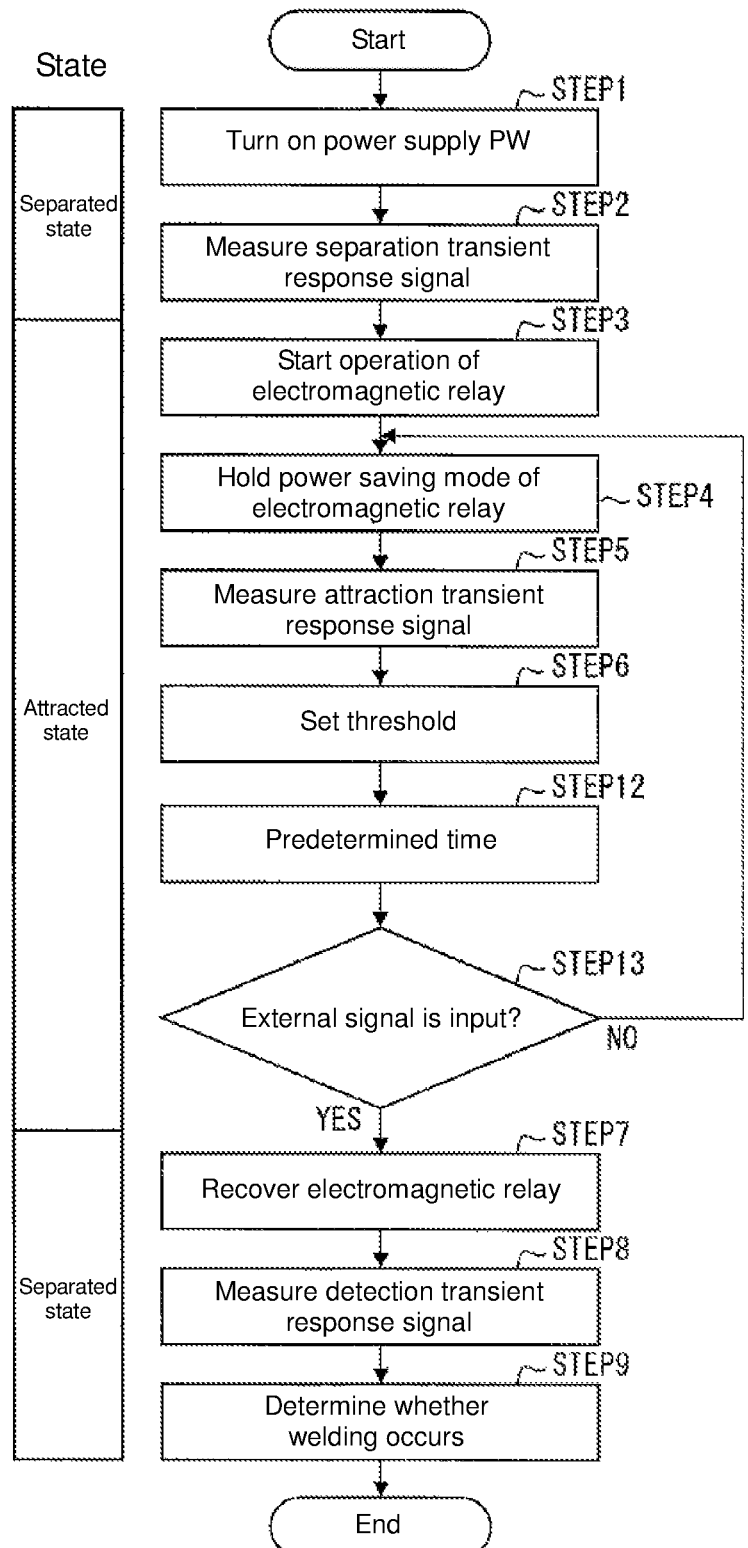
FIG. 31 is a flowchart illustrating a third operation of the welding detection system.
Figure 32:
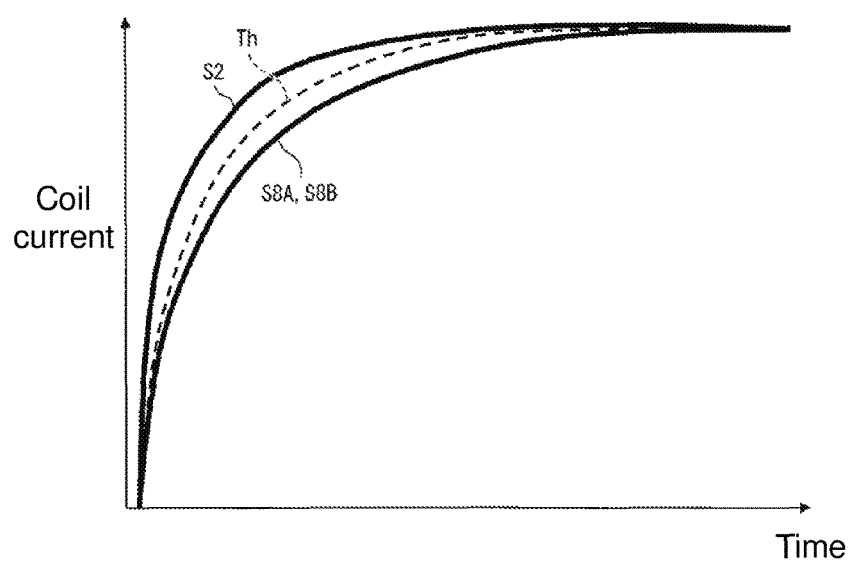
FIG. 32 is a waveform chart illustrating a method for updating the threshold in the third operation.
Figure 33:
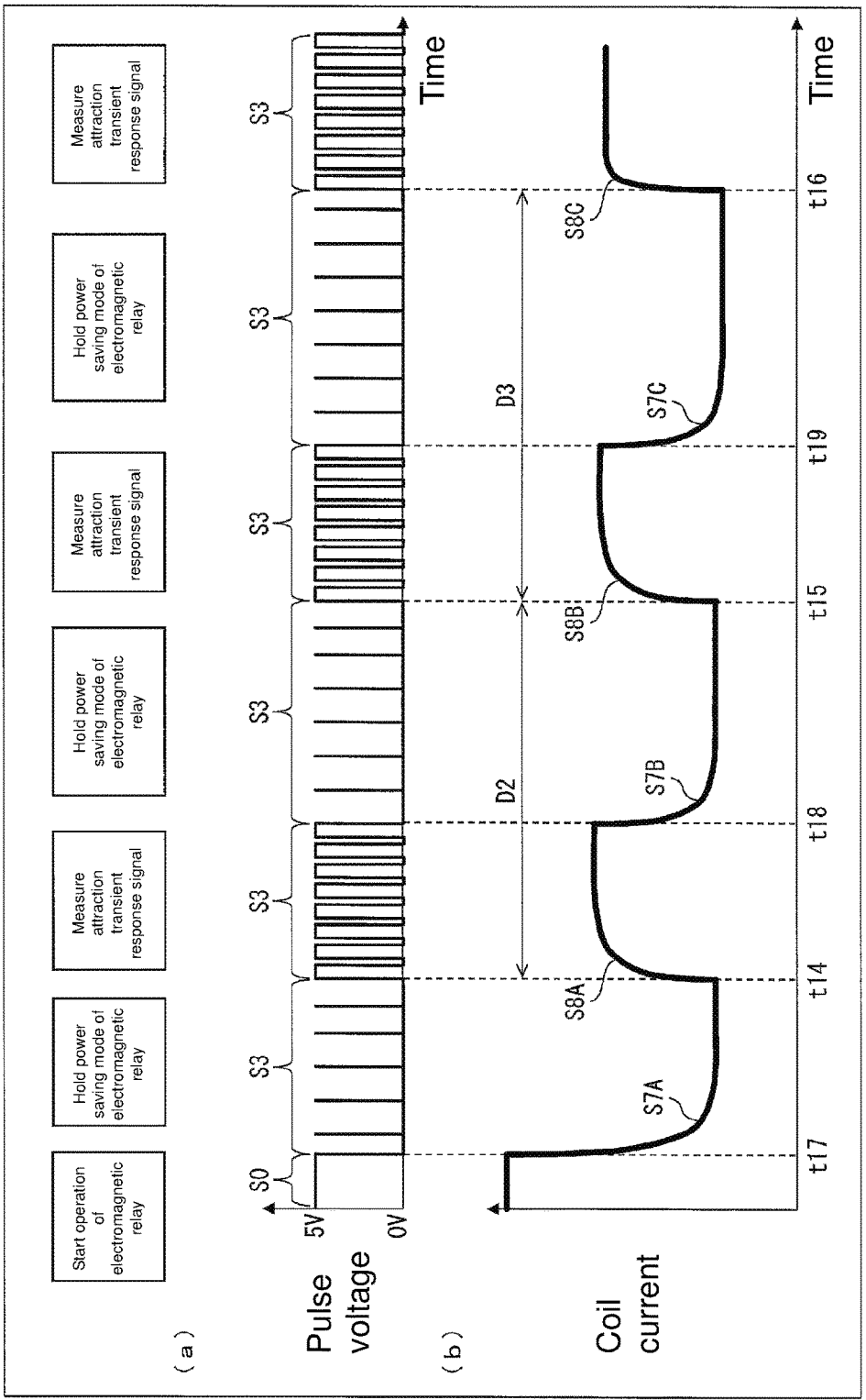
FIG. 33(a) is a waveform chart illustrating the attraction signal in the third operation.
FIG. 33(b) is a waveform chart illustrating the attraction transient response signals in the third operation.

FIG. 31 is a flowchart illustrating a third operation of the welding detection system 1. FIG. 32 is a waveform chart illustrating a method for updating the threshold in the third operation. FIG. 33($a$) is a waveform chart illustrating the attraction pulse signal S3 in the third operation, and FIG. 33($b$) is a waveform chart illustrating the attraction transient response signals (second transient response signal) S8A to S8C in the third operation.

Sometimes a long interval exists between the measurement of the attraction transient response signal and the measurement of the detection transient response signal (for example, several hours). In such cases, the attraction transient response signal is also measured every predetermined time to update the threshold in order that the attraction transient response signal and the detection transient response signal are measured while the temperature difference between the time necessary for the measurement of the attraction transient response signal and the time necessary for the measurement of the detection transient response signal is eliminated.

The power supply PW of the welding detection circuit 4 is turned on while the movable contact 9 is separated from the fixed contact 10 (STEP 1). The control circuit 5 applies the separation pulse signal S1 to the transistor TR1. Therefore, while the movable contact 9 is separated from the fixed contact 10, the separation transient response signal S2 of a coil current passed through the excitation coil 6 is input to the control circuit 5 (STEP 2).

The movable contact 9 is attracted to the fixed contact 10 to operate the electromagnetic relay 2 when the control circuit 5 supplies the attraction signal S0 to the transistor TR1 (STEP 3). When the control circuit 5 changes the duty of the attraction signal S0 to hold the movable contact 9 in the power saving mode, the attraction transient response signal S7 of the coil current is supplied to the control circuit 5 (STEP 4). When the attraction pulse signal S3 is supplied to increase the duty at a clock time t14, the control circuit 5 measures an attraction transient response signal S8A at the rising edge of the coil current (STEP 5). The threshold Th is set between the separation transient response signal S2 and the attraction transient response signal S8A (STEP 6).

When the separation transient response signal S2 and the attraction transient response signal S8A are based on the identical individual, and when the temperature does not change, the waveform in which the attraction transient response signal S8A is subtracted from the separation transient response signal S2 is hardly changed by the individual difference of the inductance or the temperature. On the other hand, when the waveforms of the separation transient response signal S2 and attraction transient response signal S8A are individually observed, the waveform is changed by the individual difference of the inductance or the temperature. For example, the waveform varies when the identical separation transient response signals S2 are compared to each other at different temperatures, and the waveform varies when the separation transient response signals S2 of different inductors are compared to each other. Therefore, for example, the threshold Th is updated as follows.

The threshold Th is set by the following equation.

$$Th = S8A + ((S2 - S8A)/2) \quad \text{(equation 3)}$$

Then, the control circuit 5 determines whether the external signal for recovering the electromagnetic relay 2 is input (STEP 13). When determining that the external signal is not input to recover the electromagnetic relay 2 (NO in STEP 13), the control circuit 5 returns to STEP 4.

When a next attraction transient response signal S8B is measured at a clock time t15 (STEP 5), the threshold is updated (STEP 6).

The threshold Th is updated by the following equation.

$$Th = S8B + ((S2 - S8A)/2) \quad \text{(equation 4)}$$

After a predetermined time elapses (STEP 12), the determination that the external signal is not input is made (NO in STEP 13), the movable contact 9 is held in the power saving mode (STEP 4), and a next attraction transient response signal S8C is measured at a clock time t16 (STEP 5).

At this point, the threshold Th is updated by the following equation.

$$Th = S8C + ((S2 - S8A)/2) \quad \text{(equation 5)}$$

(STEP 6).

When the determination that the external signal is input to recover the electromagnetic relay 2 is made (YES in STEP 13), the control circuit 5 stops the supply of the attraction pulse signal S3 to the transistor TR1. Therefore, the movable contact 9 is separated from the fixed contact 10 and the electromagnetic relay 2 recovers (STEP 7).

When supplying the detection pulse signal S9 to the transistor TR1, the control circuit 5 measures the detection transient response signal S10 of the coil current (STEP 8). The control circuit 5 detects whether the welding occurs between the movable contact 9 and the fixed contact 10 on the basis of the detection transient response signal S10 and the threshold Th (STEP 9).

The processing in STEP 13 may be added between the pieces of processing in STEPS 4 and 5, the pieces of processing in STEPS 5 and 6, or the pieces of processing in STEPS 6 and 12.

Figure 34:
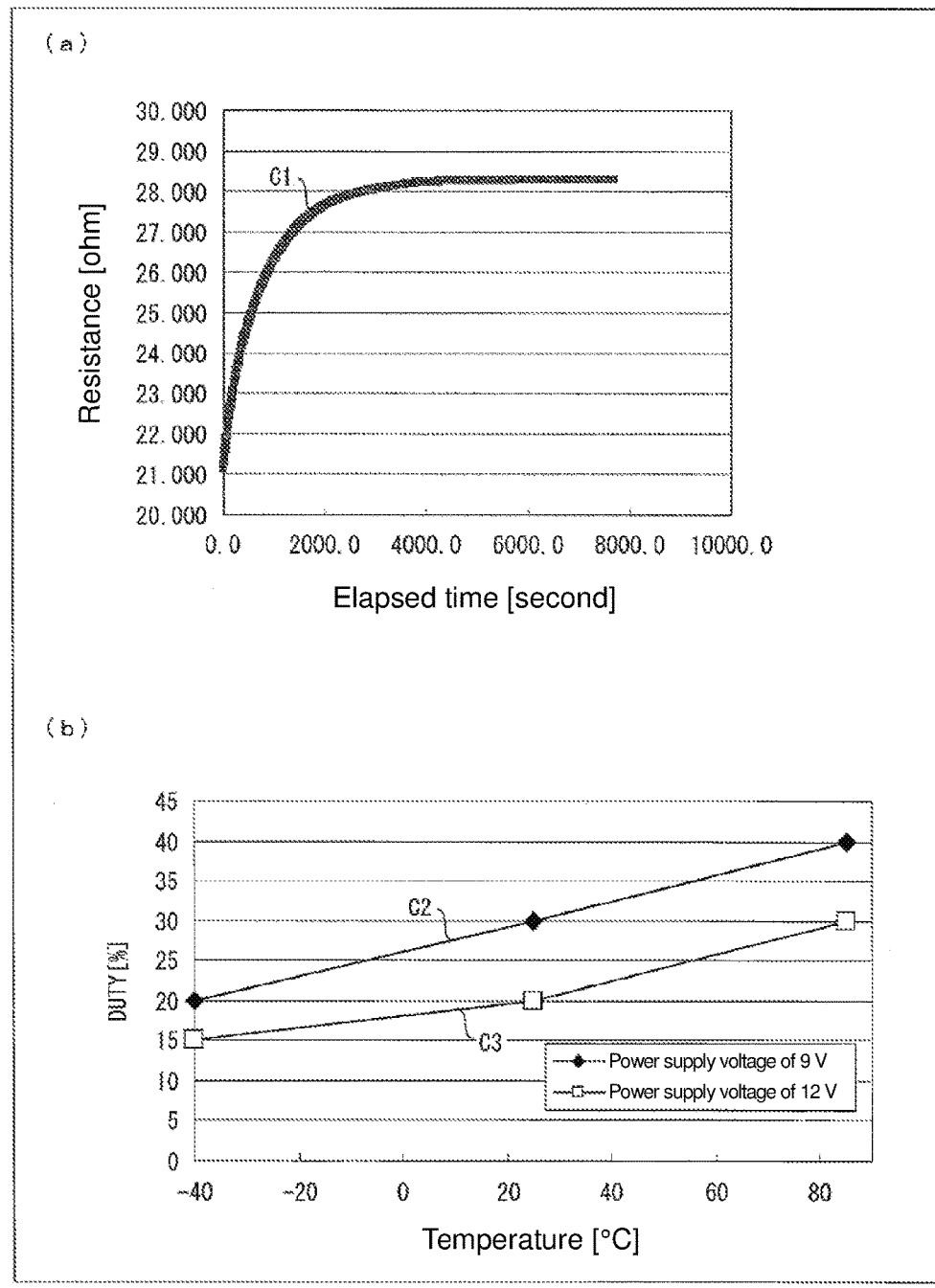
FIG. 34(a) is a graph illustrating a relationship between an operation elapsed time of the electromagnetic relay and a resistance value of the excitation coil.
FIG. 34(b) is a graph illustrating a relationship between an ambient temperature of the electromagnetic relay and a lower limit duty of an operation signal.

FIG. 34($a$) is a graph illustrating a relationship between an operation elapsed time of the electromagnetic relay 2 and a resistance value of the excitation coil 6, and FIG. 34($b$) is a graph illustrating a relationship between an ambient temperature of the electromagnetic relay 2 and a lower limit duty of the operation signal.

Measurement time intervals D2 and D3 (FIG. 33) of the attraction transient response signal may differ from each other as long as the change in transient response signal due to the temperature change falls within a permissible range with respect to the threshold. As indicated by a curve C1 in FIG. 34($a$), because a certain current is continuously passed through the excitation coil 6 during the supply of the operation signal, the excitation coil 6 is heated and the temperature rises. However, the temperature change caused by the heat generation of the excitation coil 6 becomes moderate with the lapse of time, and settles down in a steady state. Therefore, an update time interval of the threshold (the measurement time interval of the attraction transient response signal) may be lengthened together with an electric conduction elapsed time. For example, D2<D3 is set.

Constant current holding in which the duty is controlled such that the current passed through the current detection resistor R1 is kept constant can be cited as an example of a power saving mode holding method. In the method, when the power supply voltage or the temperature changes, the duty is controlled in order to keep the current passed through the excitation coil constant. When the control circuit 5 measures the power supply voltage, a factor of the duty change can be divided (the power supply voltage change and the temperature change). Therefore, the temperature change can be detected from the duty change. For example, as indicated by lines C2 and C3 in FIG. 32(b), when attention is paid to the fact that the duty of the pulse signal of the constant current holding that holds the movable contact 9 at the fixed contact 10 is changed depending on the temperature and the power supply voltage. The attraction pulse signal S3 may be supplied to update the threshold when the duty is changed by at least a given value in response to the temperature change while the movable contact 9 is held at the fixed contact 10 by the constant current.

In a case where the noise is superposed on the separation transient response signal S2 or the attraction transient response signal S8, because the noise is superposed on the threshold, an initial threshold or a previously-updated threshold may be adopted without updating the threshold.

Third Embodiment

A third embodiment solves the problem that the transient response signal varies due to the influence of the power supply voltage and the resistance value of the excitation coil. The separation transient response signal and the attraction transient response signal are influenced by the power supply voltage and the resistance value of the excitation coil. Although the problem of the variation in separation transient response signal due to the power supply voltage is described below by way of example, the problem of the variation in attraction transient response signal due to the power supply voltage can be solved similarly to the separation transient response signal, and the problem of the variation in the excitation coil due to the resistance value can similarly be solved.

(Influence of Power Supply Voltage Variation)

Figure 35:
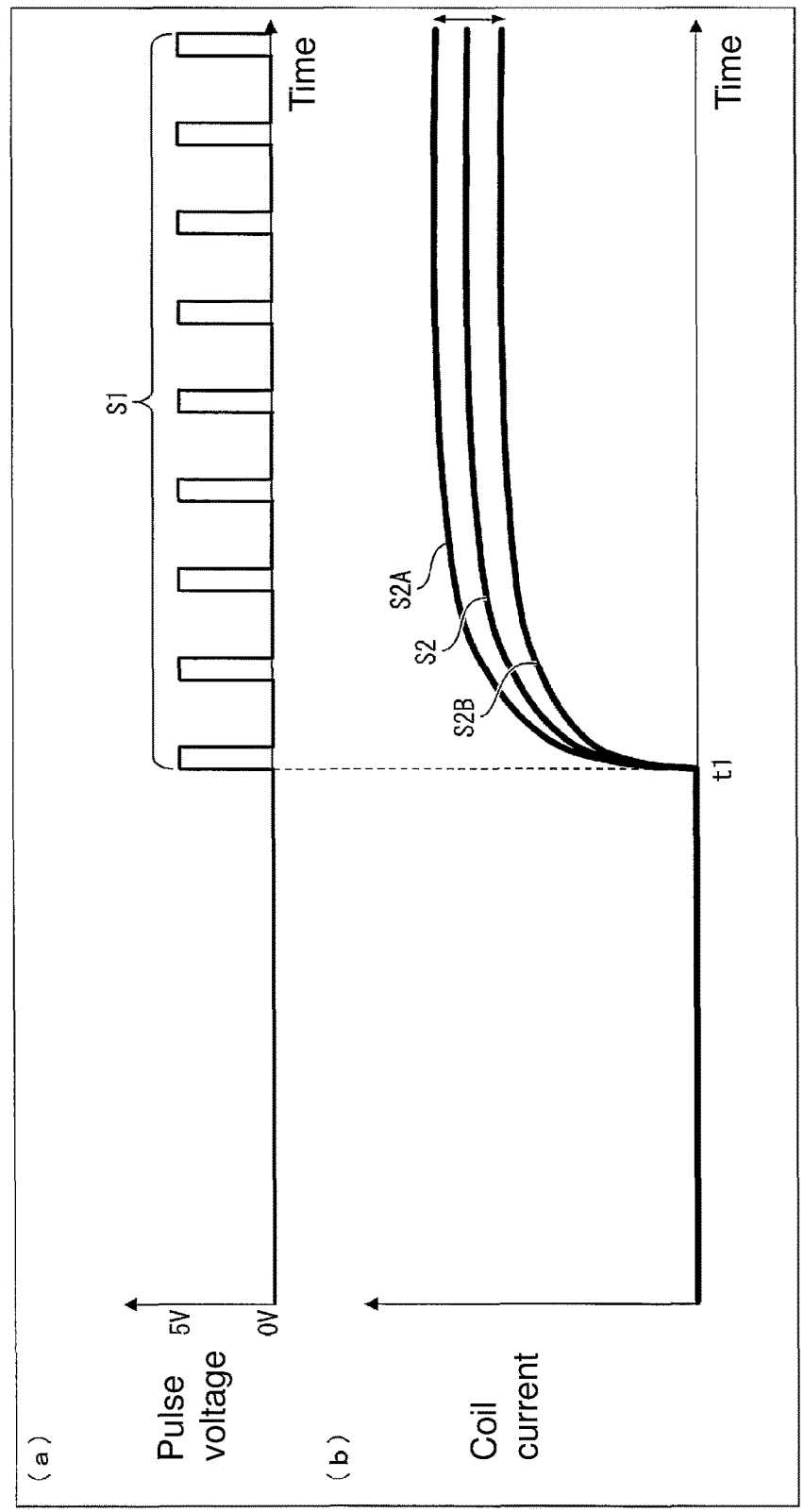
FIG. 35 is a waveform chart illustrating a problem to be solved of a welding detection system according to a third embodiment.

FIG. 35 is a waveform chart illustrating a problem to be solved of the welding detection system 1 according to a third embodiment, FIG. 35(a) is a graph illustrating the separation pulse signal S1, FIG. 35(b) is a graph illustrating a mode in which the separation transient response signal S2 on the basis of the separation pulse signal S1 changes in response to a variation in power supply voltage.

When the duty of the separation pulse signal S1 is kept constant, a separation transient response signal S2A larger than the separation transient response signal S2 is generated by the increase in voltage of the power supply PW. A separation transient response signal S2B smaller than the separation transient response signal S2 is generated by the decrease in power supply voltage. When the power supply voltage changes by 10%, the coil current passed through the excitation coil 6 changes by 10%. Because the transient response signal of the coil current also varies when the power supply voltage is varies, the detection margin is reduced during the detection of the occurrence of the welding, and there is room for improvement on the detection margin.

(Duty Control of Pulse Signal)

Figure 36:
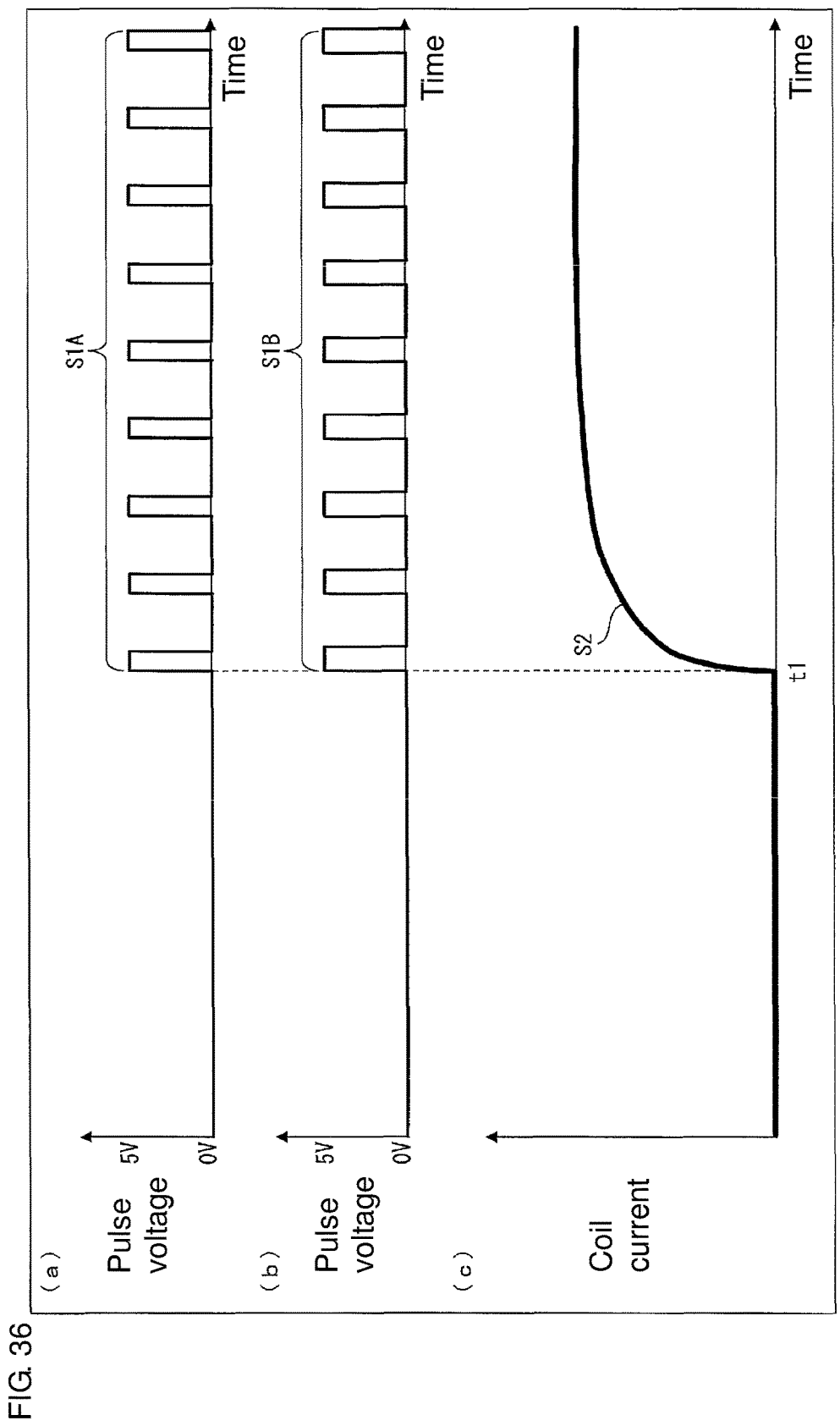
FIG. 36 is a waveform chart illustrating a method for controlling a duty of the separation pulse signal of the third embodiment.

FIG. 36 is a waveform chart illustrating a method for controlling the duty of the separation pulse signal of the third embodiment, FIG. 36(a) is a waveform chart illustrating a separation pulse signal S1A for the high power supply voltage, FIG. 36(b) is a waveform chart illustrating a separation pulse signal S1B for the low power supply voltage, FIG. 36(c) is a waveform chart illustrating the separation transient response signal S2 that is kept constant by controlling the duty of the separation pulse signal S2.

For a higher power supply voltage, the separation transient response signal S2 is generated by the separation pulse signal S1A having the smaller duty. For a lower power supply voltage, the separation transient response signal S2 is generated by the separation pulse signal S1B having the larger duty.

Figure 37:
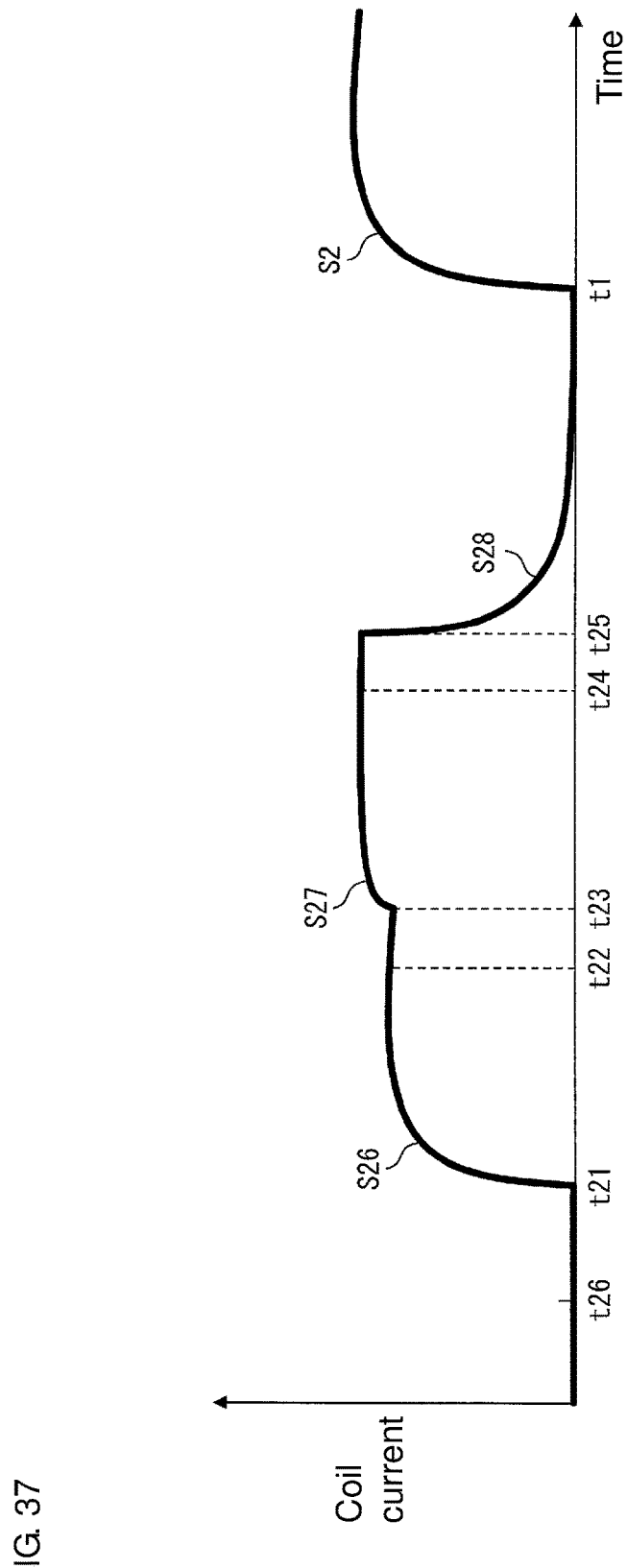
FIG. 37 is a graph illustrating a specific method for controlling the duty of the separation pulse signal.

FIG. 37 is a graph illustrating a specific method for controlling the duty of the separation pulse signal. A method for controlling the duty to keep a change width (target current) of the coil current constant from a steady state to a next steady state through a transient response will be described below. The current is measured at a clock time t26. At a clock time t21, the control circuit 5 (FIG. 2) applies the separation pulse signal to the transistor TR1 on the basis of a predetermined lower duty. A transient response signal S26 of the coil current passed through the excitation coil 6 is input from the amplifier Amp to the control circuit 5. The control circuit 5 acquires the post-transient-response current in the steady state from the amplifier Amp at a clock time t22. Then, the control circuit 5 resets the duty on the basis of the current acquired at the clock time t26 and the acquired post-transient-response current in the steady state at the clock time t22.

Then, at a clock time t23, the control circuit 5 applies the separation pulse signal to the transistor TR1 on the basis of the reset duty. Therefore, a transient response signal S27 of the coil current passed through the excitation coil 6 is input from the amplifier Amp to the control circuit 5. The control circuit 5 acquires the post-transient-response current in the steady state from the amplifier Amp at a clock time t24. The, the control circuit 5 determines whether the difference between the acquired post-transient-response current in the steady state at the clock time t24 and the current measured at the clock time t26 is suitable for the target current.

When the current in the steady state is not suitable for the target current, the control circuit 5 resets the duty, and the above procedure is repeated until the post-transient-response current in the steady state is suitable for the target current.

The change width of the coil current is kept constant from the steady state to the next steady state through the transient response is kept constant by the above method, how much the duty is changed can be recognized. As to the method for measuring the transient response signal, for example, the control circuit 5 can measure a transient response signal S28 of the coil current passed through the excitation coil 6 when applying the separation pulse signal in which the dusty is changed in a reverse direction to the transistor TR1 at a clock time t25.

For example, using the following equation, the duty of the separation pulse is set to measure the transient response signal.

duty change width=target current÷Δmeasured current×Δsetting duty

For example, at the clock time t26 the transient response is performed, it is assumed that the coil current is 0 mA when the duty is set to 0%. In a case where the transient response is measured when the coil current is changed by 100 mA, assuming that the measured current is 40 mA at the clock time t22 when the duty is set from 0% to 10% at a clock time t21, the duty change width is obtained as follows.

duty change width=(100−0)÷(40−0)×(10−0)=25%

When the coil current is 100 mA at the clock time t24 by changing the setting of the duty from 10% to 25% at the clock time t23, the difference between the current at the clock time t24 and the current at the clock time t26 becomes 100 mA, and agrees with the target current. Therefore, the transient response signal S2 may be measured when the duty is changed by 25%.

The duty of the pulse signal is controlled such that the change width of the coil current is kept constant from the steady state to the next steady state through the transient response, so that the coil current can be kept constant irrespective of the state of the variation in power supply voltage. Therefore, the variation in transient response signal of the coil current due to the variation in power supply voltage can be solved.

(Normalization of Transient Response Signal)

Figure 38:
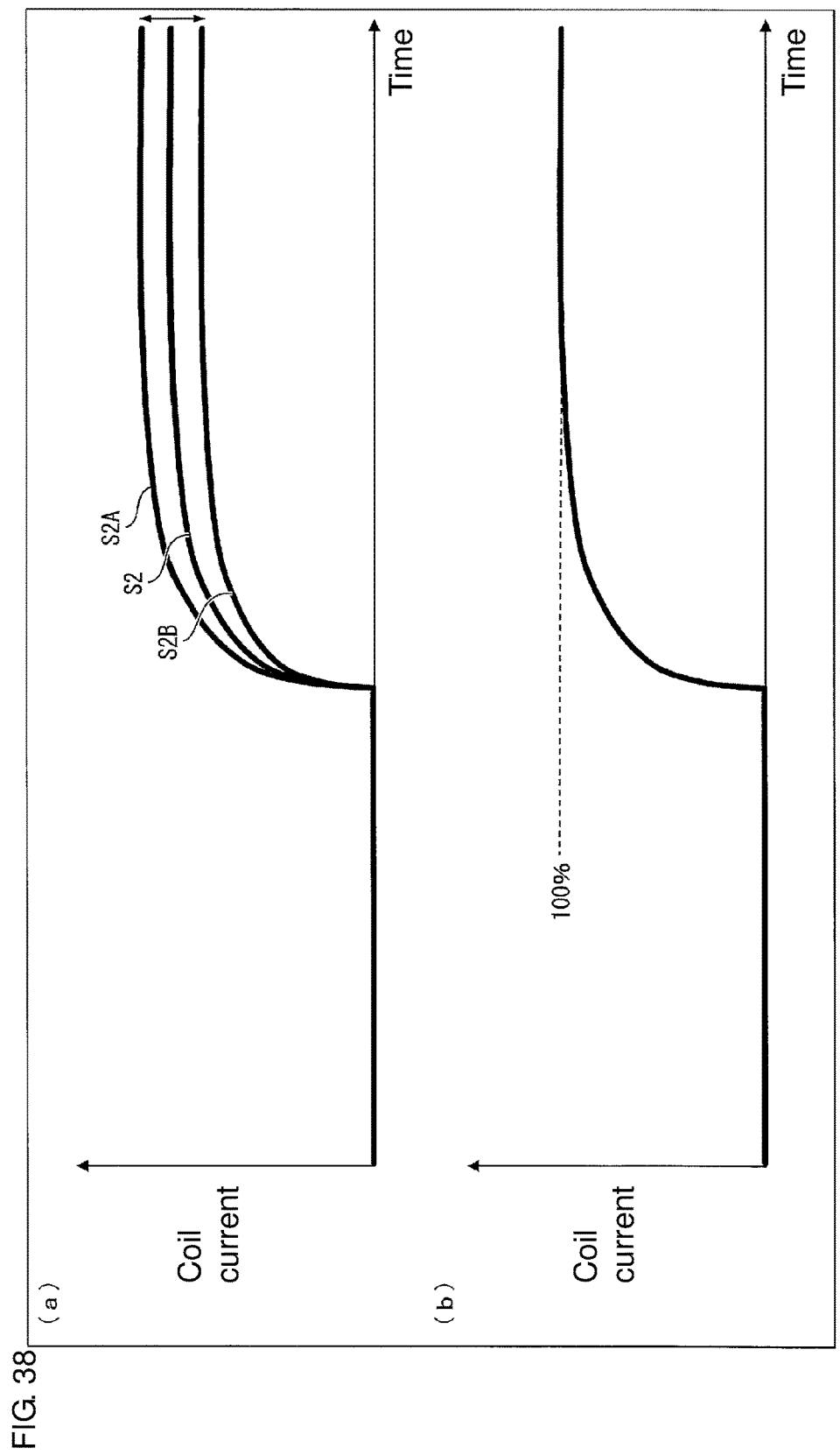
FIG. 38(a) is a graph illustrating a mode in which the separation transient response signal based on the separation pulse signal changes according to the variation in power supply voltage.
FIG. 38(b) is a graph illustrating the normalized separation transient response signal.

FIG. 38(a) is a graph illustrating a mode in which the separation transient response signal based on the separation pulse signal changes in response to the variation in power supply voltage, and FIG. 38(b) is a graph illustrating the normalized separation transient response signal.

The separation transient response signal S2A larger than the separation transient response signal S2 is generated by the increase in power supply voltage. A separation transient response signal S2B smaller than the separation transient response signal S2 is generated by the decrease in power supply voltage.

The post-transient-response current in the steady state is set to 100%, and the transient response signal of the coil current is normalized by a numerical calculation. Therefore, the variation in transient response signal of the coil current due to the variation in power supply voltage can be solved.

Fourth Embodiment (Positional Detection of Movable Contact 9)

Figure 39:
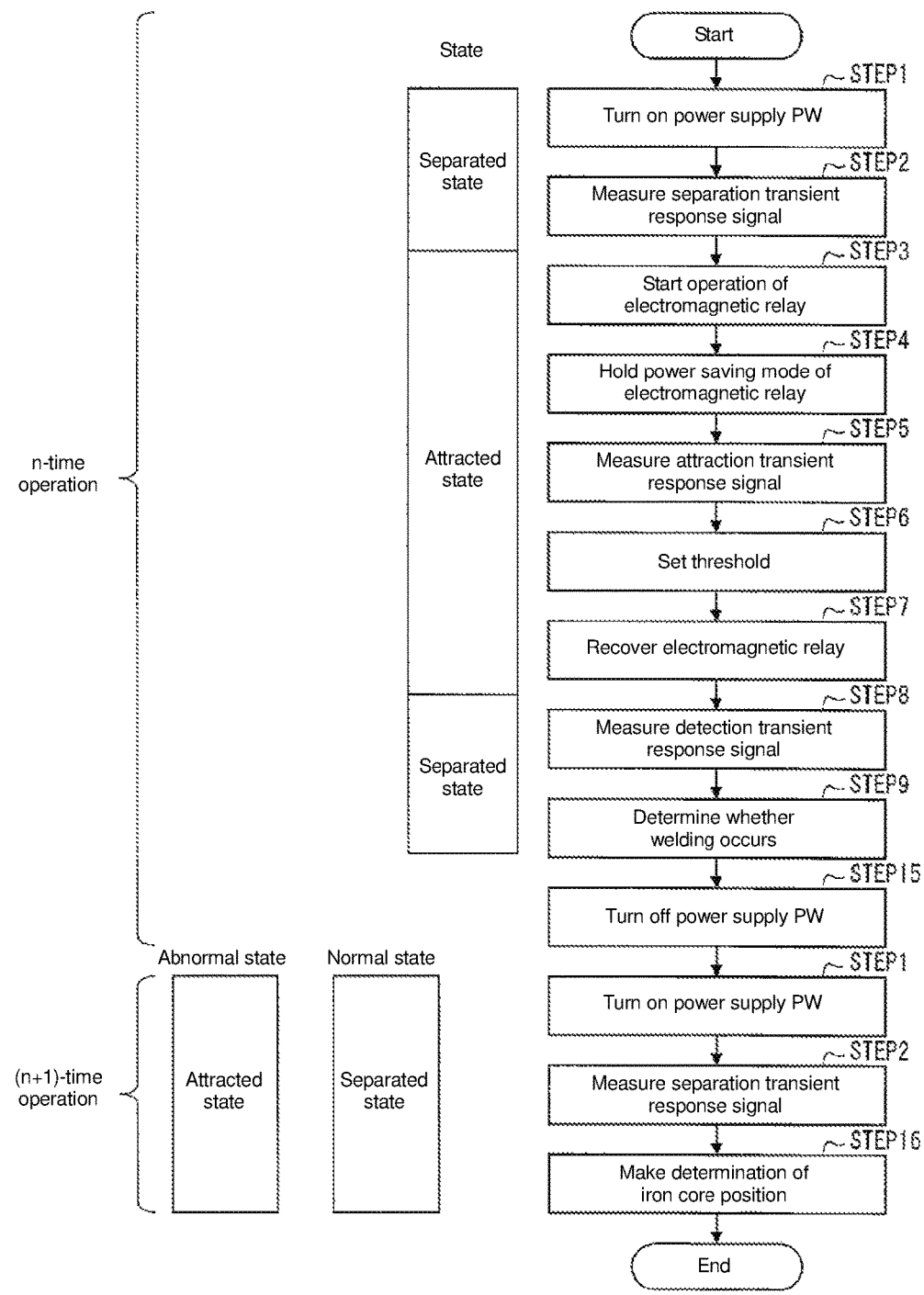
FIG. 39 is a flowchart illustrating an operation of a welding detection system according to a fourth embodiment.

FIG. 39 is a flowchart illustrating an operation of a welding detection system 1 according to a fourth embodiment. In the fourth embodiment, the position of the movable contact 9 is detected before the operation of the electromagnetic relay 2.

In the fourth embodiment, even if the surrounding environment changes, based on an nth-time threshold set based on the surrounding environment, the abnormality determination is made before an (n+1)th-time operation of the electromagnetic relay 2 For example, when the next operation is performed without maintenance (for example, replacement of the electromagnetic relay 2) even if the welding remains in the nth-time operation (the attracted state remains even if the supply of the operation signal to the electromagnetic relay 2 is stopped), the abnormal operation of the iron core is detected in the (n+1)th-time operation before the operation of the electromagnetic relay 2.

The threshold of the pre-replacement electromagnetic relay remains in the (n+1)th-time operation in which the electromagnetic relay is already replaced through the maintenance. Therefore, the previous threshold may be updated to the threshold of the new electromagnetic relay through the one-time operation, or an initial setting mode in which the previous threshold is reset to set the initial threshold may be provided.

As illustrated in FIG. 4, whether the welding of the movable contact 9 occurs is determined on the basis of the threshold based on the separation transient response signal S2 and attraction transient response signal S8 and the detection transient response signal S10 (STEPS 1 to 9). The power supply PW (FIG. 1) is turned off to end the nth-time operation of the welding detection system 1 (STEP 15).

Then, the power supply PW is turned on to start the (n+1)th-time operation (STEP 1). The control circuit 5 applies the separation pulse signal S1 to the transistor TR1. Therefore, the separation transient response signal S2 (second separation transient response signal) of the coil current passed through the excitation coil 6 is input to the control circuit 5 (STEP 2).

Then, the control circuit 5 determines whether the movable contact 9 is separated or attracted on the basis of the threshold set in STEP 6 during the nth-time operation and the separation transient response signal S2 measured in STEP 2 during the (n+1)th-time operation (STEP 16).

For example, the threshold setting of the nth-time operation may be performed before shipment of the welding detection system 1. When the welding detection system 1 is incorporated in instruments such as an electric automobile and a battery storage system, the threshold setting of the nth-time operation may be performed as an operation check In this case, the threshold can be set in consideration of the surrounding environment where the welding detection system 1 is incorporated in the instrument. The threshold can also be set in consideration of the surrounding environment when the threshold setting of the nth-time operation is performed during the maintenance including the replacement, periodic inspection, and alteration of the electromagnetic relay.

Fifth Embodiment (Malfunction Detection of Movable Contact 9)

Figure 40:
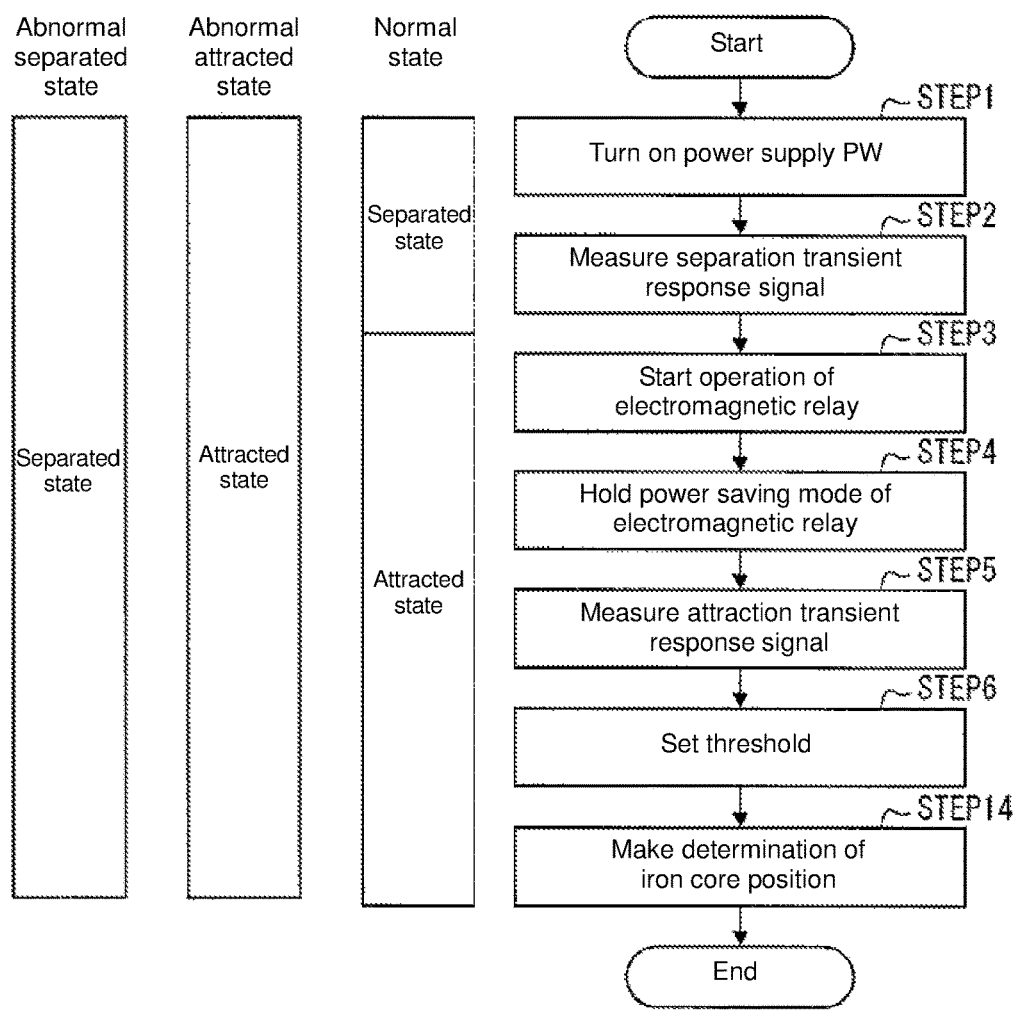
FIG. 40 is a flowchart illustrating an operation of a welding detection system according to a fifth embodiment.

FIG. 40 is a flowchart illustrating an operation of a welding detection system 1 according to a fifth embodiment.

In the first to fourth embodiments, the welding of the movable contact 9 is detected bay way of example. However, the present invention is not limited to the configuration that detects the welding. For example, the malfunction in which the movable contact 9 is not moved even if the operation signal is supplied to the electromagnetic relay 2 is detected in the fourth embodiment.

The power supply PW of the welding detection circuit 4 is turned on (STEP 1). The control circuit 5 applies the separation pulse signal S1 to the transistor TR1. Therefore, the separation transient response signal S2 of the coil current passed through the excitation coil 6 is input to the control circuit 5 (STEP 2). The control circuit 5 supplies the attraction signal S0 to the transistor TR1 in order to operate the electromagnetic relay 2 (STEP 3).

When the control circuit 5 changes the duty of the attraction signal S0 to hold the movable contact 9 in the power saving mode, the attraction transient response signal S7 of the coil current is supplied to the control circuit 5 (STEP 4). When the attraction pulse signal S3 is changed to increase the duty, the control circuit 5 measures the attraction transient response signal S8 at the rising edge of the coil current (STEP 5). Based on the separation transient response signal S2 and the attraction transient response signal S8, the threshold Th is set in order to determine the occurrence of the welding (STEP 6).

Figure 41:
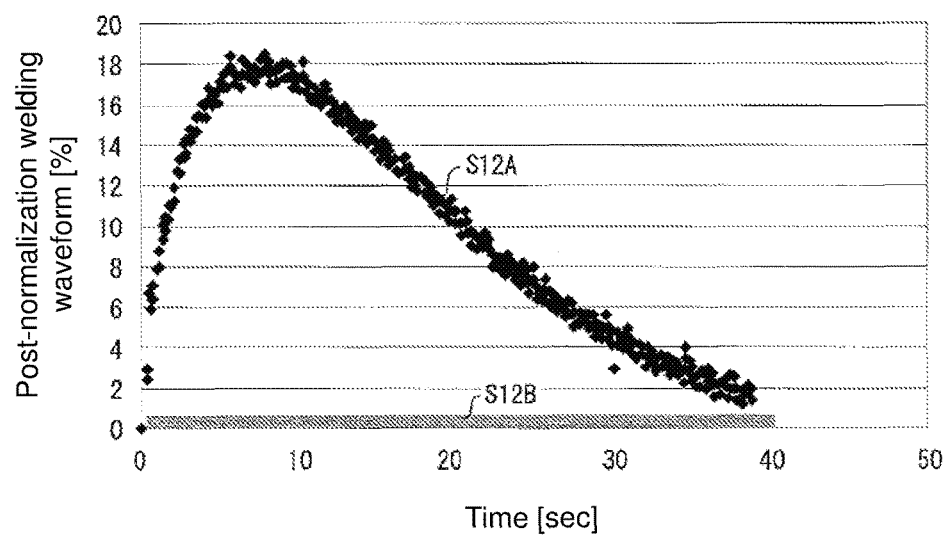
FIG. 41 is a graph illustrating a method for detecting a malfunction of the electromagnetic relay of the welding detection system.

FIG. 41 is a graph illustrating a method for detecting a malfunction of the electromagnetic relay 2 of the welding detection system 1. In a case where the maximum value of the transient response difference waveform S12A expressing the difference between the separation transient response signal S2 and the attraction transient response signal S8 is greater than or equal to a predetermined value, the determination that the movable contact 9 moves normally to be attracted is made in accordance with the supply of the operation signal to the electromagnetic relay 2. In a case where the maximum value of the transient response difference waveform S12A is less than the predetermined value, the movable contact 9 does not moves even if the operation signal is supplied to the electromagnetic relay 2, but the determination of the malfunction is made. For example, in a case where the difference is substantially zero like the transient response difference waveform S12B in FIG. 41, it is clear that the maximum value of the transient response difference waveform S12A is less than the predetermined value. Therefore, the movable contact 9 does not moves even if the operation signal is supplied to the electromagnetic relay 2, but the determination of the malfunction is made (STEP 14).

It is considered that the state in which the movable contact 9 does not move includes the abnormal attracted state (welding) in which the attraction of the movable contact 9 is continued and the abnormal separated state in which the separation of the movable contact 9 is continued. The abnormal attracted state and the abnormal separated state can be discriminated from each other on the basis of the previous threshold.

For example, the state (the separated state or the attracted state) of the movable contact 9 before STEP 3 in which the electromagnetic relay is operated can be determined by the method in FIG. 39. The operation (move or not move) of the movable contact 9 can be determined in the fifth embodiment. Therefore, the abnormal attracted state, abnormal separated state, and normal state in FIG. 40 can be discriminated from one another.

The determination that the movable contact 9 moves normally to be attracted in accordance with the supply of the operation signal to the electromagnetic relay 2 may be made in a case where the integrated value of the transient response difference waveform S12A is greater than or equal to a predetermined value, and the determination that the movable contact 9 does not move in response to the turn-on of the electromagnetic relay 2 but the malfunction occurs may be made in a case where the integrated value of the transient response difference waveform S12A is less than the predetermined value. The malfunction may be detected on the basis of the time width corresponding to the magnitude relationship between the detection transient response signal and the threshold.

Sixth Embodiment (Detection of Separation Malfunction of Movable Contact 9)

Figure 42:
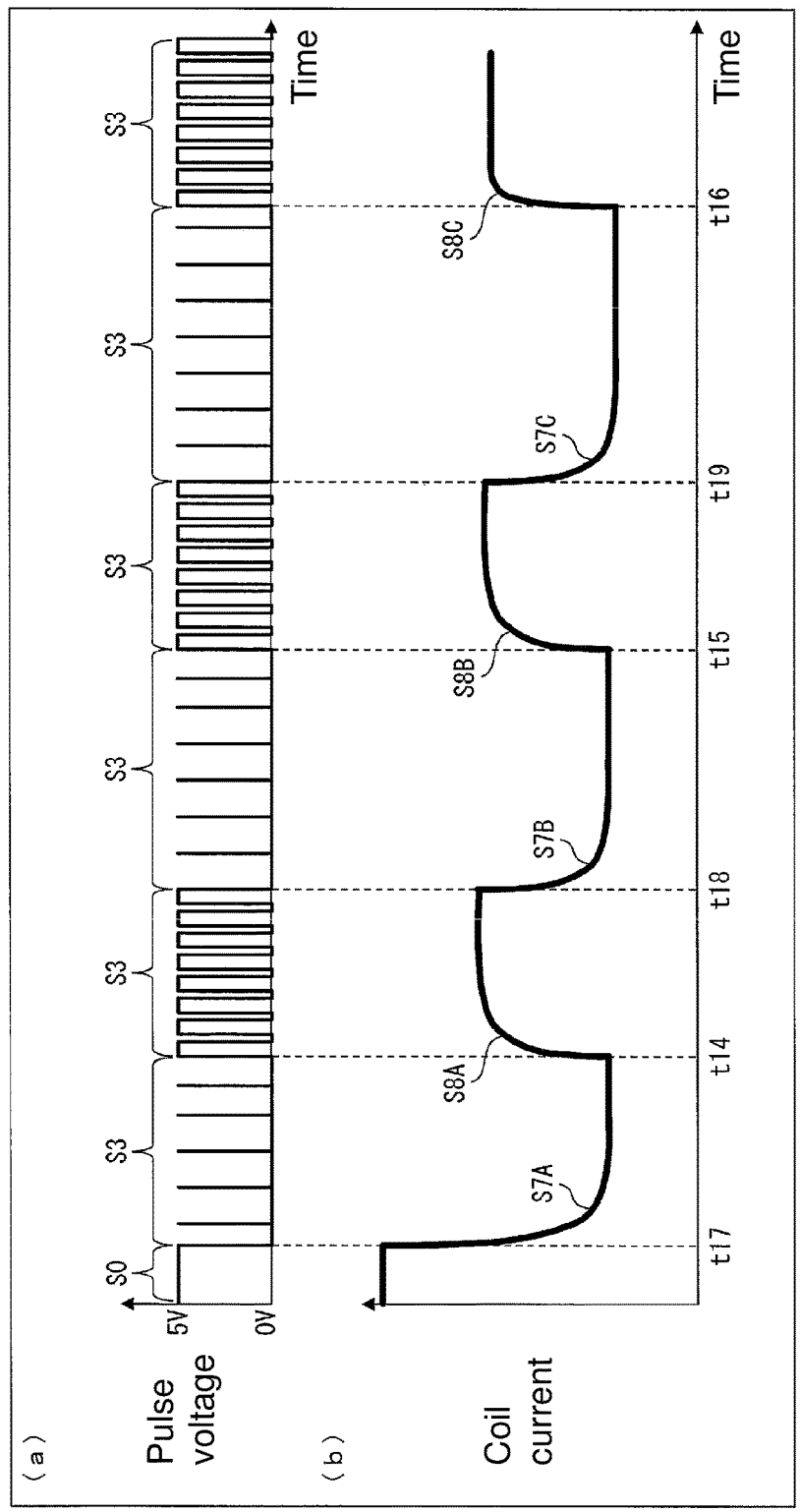
FIG. 42 is a waveform chart illustrating an operation of a welding detection system according to a sixth embodiment.
Figure 43:
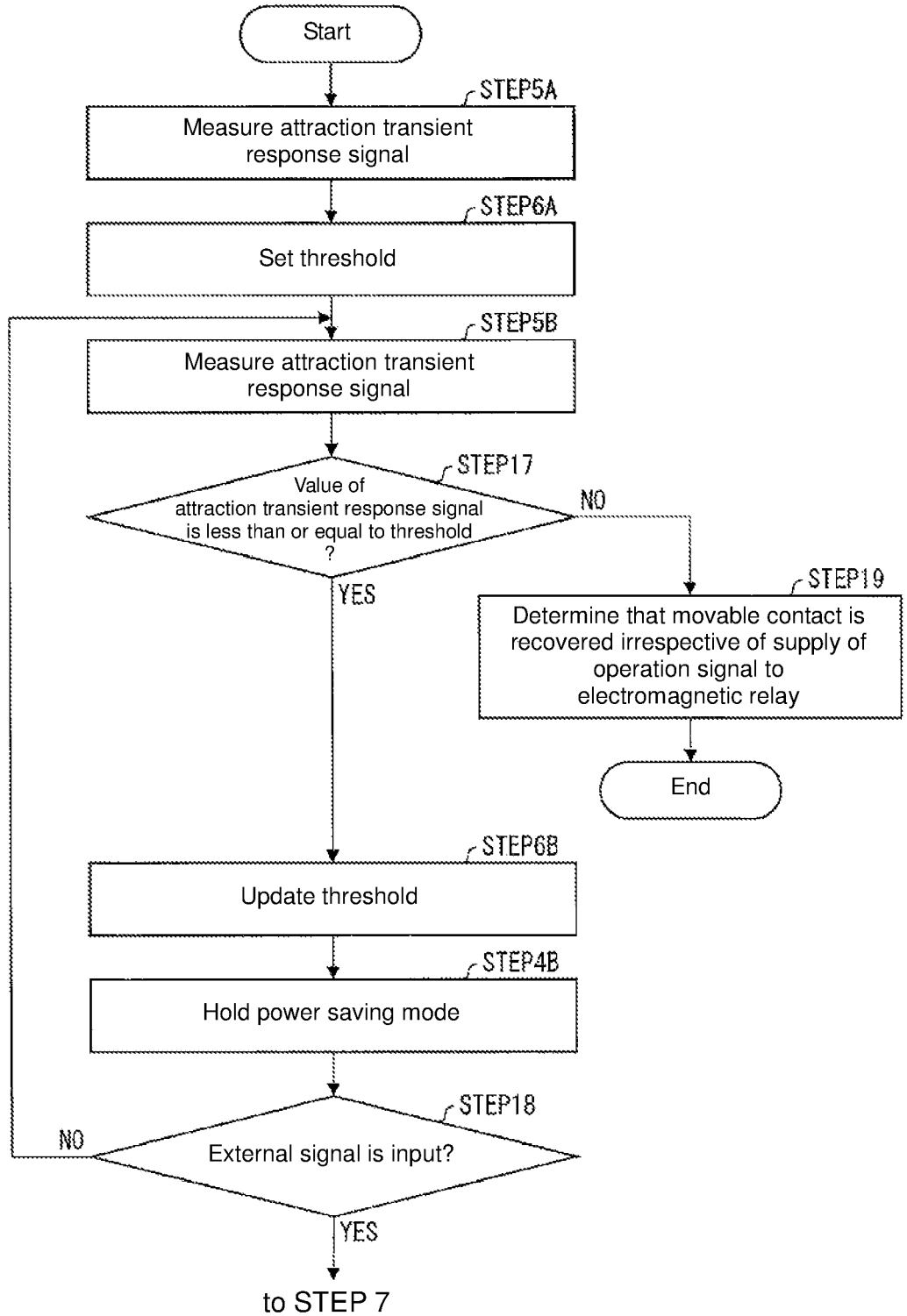
FIG. 43 is a flowchart illustrating the operation of the welding detection system of the sixth embodiment.

FIG. 42 is a waveform chart illustrating an operation of a welding detection system 1 according to a sixth embodiment, FIG. 42(a) is a waveform chart illustrating the attraction pulse signal (second detection pulse signal) S3, and FIG. 42(b) is a waveform chart illustrating the attraction transient response signals S8A to S8C. FIG. 43 is a flowchart illustrating the operation of the welding detection system 1 of the sixth embodiment.

The malfunction in which the movable contact 9 is separated from the fixed contact 10 to recover by a shock and the like irrespective of the supply of the operation signal to the electromagnetic relay 2 is detected in the sixth embodiment.

When the control circuit 5 changes the duty of the attraction signal S0 to hold the movable contact 9 in the power saving mode at a clock time t17, an attraction transient response signal S7A of the coil current is supplied to the control circuit 5. When the duty of the attraction pulse signal S3 is changed so as to increase at a clock time t14, the control circuit 5 measures an attraction transient response signal S8A (second transient response signal) at the rising edge of the coil current (STEP 5A). Based on the separation transient response signal S2 and the attraction transient response signal S8A, the threshold is set in order to determine the occurrence of the welding (STEP 6A).

At this point, the threshold Th is updated by the following equation.

$$Th=S8A+((S2-S8A)/2) \qquad \text{(equation 3)}$$

When the duty of the attraction pulse signal S3 is changed so as to recover to an original value at a clock time t18, the movable contact 9 is held in the power saving mode, and the control circuit 5 measures an attraction transient response signal S7B at the falling edge of the coil current. When the duty of the attraction pulse signal S3 is changed so as to increase at a clock time t15, the control circuit 5 measures an attraction transient response signal S8B (another second transient response signal) at the rising edge of the coil current (STEP 5B).

Then, the control circuit 5 determines whether the attraction transient response signal S8B is less than or equal to the threshold (STEP 17). When the attraction transient response signal S8B is determined to be greater than the threshold (NO in STEP 17), the control circuit 5 determines that the movable contact 9 is separated from the fixed contact 10 during the operation of the electromagnetic relay 2 (STEP 19).

When the attraction transient response signal S8B is determined to be less than or equal to the threshold (YES in STEP 17), the threshold is updated in order to detect the occurrence of the welding on the basis of the separation transient response signal S2 and the attraction transient response signal S8B (STEP 6B).

At this point, the threshold Th is updated by the following equation.

$$Th=S8B+((S2-S8A)/2) \qquad \text{(equation 4)}$$

When the duty of the attraction pulse signal S3 is changed so as to recover to the original value at a clock time t19, the movable contact 9 is held in the power saving mode, and the control circuit 5 measures an attraction transient response signal S7C at the falling edge of the coil current (STEP 4B).

Then, the control circuit 5 determines whether the external signal for recovering the electromagnetic relay 2 is received (STEP 18). When determining that the external signal is received (YES in STEP 18), the control circuit 5 goes to STEP 7 in FIG. 4. When determining that the external signal is not received (NO in STEP 18), the duty of the attraction signal S3 is changed so as to increase at a clock time t16, and the control circuit 5 measures an attraction transient response signal S8C (another second transient response signal) at the rising edge of the coil current (STEP 5B).

Then, the control circuit 5 determines whether the attraction transient response signal S8C is less than or equal to the threshold (STEP 17). When the attraction transient response signal S8C is determined to be greater than the threshold (NO in STEP 17), the control circuit 5 determines that the movable contact 9 is separated from the fixed contact 10 during the operation of the electromagnetic relay 2 (STEP 19), and the control circuit 5 ends the processing.

When the attraction transient response signal S8C is determined to be less than or equal to the threshold (YES in STEP 17), the threshold is updated in order to detect the occurrence of the welding on the basis of the separation transient response signal S2 and the attraction transient response signal S8C (STEP 6B).

At this point, the threshold Th is updated by the following equation.

$$Th = S8C + ((S2 - S8A)/2) \qquad \text{(equation 5)}$$

Then, the pieces of similar processing are repeated such that the movable contact 9 is held in the power saving mode (STEP 4B), and such that whether the external signal for recovering the electromagnetic relay 2 is received is determined (STEP 18).

The processing in STEP 18 may be added between the pieces of processing in STEPS 5B and 17, the pieces of processing in STEPS 17 and 6B, or the pieces of processing in STEPS 6B and 4B.

Seventh Embodiment (Modification of Welding Detection Circuit 4)

Figure 44:
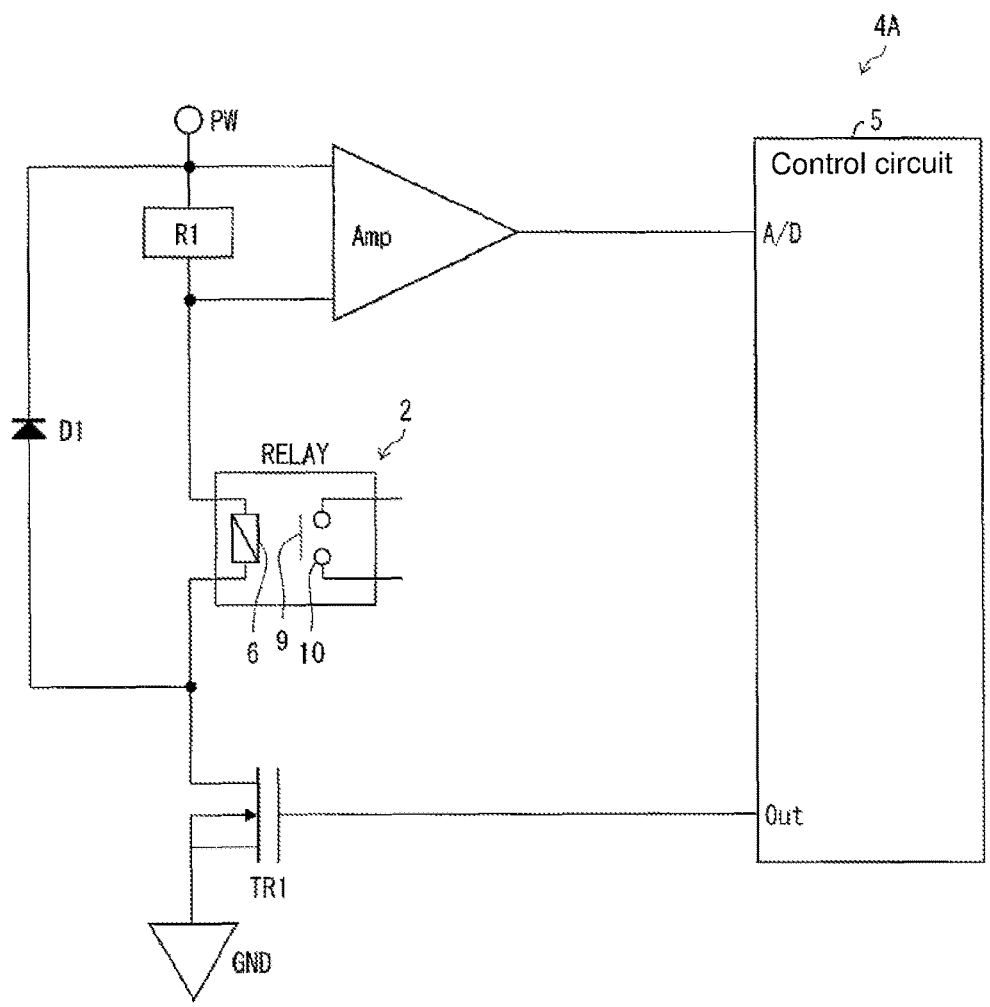
FIG. 44 is a circuit diagram illustrating a first configuration of a welding detection system according to a seventh embodiment.

FIG. 44 is a circuit diagram illustrating a first configuration of a welding detection system 1 according to an eighth embodiment. A component identical to the component in FIG. 1 is designated by an identical symbol. Accordingly, the detailed overlapping description of the components is omitted. The same holds true for the later-described circuit diagrams.

In the first to sixth embodiments, the welding detection circuit 4 in FIG. 2 is described by way of example. However, the present invention is not limited to the welding detection circuit 4 in FIG. 2. As illustrated in a welding detection circuit 4A of FIG. 44, the current detection resistor R1 may be disposed between the electromagnetic relay 2 and the power supply PW. The welding detection circuit 4 in FIG. 44 can also be used in the first to sixth embodiments. Later-described welding detection circuits in FIGS. 45 to 50 can similarly be used in the first to sixth embodiments.

Figure 45:
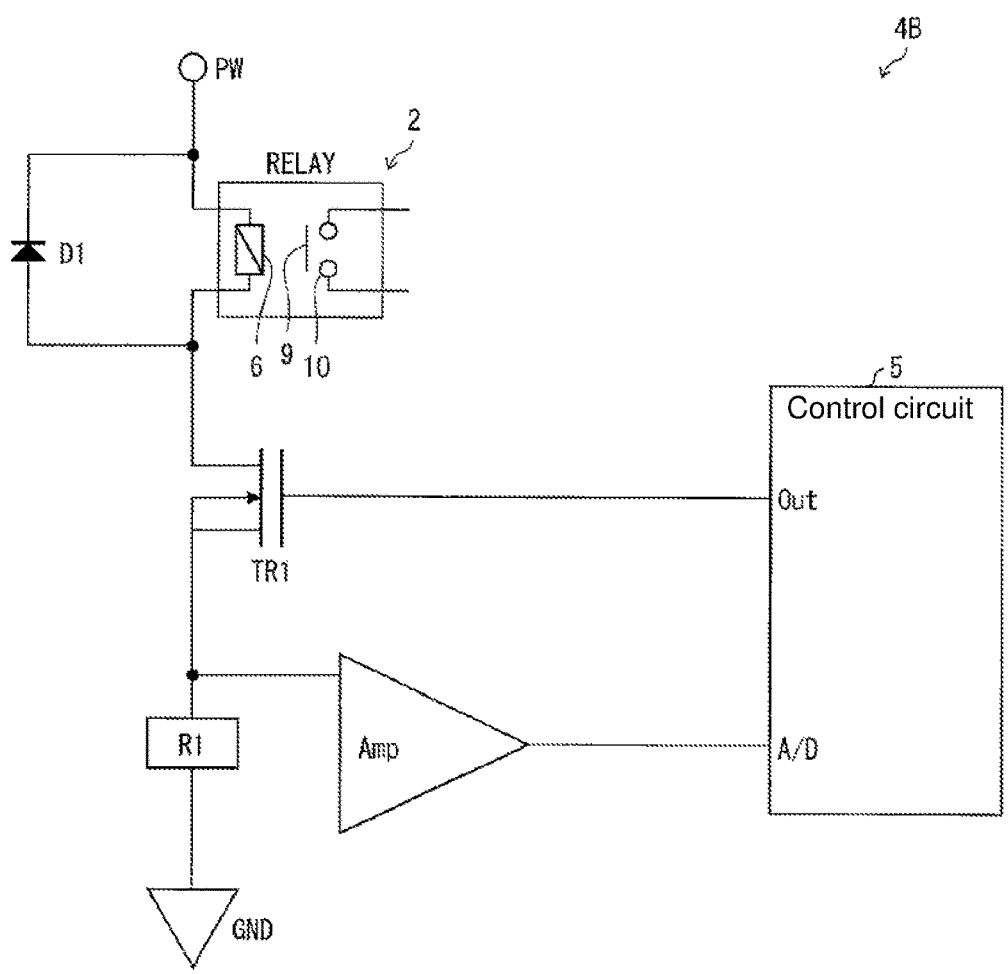
FIG. 45 is a circuit diagram illustrating a first modification of the welding detection system in FIG. 44.

FIG. 45 is a circuit diagram illustrating a first modification of the welding detection system 1 in FIG. 44. In a case where a gate-source voltage of the transistor TR1 is permissible as design even if the current is passed through the current detection resistor R1, the current detection resistor R1 may be disposed between the transistor TR1 and the ground GND as illustrated in a welding detection circuit 4B of FIG. 45. In the configuration of FIG. 45, a general-purpose amplifier can be used as the amplifier Amp, and the necessity to use an amplifier adapting to a wide common-mode voltage is eliminated.

When the current detection resistor R1 is disposed outside a loop of the regeneration diode D1 as illustrated in the welding detection circuit 4B of FIG. 45, the current passed through the excitation coil 6 can be measured only when the transistor TR1 connected to the current detection resistor R1 is turned on. Accordingly, the control circuit 5 may perform the measurement at the A/D terminal in synchronization with the turn-on of the transistor TR1 connected to the current detection resistor R1. The resistance value of the current detection resistor R1 may be decided such that the transient response signal is acquired while the movable contact 9 is attracted. The same holds true for welding detection circuits in FIGS. 46 to 48. When the current detection resistor R1 is increased, an amplification factor of the amplifier circuit can be reduced, or the amplifier circuit can be eliminated like the configuration in FIG. 48.

Figure 46:
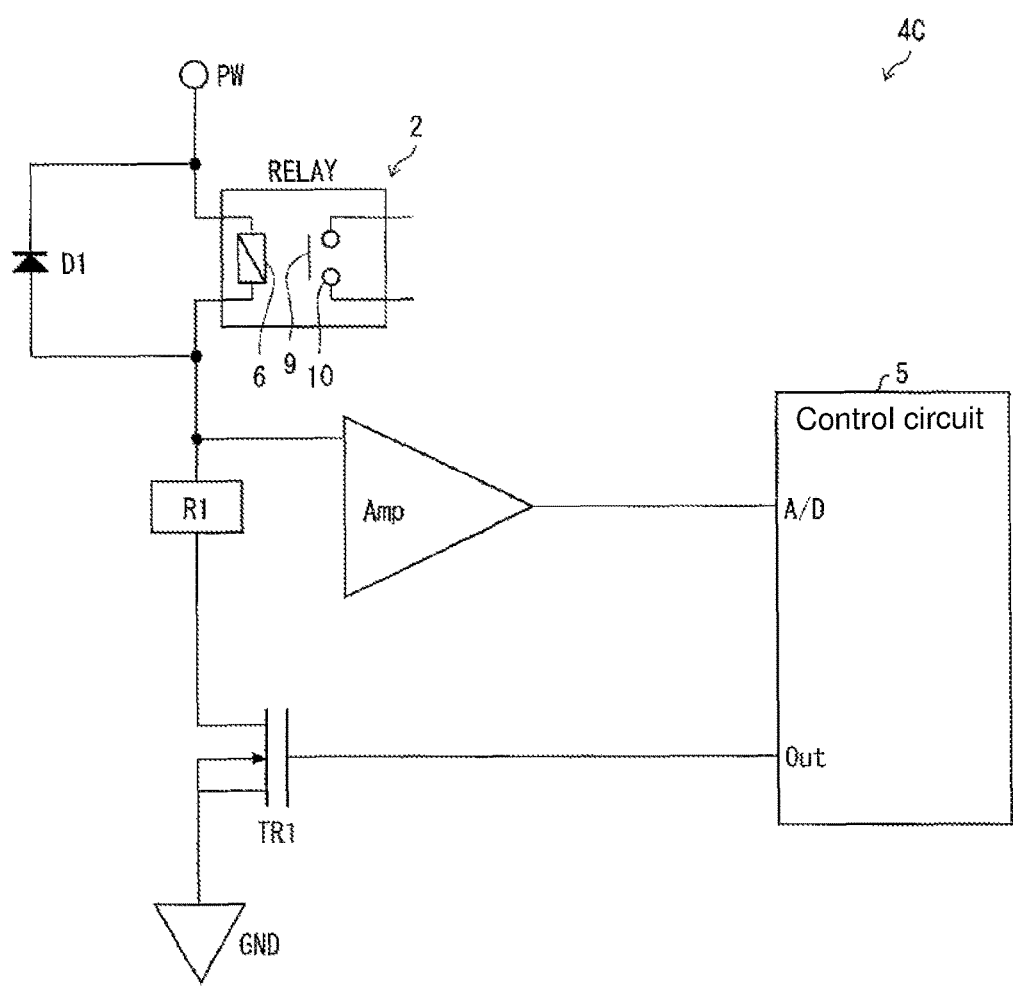
FIG. 46 is a circuit diagram illustrating a second modification of the welding detection system in FIG. 44.

FIG. 46 is a circuit diagram illustrating a second modification of the welding detection system 1 in FIG. 44. In a case where an on-resistance of the transistor TR1 t is permissible as an error while the current detection resistor R1 is larger than the on-resistance of the transistor TR1, as illustrated in a welding detection circuit 4C of FIG. 46, the current detection resistor R1 is disposed outside the loop of the regeneration diode D1, and the general-purpose amplifier may be used as the amplifier Amp.

Figure 47:
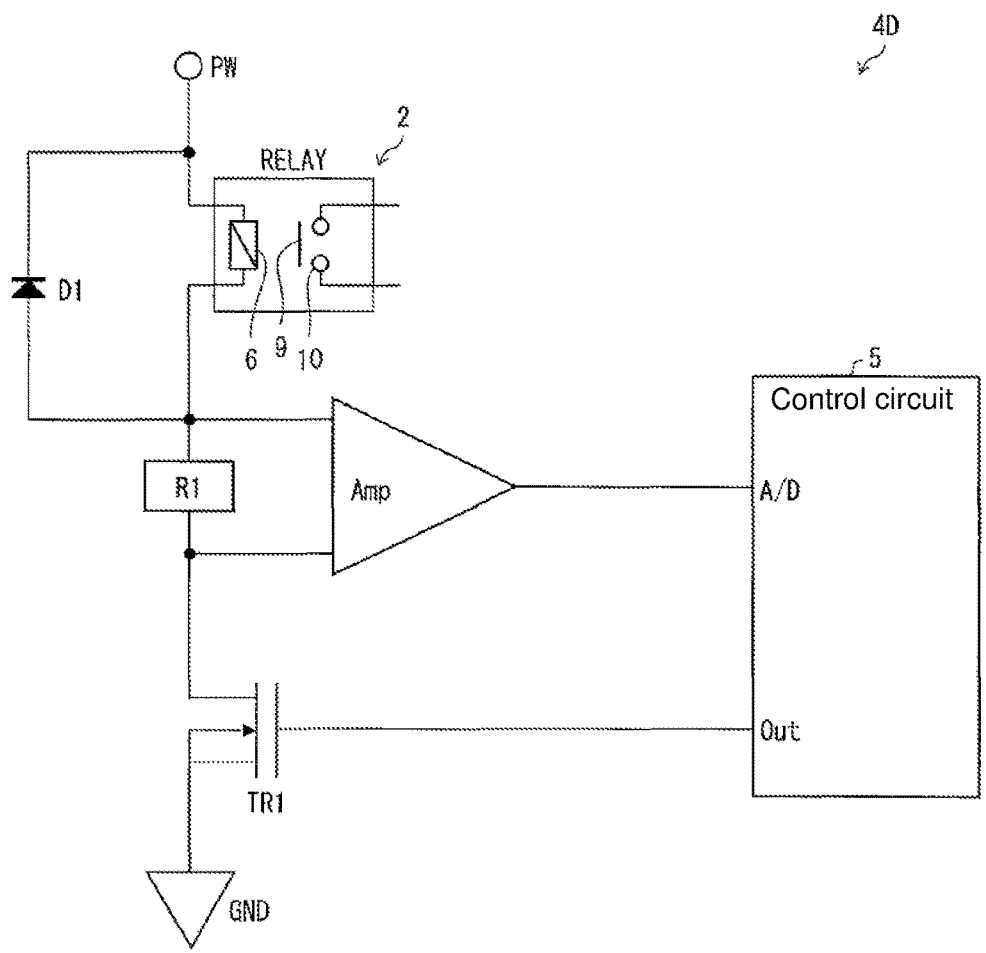
FIG. 47 is a circuit diagram illustrating a third modification of the welding detection system in FIG. 44.

In a case where the on-resistance of the transistor TR1 is impermissible as the error, as illustrated in a welding detection circuit 4D of FIG. 47, the current detection resistor R1 is disposed outside the loop of the regeneration diode D1, and the amplifier Amp that is of the differential amplifier may be connected to both sides of the current detection resistor R1.

Figure 48:
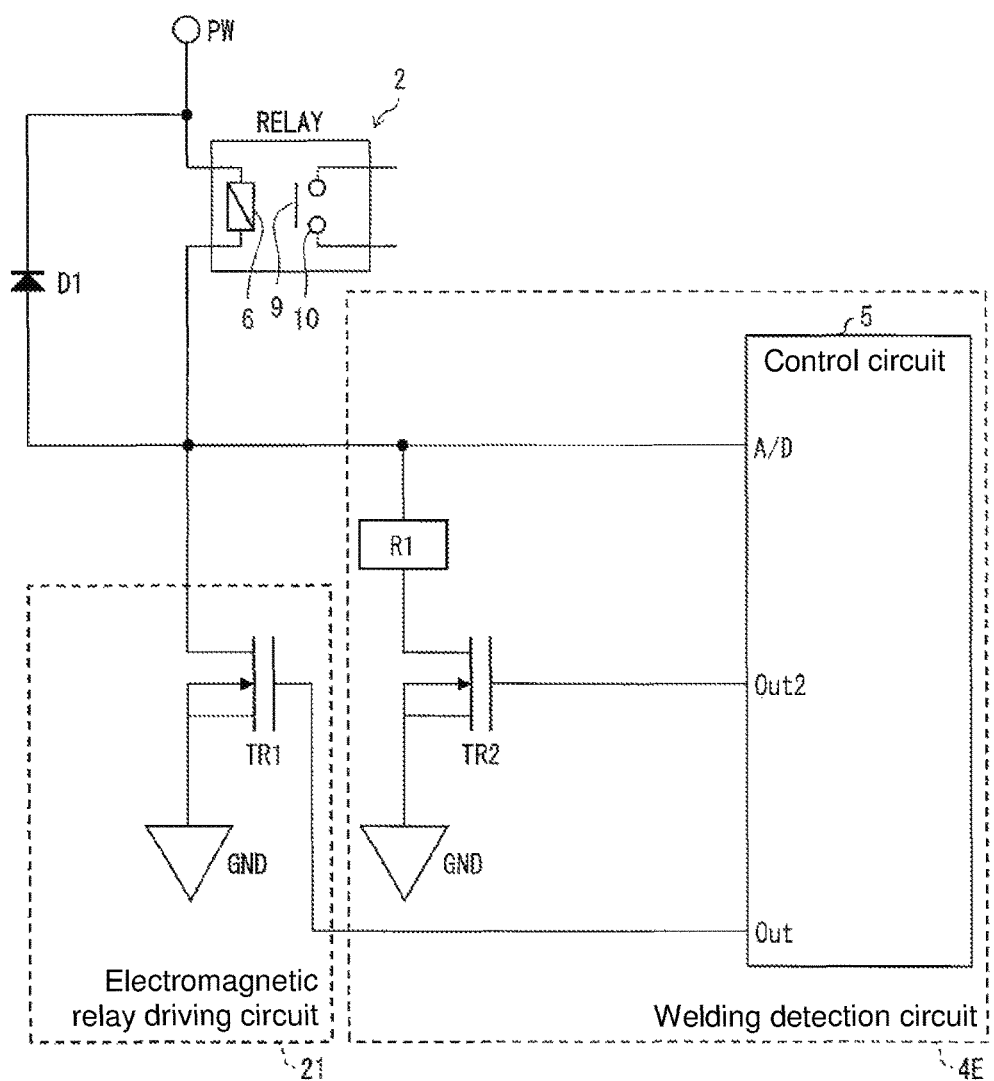
FIG. 48 is a circuit diagram illustrating a second configuration of the welding detection system of the seventh embodiment.

FIG. 48 is a circuit diagram illustrating a second configuration of the welding detection system 1 of the seventh embodiment. The transistor TR1 (first switching element) of the electromagnetic relay driving circuit 21 can hardly measure the current instead of a small loss. Although a transistor TR2 (second switching element) of the welding detection circuit 4E has a large loss because the current detection resistor R1 is provided, the transistor TR2 can measure the current.

Therefore, the transistor TR2 is driven when the separation transient response signal and the attraction transient response signal are measured and when the current is measured while the constant current is held, and the transistor TR1 is driven when the attraction pulse signal S3 is applied.

Referring to FIG. 33, at the clock time t17, the control circuit 5 supplies the attraction pulse signal S3 to the transistor TR1 (first switching element) of the electromagnetic relay driving circuit 21 while changing the duty of the attraction pulse signal S3, and the movable contact 9 is held in the power saving mode. At this point, because the transistor TR2 is turned off, the transient response signal S7 is not supplied to the control circuit 5. The transistor to be driven is switched from the transistor TR1 to the transistor TR2, and the duty of the attraction pulse signal S3 is changed so as to increase at the clock time t14. At this point, the control circuit 5 measures the attraction transient response signal S8A at the rising edge of the coil current.

At the clock time t18, the transistor TR2 is switched to the transistor TR1, and the duty of the attraction pulse signal S3 is changed so as to recover to the original value. At this point, although the movable contact 9 is held in the power saving mode, the control circuit 5 does not measure the attraction transient response signal at the falling edge of the coil current because the transistor TR2 is turned off. The transistor TR1 is switched from the transistor TR2, and the duty of the attraction pulse signal S3 is changed so as to increase at the clock time t15. At this point, the control circuit 5 measures the attraction transient response signal S8B at the rising edge of the coil current.

The transistor TR2 is switched from the transistor TR1, and the duty of the attraction pulse signal S3 is changed so as to recover to the original value at the clock time t19. At this point, although the movable contact 9 is held in the power saving mode, the control circuit 5 does not measure the attraction transient response signal at the falling edge of the coil current. The transistor TR1 is switched from the transistor TR2, and the duty of the attraction pulse signal S3 is changed so as to increase at the clock time t16. At this point, the control circuit 5 measures the attraction transient response signal S8C at the rising edge of the coil current.

In the configuration of FIG. 48, the loss caused by the current detection resistor R1 does not occur when the transient response signal is not measured while the electromagnetic relay 2 is operated.

Figure 49:
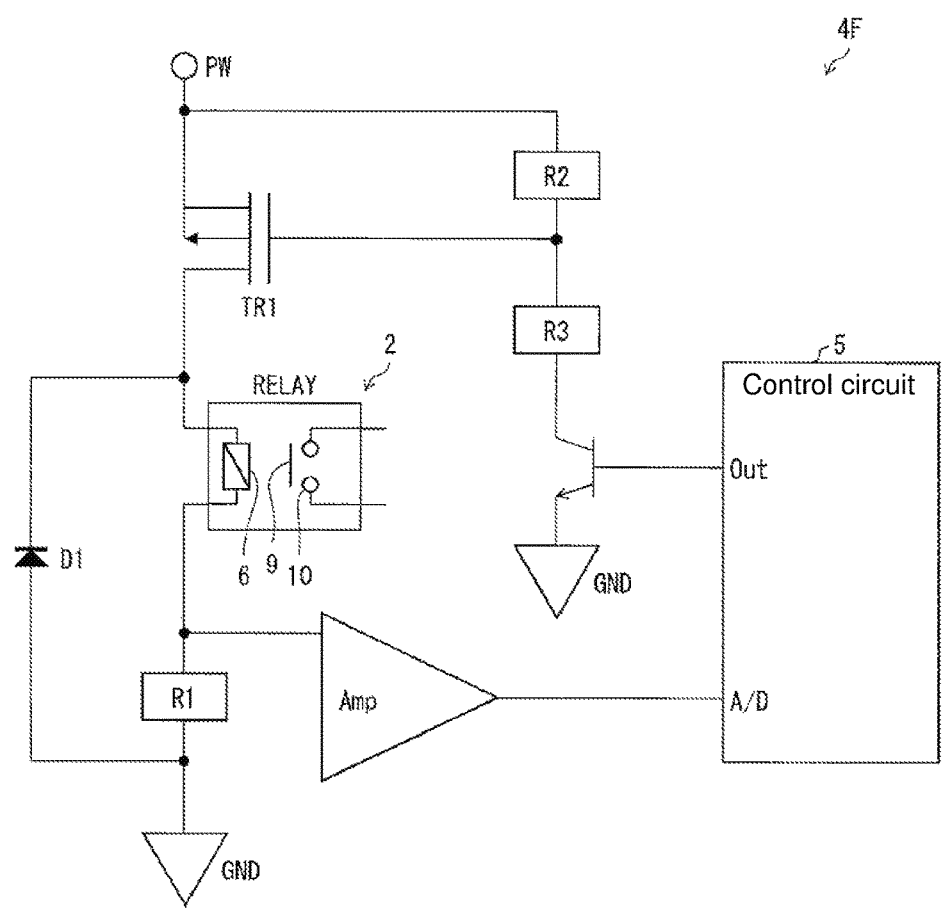
FIG. 49 is a circuit diagram illustrating a third configuration of the welding detection system of the seventh embodiment.

FIG. 49 is a circuit diagram illustrating a third configuration of the welding detection system of the seventh embodiment. A high-side switch configuration in which the transistor TR1 is disposed between the electromagnetic relay 2 and the power supply PW may be adopted as illustrated in a welding detection circuit 4F of FIG. 49. In the configuration of FIG. 45, a general-purpose amplifier can be used as the amplifier Amp, and the necessity to use an amplifier adapting to a wide common-mode voltage is eliminated.

Figure 50:
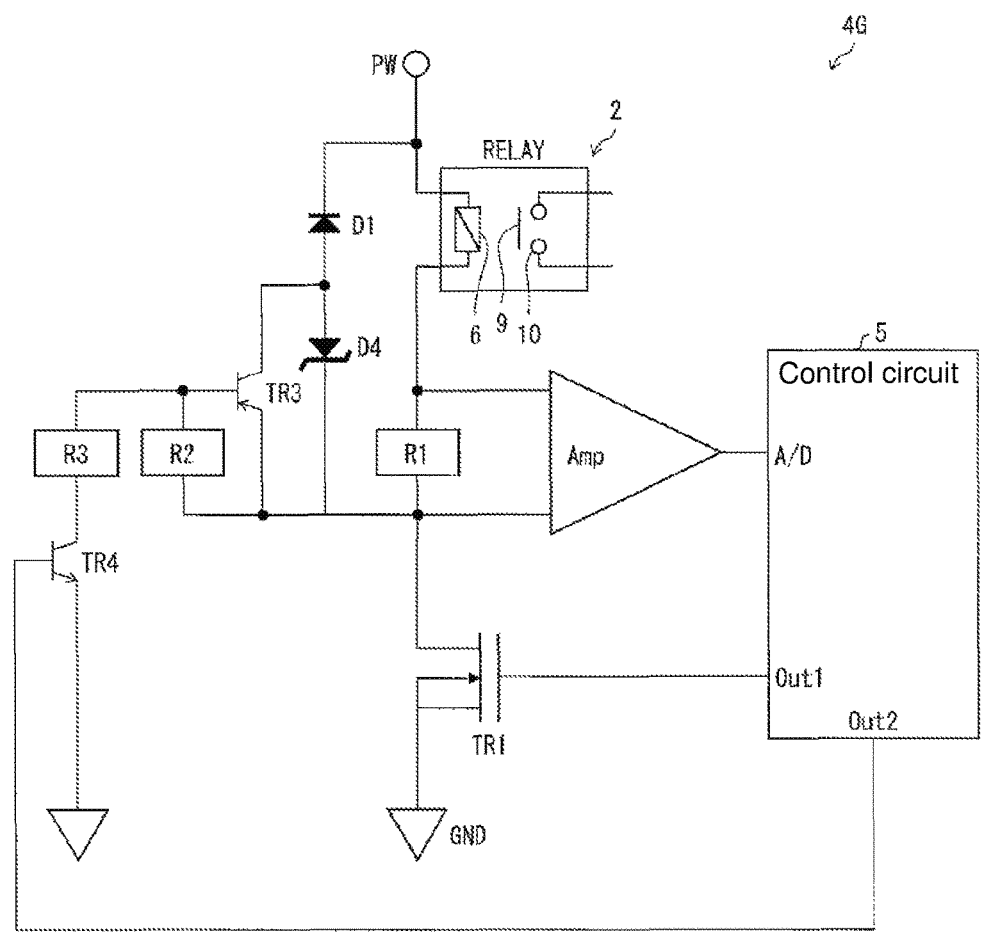
FIG. 50 is a circuit diagram illustrating a fourth configuration of the welding detection system of the seventh embodiment.

FIG. 50 is a circuit diagram illustrating a fourth configuration of the welding detection system of the seventh embodiment. As illustrated in a welding detection circuit 4G of FIG. 50, a recovery time of the electromagnetic relay 2 can be shortened when a Zener diode D4, transistors TR3 and TR4, and resistors R2 and R3 are added to the welding detection circuit 4 in FIG. 2.

Figure 3:
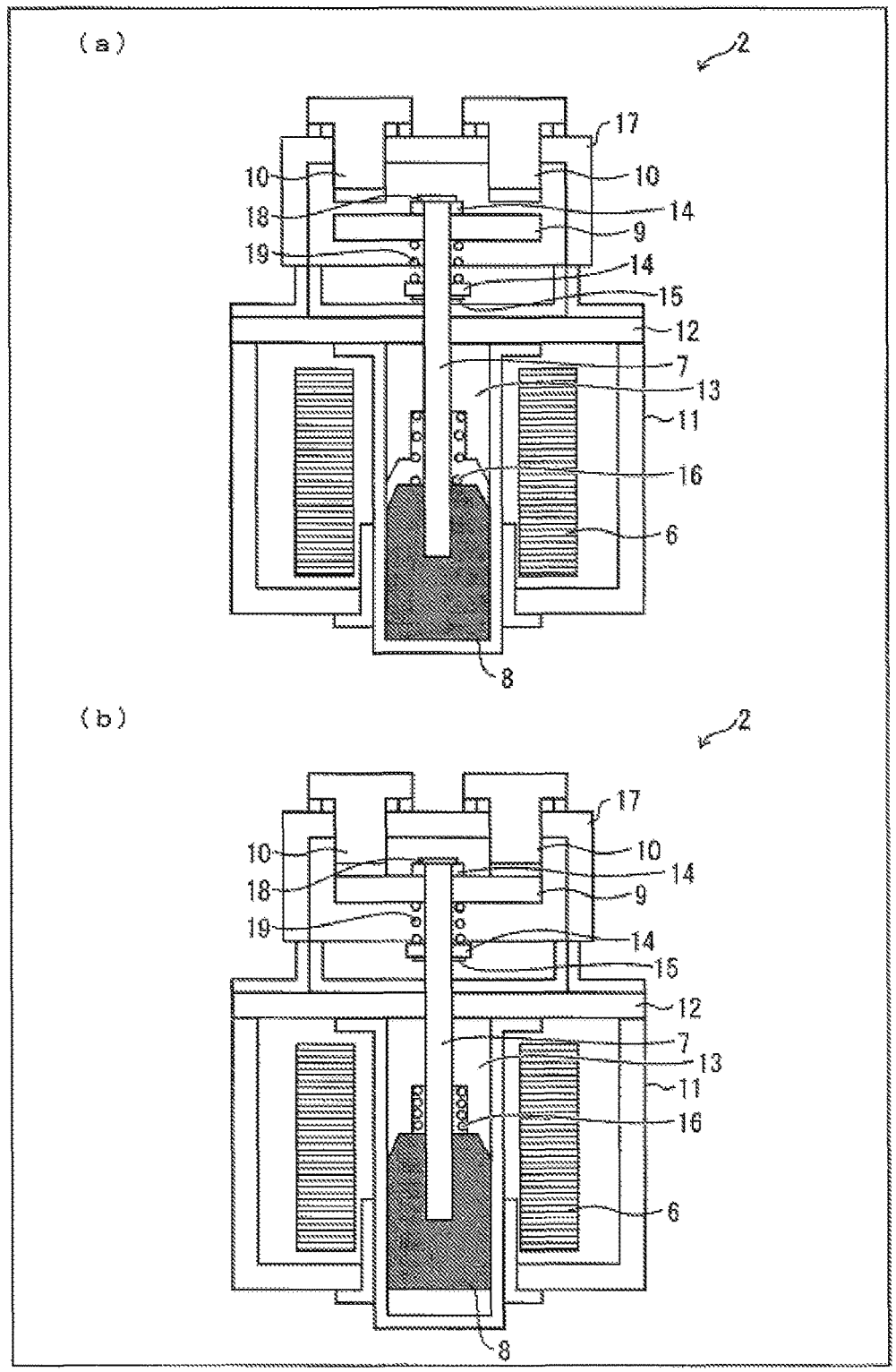
FIG. 3(a) is a sectional view illustrating a separated state of an electromagnetic relay provided in the welding detection system.
FIG. 3(b) is a sectional view illustrating an attracted state of the electromagnetic relay.
Figure 51:
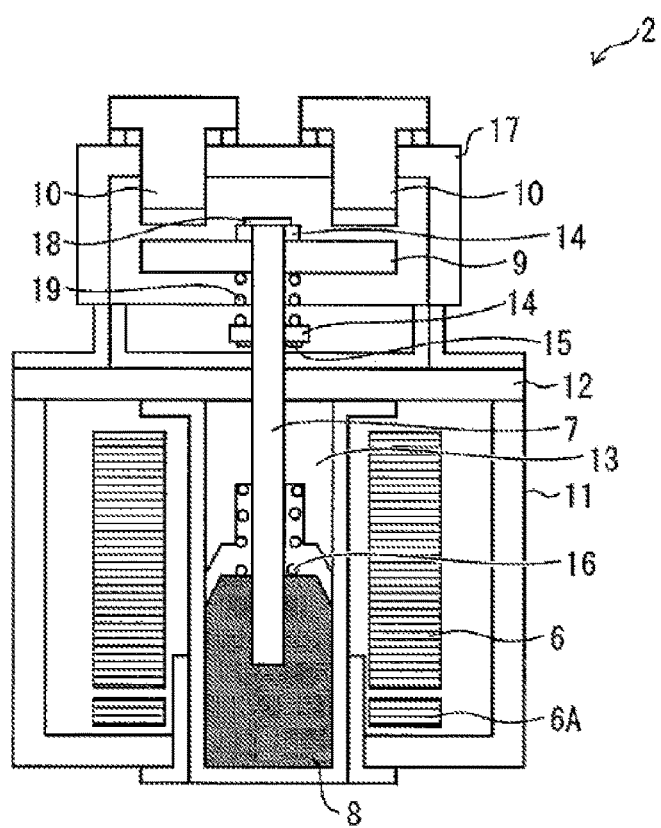
FIG. 51 is a sectional view illustrating another configuration of the excitation coil provided in the welding detection system of the seventh embodiment.

FIG. 51 is a sectional view illustrating another configuration of the excitation coil provided in the welding detection system of the eighth embodiment. In the above embodiments, by way of example, the electromagnetic relay 2 includes one excitation coil 6 as illustrated in FIG. 3. However, the present invention is not limited to the configuration in FIG. 3. As illustrated in FIG. 49, the electromagnetic relay 2 may include two excitation coils 6 and 6A or include at least three excitation coils.

Figure 52:
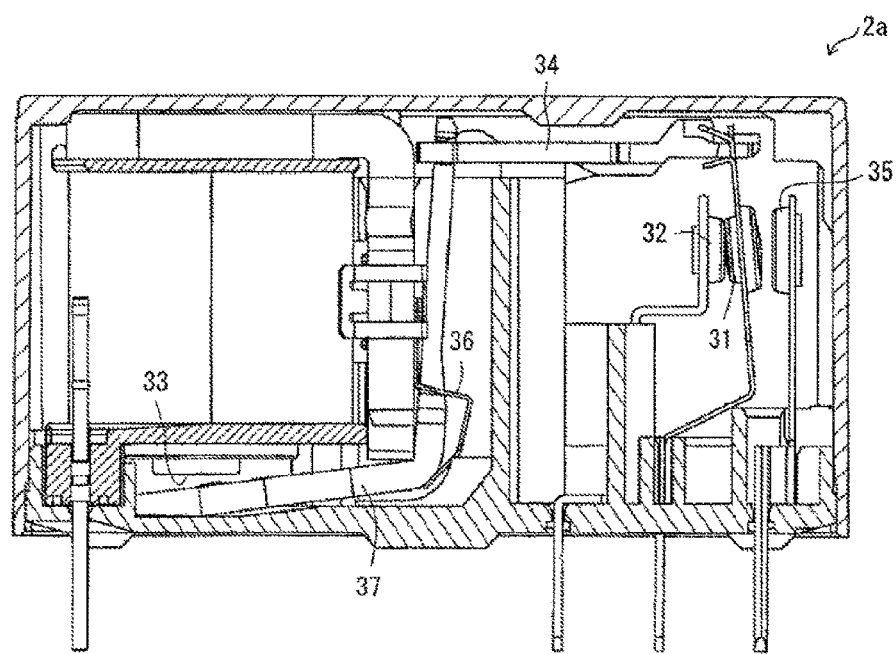
FIG. 52 is a sectional view illustrating a configuration of another electromagnetic relay provided in the welding detection system of the seventh embodiment.
Figure 53:
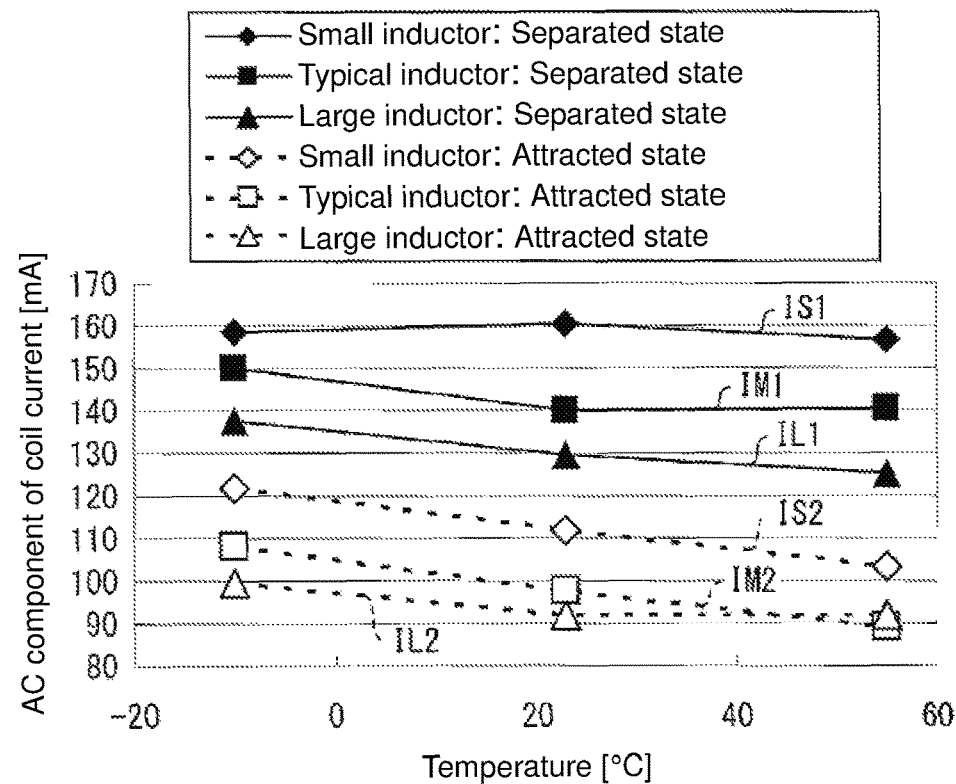
FIG. 53 is a graph illustrating a problem caused by a temperature change of a conventional welding detection system.
Figure 54:
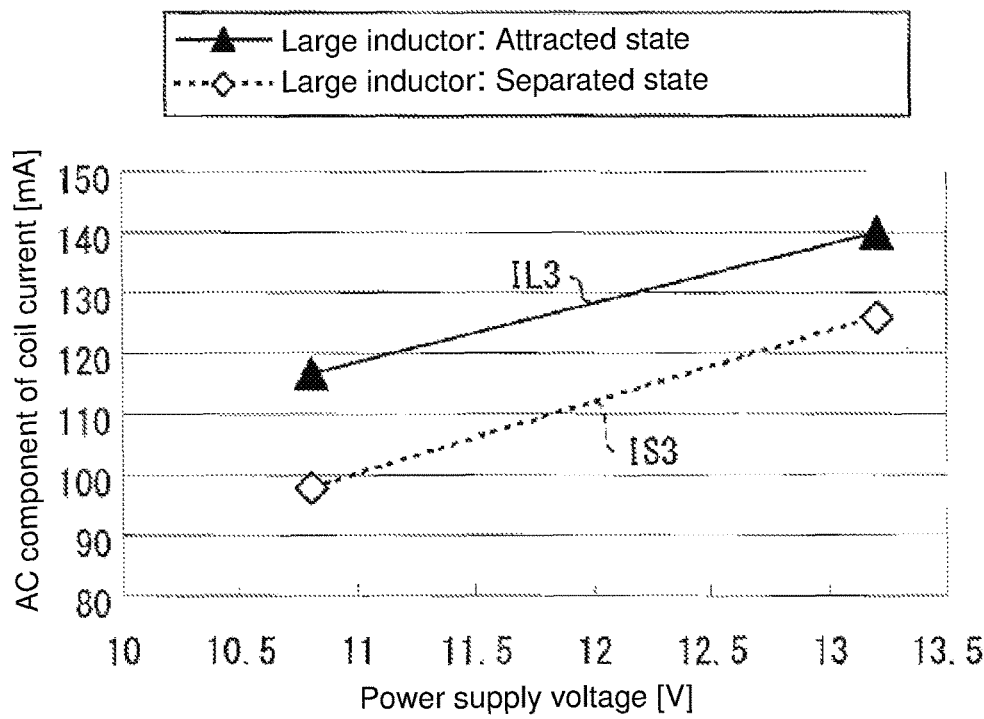
FIG. 54 is a graph illustrating a problem caused by the variation in power supply voltage of the conventional welding detection system.
Figure 55:
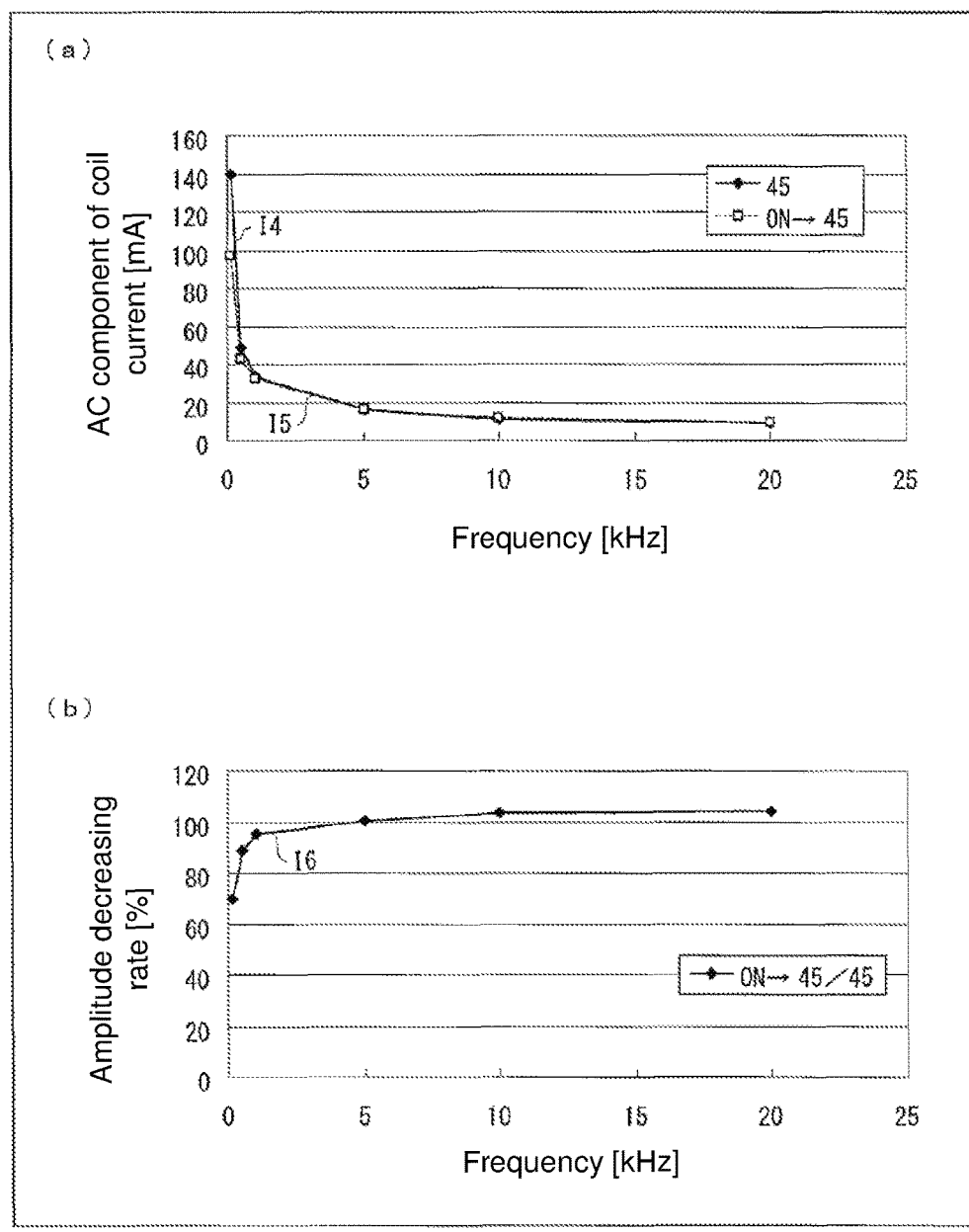
FIG. 55 is a graph illustrating a problem caused by a pulse frequency of the conventional welding detection system.

FIG. 52 is a sectional view illustrating a configuration of an electromagnetic relay 2a provided in the welding detection system of the seventh embodiment. The plunger type electromagnetic relay 2 is illustrated in FIGS. 2 and 51. In the plunger type electromagnetic relay 2, the movable iron core 8 is fixed to the driving shaft 7 that is reciprocally provided in the center axis direction of the excitation coil 6, and the movable contact 9 fixed to the driving shaft 7 is attracted to or separated from the fixed contact 10 by the electromagnetic force generated in the movable iron core 8 in accordance with the supply of cutoff of the current passed through the excitation coil 6. However, the present invention is not limited to the configuration in FIGS. 2 and 51. For example, as illustrated in FIG. 52, the present invention can be applied to a hinge type electromagnetic relay 2a.

The electromagnetic relay 2a includes a movable contact 31 disposed between a pair of fixed contacts 32 and 35, a card member 34 coupled to the movable contact 31, a movable iron piece 37 coupled to the card member 34, an attraction surface 33 of the iron core inserted in the excitation coil, and a hinge spring 36 that biases the movable iron piece 37 counterclockwise.

As illustrated in FIG. 52, the movable contact 31 is conductive to the fixed contact (normally closed contact) 32 when the operation signal is supplied. When the operation signal is supplied to pass the current through the excitation coil, the movable iron piece 37 is turned and attracted to the attraction surface 33 of the iron core by the electromagnetic force, and the card member 34 is pushed. Therefore, the movable contact 31 is separated from the fixed contact 32, and conductive to the fixed contact (normally opened contact) 35.

When the supply of the operation signal is stopped, the electromagnetic force disappears, and the movable iron piece 37 turns counterclockwise by a biasing force of the hinge spring 36, and is separated from the attraction surface 33 of the iron core. Therefore, the movable contact 31 is separated from the fixed contact 35, and conductive to the fixed contact 32.

Thus, when the operation signal is supplied, the movable contact 31 and the fixed contact 35 are brought into the closing state, and the movable contact 31 and the fixed contact 32 are brought into the opening state.

When the movable iron piece 37 is attracted to the attraction surface 33 of the iron core, and when the movable iron piece 37 is separated from the attraction surface 33 of the iron core, the inductance of the excitation coil changes because a magnetic characteristic of the excitation coil changes. Therefore, the present invention can be applied to the hinge type electromagnetic relay 2a in FIG. 52 similarly to the plunger type electromagnetic relay 2 in FIGS. 2 and 51.

The single stable relay, which is operated by inputting the magnetic excitation to the coil and recovers by removing the input of the magnetic excitation, is described by way of example. The present invention can also be applied to a latching relay (bistable relay), which is operated or recovered by inputting the magnetic excitation to the coil and held in the state even after the removal of the input of the magnetic excitation.

The present invention is not limited to the above embodiments, but various changes can be made without departing from the scope of the present invention. It is noted that the embodiment obtained by a combination of different embodiments is also included in the scope of the present invention.

INDUSTRIAL APPLICABILITY

The present invention can be applied to the abnormality detection method, the abnormality detection circuit, and the abnormality detection system for the electromagnetic relay in which the movable contact and the fixed contact are opened and closed by the electromagnetic force generated in accordance with the supply or cutoff of the current passed through the excitation coil.

The present invention can also be applied to the abnormality detection method, the abnormality detection circuit, and the abnormality detection system for the electromagnetic relay disposed in a charging line between a vehicle-side connector and an onboard battery of an electric automobile and the electromagnetic relay disposed in a storage battery system.

[Additional Remarks]

The present invention can also be expressed as follows.

A first aspect of the present invention provides an abnormality detection method for electromagnetic relay in which a movable contact and a fixed contact are closed or opened by an electromagnetic force generated in accordance with supply or cutoff of a current passed through an excitation coil. At this point, an abnormal operation of the movable contact to the fixed contact is detected based on at least one of a first transient response signal of a coil current passed through the excitation coil during the supply of a first detection pulse signal in a state of not supplying an operation signal to operate the movable contact relative to the fixed contact and a second transient response signal of the coil current during the supply of a second detection pulse signal in a state of supplying the operation signal.

The first transient response signal during the supply of the first detection pulse signal in the state of not supplying the operation signal and the second transient response signal during the supply of the second detection pulse signal in the state of supplying the operation signal indicate different values in accordance with the position of the movable contact relative to the fixed contact. Accordingly, the abnormal operation of the movable contact to the fixed contact can be detected on the basis of at least one of the first transient response signal and the second transient response signal.

As used herein, the term "the operation of the electromagnetic relay" means that the fixed contact and the movable contact become conductive to each other (attracted state) in a case where the fixed contact and the movable contact are non-conductive before the supply of the operation signal (separated state), and that the fixed contact and the movable contact become non-conductive to each other (separated state) in a case where the fixed contact and the movable contact are conductive before the supply of the operation signal (attracted state). The term "the recovery of the electromagnetic relay" means that the electromagnetic relay operated in the above way recovers to an original state.

The term "the operation signal" means the signal that brings the fixed contact and the movable contact into the conductive state and holds the conductive state in a case where the fixed contact and the movable contact are non-conductive (separated state), or the signal that brings the fixed contact and the movable contact into the non-conductive state and holds the non-conductive state in a case where the fixed contact and the movable contact are conductive (attracted state).

The term "the supply of the first detection pulse signal" means that the pulse signal having the duty ratio at which the electromagnetic relay is not operated is applied to the excitation coil, that the duty ratio of the applying pulse signal is changed within a range in which the electromagnetic relay is not operated, or that the application of the pulse signal is stopped (the duty ratio is set to 0%).

The term "the first transient response signal" means the transient response signal of the coil current passed through the excitation coil by the supply of the first detection pulse signal.

The term "the supply of the second detection pulse signal" means that the pulse signal having the duty ratio at which the electromagnetic relay does not recover is applied to the excitation coil, that the duty ratio of the applying pulse signal is changed within a range in which the electromagnetic relay does not recover, or that the applying pulse signal is changed to the DC signal (the duty ratio is set to 100%).

The term "the second transient response signal" means the transient response signal of the coil current passed through the excitation coil by the supply of the second detection pulse signal.

In the abnormality detection method for electromagnetic relay of the present invention, preferably the first transient response signal is generated by applying the first detection pulse signal to a switching element that supplies the coil current to the excitation coil, the second transient response signal is generated by applying the second detection pulse signal to the switching element, a period of the first detection pulse signal is sufficiently shorter than that of the first transient response signal, and a period of the second detection pulse signal is sufficiently shorter than that of the second transient response signal.

In the above configuration, the first transient response signal and the second transient response signal can easily be generated by controlling the duty of the first detection pulse signal and the duty of the second detection pulse signal.

As used herein, the term "the period of the first detection pulse signal is sufficiently shorter than that of the first transient response signal" includes a case where the period of the first detection pulse signal is sufficiently shorter than the time constant of a sum of the excitation coil and an internal resistance of the excitation coil or a sum of the internal resistance of the excitation coil and the resistor connected to the excitation coil, and a case where the period of the first detection pulse signal is sufficiently shorter than the time the current passed through the excitation coil reaches the steady state since the current is supplied to the excitation coil.

The term "the period of the second detection pulse signal is sufficiently shorter than that of the second transient response signal" includes a case where the period of the second detection pulse signal is sufficiently shorter than the time constant of a sum of the excitation coil and an internal resistance of the excitation coil or a sum of the internal resistance of the excitation coil and the resistor connected to the excitation coil, and a case where the period of the second detection pulse signal is sufficiently shorter than the time the current passed through the excitation coil reaches the steady state since the current is supplied to the excitation coil.

The duty ratio of the first detection pulse signal is set to the range in which the electromagnetic relay is not operated. The duty ratio of the second detection pulse signal is set to the range in which the electromagnetic relay does not recover.

In the abnormality detection method for electromagnetic relay of the present invention, preferably the abnormal operation of the movable contact to the fixed contact is detected based on a threshold set in accordance with the first transient response signal and the second transient response signal.

In the above configuration, the threshold is set in accordance with the first transient response signal and the second transient response signal, so that the threshold can be set every time the movable contact of the electromagnetic relay is operated. Even if the inductance or resistance value of the excitation coil of the electromagnetic relay has the individual difference, the threshold is set in each electromagnetic relay in accordance with the individual difference. Accordingly, even if the inductance of the excitation coil of the electromagnetic relay has the individual difference, the abnormal operation of the movable contact can correctly be detected.

In the abnormality detection method for electromagnetic relay of the present invention, preferably the abnormal operation of the movable contact to the fixed contact is detected based on a time width corresponding to a magnitude relationship between the threshold and a third transient response signal of the coil current during the supply of a third detection pulse signal.

In the above configuration, the occurrence of the abnormal operation can surely be detected.

In the abnormality detection method for electromagnetic relay of the present invention, preferably the abnormal operation of the movable contact to the fixed contact is detected based on the threshold, a third transient response signal of the coil current during the supply of a third detection pulse signal, and a clock time at which a difference between the first transient response signal and the second transient response signal is maximized, or the abnormal operation is detected based on a sign of an integrated value obtained from the third transient response signal and the threshold.

In the above configuration, the occurrence of the abnormal operation can be detected by a simple configuration.

In the abnormality detection method for electromagnetic relay of the present invention, preferably the threshold is updated by repeatedly generating the first transient response signal is repeatedly generated in each predetermined time, by generating the first transient response signal in accordance with an on-signal externally supplied to operate the movable contact relative to the fixed contact, or by repeatedly generating the second transient response signal in each predetermined time.

In the above configuration, even if the ambient temperature changes before the supply of the operation signal, the first transient response signal can be generated at the changed temperature. Additionally, even if the ambient temperature changes after the supply of the operation signal, the threshold can be updated at the changed temperature. Accordingly, even if the ambient temperature of the electromagnetic relay changes, there is no risk of falsely detecting the occurrence of the abnormal operation of the electromagnetic relay.

In the abnormality detection method for electromagnetic relay of the present invention, preferably a duty of the first detection pulse signal is controlled such that a difference between a current value of the first transient response signal before the supply of the first detection pulse signal and a current value of the first transient response signal in a steady state after the supply of the first detection pulse signal becomes a target value, or a duty of the second detection pulse signal is controlled such that a difference between a current value of the second transient response signal before the supply of the second detection pulse signal and a current value of the second transient response signal in a steady state after the supply of the second detection pulse signal becomes a target value.

In the above configuration, even if the power supply voltage or the temperature changes, the coil current change width caused by the detection pulse signal can be kept constant. Accordingly, even if the power supply voltage changes, there is no risk of falsely detecting the occurrence of the abnormal operation of the electromagnetic relay.

In the abnormality detection method for electromagnetic relay of the present invention, preferably the threshold is set, and the abnormal operation of the movable contact to the fixed contact is detected based on the threshold and a third transient response signal of the coil current during the supply of a third detection pulse signal after elapse of a predetermined time.

In the above configuration, the determination can be made on the basis of the threshold in which the individual difference and surrounding environment of the inductance are considered, so that the position of the movable iron core can surely be determined before the supply of the operation signal.

In the abnormality detection method for electromagnetic relay of the present invention, preferably the second transient response signal is generated, and a determination that an abnormality occurs in the operation of the electromagnetic relay when a value of another second transient response signal generated by supplying the second detection pulse signal after elapse of a predetermined time exceeds the threshold.

In the above configuration, the abnormality in which the electromagnetic relay recovers irrespective of the supply of the operation signal can be detected.

In the abnormality detection method for electromagnetic relay of the present invention, preferably the movable contact is operated relative to the fixed contact by applying the operation signal to a first switching element, the first switching element being connected in parallel with a second switching element configured to supply the coil current to the excitation coil with respect to the excitation coil, the first switching element is turned off, and the second detection pulse signal is applied to the switching element to generate the second transient response signal.

In the above configuration, a power loss caused by the current detection resistor can be avoided when the electromagnetic relay is operated while the transient response signal is not measured.

A second aspect of the present invention provides an abnormality detection circuit for electromagnetic relay in which a movable contact and a fixed contact are closed or opened by an electromagnetic force generated in accordance with supply or cutoff of a current to an excitation coil, the abnormality detection circuit including a control circuit configured to detect an abnormal operation of the movable contact to the fixed contact based on at least one of a first transient response signal of a coil current passed through the excitation coil during the supply of a first detection pulse signal in a state of not supplying an operation signal to operate the movable contact relative to the fixed contact and a second transient response signal of the coil current during the supply of a second detection pulse signal in a state of supplying the operation signal.

A third aspect of the present invention provides an abnormality detection system including: an electromagnetic relay in which a movable contact and a fixed contact are closed or opened by an electromagnetic force generated in accordance with supply or cutoff of a current to an excitation coil; and an abnormality detection circuit configured to detect an abnormal operation of the movable contact to the fixed contact based on at least one of a first transient response signal of a coil current passed through the excitation coil during the supply of a first detection pulse signal in a state of not supplying an operation signal to operate the movable contact relative to the fixed contact and a second transient response signal of the coil current during the supply of a second detection pulse signal in a state of supplying the operation signal.

A fourth aspect of the present invention provides an abnormality detection method for electromagnetic relay in which a movable contact and a fixed contact are closed or opened by an electromagnetic force generated in accordance with supply or cutoff of a current to an excitation coil. At this point, an abnormal operation of the movable contact to the fixed contact is detected based on at least one of a first transient response signal of a coil current passed through the excitation coil during the supply of a first detection pulse signal in a non-operation state of the movable contact relative to the fixed contact and a second transient response signal of the coil current during the supply of a second detection pulse signal in an operation state of the movable contact relative to the fixed contact.

A fifth aspect of the present invention provides an abnormality detection circuit for electromagnetic relay in which a movable contact and a fixed contact are closed or opened by an electromagnetic force generated in accordance with supply or cutoff of a current to an excitation coil, the abnormality detection circuit including a control circuit configured to detect an abnormal operation of the movable contact to the fixed contact based on at least one of a first transient response signal of a coil current passed through the excitation coil during the supply of a first detection pulse signal in a non-operation state of the movable contact relative to the fixed contact and a second transient response signal of the coil current during the supply of a second detection pulse signal in an operation state of the movable contact relative to the fixed contact.

A sixth aspect of the present invention provides an abnormality detection system including: an electromagnetic relay in which a movable contact and a fixed contact are closed or opened by an electromagnetic force generated in accordance with supply or cutoff of a current to an excitation coil; and an abnormality detection circuit configured to detect an abnormal operation of the movable contact to the fixed contact based on at least one of a first transient response signal of a coil current passed through the excitation coil during the supply of a first detection pulse signal in a non-operation state of the movable contact relative to the fixed contact and a second transient response signal of the coil current during the supply of a second detection pulse signal in an operation state of the movable contact relative to the fixed contact.

DESCRIPTION OF SYMBOLS 1 welding detection system (abnormality detection system)
2 electromagnetic relay
3 welding detection module
4 welding detection circuit (abnormality detection circuit)
5 control circuit
6 excitation coil
7 driving shaft
8 movable iron core
9 movable contact
10 fixed contact
S0 attraction signal (operation signal)
S1 separation pulse signal (first detection pulse signal)
S2 separation transient response signal (first transient response signal)
S3 attraction pulse signal (second detection pulse signal)
S4 transient response signal
S6 attraction transient response signal (second transient response signal)
S8 attraction transient response signal (second transient response signal)
S9 detection pulse signal
S10 detection transient response signal (third transient response signal)
S12A transient response difference waveform
S13 external signal
TR1 transistor (first switching element)
TR2 transistor (second switching element)
Th threshold

The invention claimed is:
1. An abnormality detection method for an electromagnetic relay comprising a movable contact, a fixed contact, and an excitation coil, wherein the movable contact is attracted to the fixed contact by an electromagnetic force generated in accordance with a supply of a coil current to the excitation coil and the movable contact is separated from the fixed contact in response to a cutoff of the coil current to the excitation coil, the method comprising:
measuring a first transient response signal of a coil current passed through the excitation coil based on the supply of a first detection pulse signal in a state of not supplying an operation signal to cause the movable contact to be attracted to the fixed contact;
measuring a second transient response signal of the coil current passed through the excitation coil based on the supply of a second detection pulse signal in a state of supplying the operation signal to cause the movable contact to be attracted to the fixed contact; and
detecting an abnormal operation of the movable contact relative to the fixed contact based on an AC component of: at least one of the first transient response signal and the second transient response signal; and a relationship between a magnitude of a threshold set based on the first transient response signal and the second transient response signal and a magnitude of a third transient response signal, the third transient response signal based on the supply of a third detection pulse signal over a time width.

2. The abnormality detection method for the electromagnetic relay according to claim 1, wherein
the first transient response signal is generated by applying the first detection pulse signal to a switching element that supplies the coil current to the excitation coil,
the second transient response signal is generated by applying the second detection pulse signal to the switching element,
a period of the first detection pulse signal is shorter than a period of the first transient response signal, and
a period of the second detection pulse signal is shorter than that of the second transient response signal.

3. The abnormality detection method for the electromagnetic relay according to claim 1, wherein:
the abnormal operation of the movable contact relative to the fixed contact is detected based on:
the threshold, the third transient response signal; and a time at which a difference between the first transient response signal and the second transient response signal is maximized; or
a sign of an integrated value obtained from integrating a difference between the third transient response signal and the threshold.

4. The abnormality detection method for the electromagnetic relay according to claim 1, wherein the threshold is updated by repeatedly generating the first transient response signal in each of predetermined time intervals, by generating the first transient response signal in response to an on-signal externally supplied to operate the movable contact relative to the fixed contact, or by repeatedly generating the second transient response signal in each of the predetermined time intervals.

5. The abnormality detection method for the electromagnetic relay according to claim 1, wherein:
a duty of the first detection pulse signal is controlled such that a difference between a current value of the first transient response signal before the supply of the first detection pulse signal and a target value of the first transient response signal based on the supply of the first detection pulse signal is kept constant, or
a duty of the second detection pulse signal is controlled such that a difference between a current value of the second transient response signal before the supply of the second detection pulse signal and a target value of the second transient response signal based on the supply of the second detection pulse signal is kept constant.

6. The abnormality detection method for the electromagnetic relay according to claim 1, wherein the abnormal operation of the movable contact relative to the fixed contact is detected based on the threshold and the third transient response signal of the coil current based on the supply of the third detection pulse signal after a predetermined time elapses.

7. The abnormality detection method for the electromagnetic relay according to claim 1, further comprising:
generating an additional second transient response signal by supplying the second detection pulse signal after a predetermined time elapses, wherein
the abnormal operation of the movable contact relative to the fixed contact is detected based on at least one of: the first transient response signal; the second transient response signal; and the additional second transient response signal, when the second transient response signal exceeds the threshold.

8. The abnormality detection method for the electromagnetic relay according to claim 1, wherein the movable contact is operated relative to the fixed contact by applying the operation signal to a first switching element, the first switching element being connected in parallel with a second switching element configured to supply the coil current to the excitation coil, and
the second transient response signal is generated by turning off the first switching element and applying the second detection pulse signal to the second switching element to generate the second transient response signal.

9. An abnormality detection circuit for an electromagnetic relay comprising a movable contact, a fixed contact, and an excitation coil, wherein the movable contact is attracted to the fixed contact by an electromagnetic force generated in accordance with a supply of a coil current to the excitation coil and the movable contact is separated from the fixed contact in response to a cutoff of the coil current to the excitation coil, the abnormality detection circuit comprising a control circuit configured to perform operations comprising:
measuring a first transient response signal of the coil current passed through the excitation coil based on the supply of a first detection pulse signal in a state of not supplying an operation signal to cause the movable contact to be attracted to the fixed contact;
measuring a second transient response signal of the coil current passed through the excitation coil caused by the supply of a second detection pulse signal in a state of supplying the operation signal to cause the movable contact to be attracted to the fixed contact; and
detecting an abnormal operation of the movable contact relative to the fixed contact based on an AC component of: at least one of the first transient response signal and the second transient response signal; and a relationship between a magnitude of a threshold set based on the first transient response signal and the second transient response signal and a magnitude of a third transient response signal; the third transient response signal based on the supply of a third detection pulse signal over a time width.

10. An abnormality detection system comprising:
an electromagnetic relay comprising: a movable contact, a fixed contact, and an excitation coil, wherein the movable contact is attracted to the fixed contact by an electromagnetic force generated in accordance with a supply of a coil current to the excitation coil and the movable contact is separated from the fixed contact in response to a cutoff of the coil current to the excitation coil; and
an abnormality detection circuit configured to perform operations comprising:
measuring a first transient response signal of the coil current passed through the excitation coil based on the supply of a first detection pulse signal in a state of not supplying an operation signal to cause the movable contact to be attracted to the fixed contact,
measuring a second transient response signal of the coil current passed through the excitation coil based on the supply of a second detection pulse signal in a state of supplying the operation signal to cause the movable contact to be attracted to the fixed contact; and
detecting an abnormal operation of the movable contact relative to the fixed contact based on an AC component of: at least one of the first transient response signal and the second transient response signal; and a relationship between a magnitude of a threshold set based on the first transient response signal and the second transient response signal and a magnitude of a third transient response signal; the third transient response signal based on the supply of a third detection pulse signal over a time width.

11. The abnormality detection circuit according to claim 9, wherein
the first transient response signal is generated by applying the first detection pulse signal to a switching element that supplies the coil current to the excitation coil,
the second transient response signal is generated by applying the second detection pulse signal to the switching element,
a period of the first detection pulse signal is shorter than a period of the first transient response signal, and
a period of the second detection pulse signal is shorter than that of the second transient response signal.

12. The abnormality detection circuit according to claim 9, wherein
the abnormal operation of the movable contact relative to the fixed contact is detected based on:
the threshold, the third transient response signal; and a time at which a difference between the first transient response signal and the second transient response signal is maximized; or
a sign of an integrated value obtained from integrating a difference between the third transient response signal and the threshold.

13. The abnormality detection circuit according to claim 9, wherein the threshold is updated by repeatedly generating the first transient response signal in each of predetermined time intervals, by generating the first transient response signal in response to an on-signal externally supplied to operate the movable contact relative to the fixed contact, or by repeatedly generating the second transient response signal in each of the predetermined time intervals.

14. The abnormality detection circuit according to claim 9 wherein:
a duty of the first detection pulse signal is controlled such that a difference between a current value of the first transient response signal before the supply of the first detection pulse signal and a target value of the first transient response signal based on the supply of the first detection pulse signal is kept constant, or a duty of the second detection pulse signal is controlled such that a difference between a current value of the second transient response signal before the supply of the second detection pulse signal and a target value of the second transient response signal based on the supply of the second detection pulse signal is kept constant.

15. The abnormality detection circuit according to claim 9, wherein the abnormal operation of the movable contact relative to the fixed contact is detected based on the threshold and the third transient response signal of the coil current based on the supply of the third detection pulse signal after a predetermined time elapses.

16. The abnormality detection circuit according to claim 9, wherein the control circuit is configured to detect the abnormal operation of the movable contact relative to the fixed contact when an additional second transient response signal, generated by supplying the second detection pulse signal after a predetermined time elapses, exceeds the threshold.

17. The abnormality detection circuit according to claim 9, wherein the movable contact is operated relative to the fixed contact by applying the operation signal to a first switching element, the first switching element being connected in parallel with a second switching element configured to supply the coil current to the excitation coil, and the second transient response signal is generated by turning off the first switching element and applying the second detection pulse signal to the second switching element to generate the second transient response signal.

* * * * *